(12) United States Patent
Kim et al.

(10) Patent No.: US 10,410,871 B2
(45) Date of Patent: Sep. 10, 2019

(54) SEMICONDUCTOR DEVICES AND METHODS OF MANUFACTURING THE SAME

(71) Applicant: SAMSUNG ELECTRONICS CO., LTD., Suwon-si, Gyeonggi-do (KR)

(72) Inventors: Yoon-Hae Kim, Suwon-si (KR); Hwa-Sung Rhee, Seongnam-si (KR); Keun-Hwi Cho, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/969,137

(22) Filed: May 2, 2018

(65) Prior Publication Data

US 2018/0254188 A1 Sep. 6, 2018

Related U.S. Application Data

(62) Division of application No. 15/001,568, filed on Jan. 20, 2016, now Pat. No. 9,984,886.

(30) Foreign Application Priority Data

Apr. 30, 2015 (KR) .................. 10-2015-0061423

(51) Int. Cl.
*H01L 21/285* (2006.01)
*H01L 21/768* (2006.01)
*H01L 27/088* (2006.01)

(52) U.S. Cl.
CPC .. *H01L 21/28518* (2013.01); *H01L 21/76897* (2013.01); *H01L 21/76843* (2013.01); *H01L 21/76855* (2013.01); *H01L 27/0886* (2013.01)

(58) Field of Classification Search
None
See application file for complete search history.

(56) References Cited

U.S. PATENT DOCUMENTS 8,513,742 B2   8/2013   Zhong et al.
8,551,874 B2   10/2013   Seo et al.
(Continued)

FOREIGN PATENT DOCUMENTS

| KR | 1020120001897 | 1/2012 |
| KR | 1020130111595 | 10/2013 |
| KR | 1020140097462 | 8/2014 |

OTHER PUBLICATIONS

Office Action dated Jul. 19, 2017 in Corresponding U.S. Appl. No. 15/001,568.

*Primary Examiner* — Moazzam Hossain
*Assistant Examiner* — Stanetta D Isaac
(74) *Attorney, Agent, or Firm* — F. Chau & Associates, LLC

(57) ABSTRACT

A semiconductor device includes a gate structure extending in a second direction on a substrate, a source/drain layer disposed on a portion of the substrate adjacent the gate structure in a first direction crossing the second direction, a first conductive contact plug on the gate structure, and a second contact plug structure disposed on the source/drain layer. The second contact plug structure includes a second conductive contact plug and an insulation pattern, and the second conductive contact plug and the insulation pattern are disposed in the second direction and contact each other. The first conductive contact plug and the insulation pattern are adjacent to each other in the first direction. The first and second conductive contact plugs are spaced apart from each other.

20 Claims, 83 Drawing Sheets

(56) References Cited

U.S. PATENT DOCUMENTS

| | | |
|---|---|---|
| 2009/0014796 A1 | 1/2009 | Liaw |
| 2012/0001271 A1 | 1/2012 | Chae et al. |
| 2013/0119557 A1 | 5/2013 | Or-Bach |
| 2013/0248999 A1 | 9/2013 | Glass et al. |
| 2013/0277752 A1 | 10/2013 | Glass et al. |
| 2014/0042502 A1 | 2/2014 | Xie et al. |
| 2014/0131776 A1 | 5/2014 | Ching et al. |
| 2014/0145246 A1 | 5/2014 | Ning et al. |
| 2014/0145264 A1 | 5/2014 | Frank et al. |
| 2014/0217517 A1 | 8/2014 | Cai et al. |
| 2014/0220752 A1 | 8/2014 | Park et al. |
| 2014/0252491 A1 | 9/2014 | Onoda |
| 2014/0312397 A1 | 10/2014 | Cheng et al. |
| 2015/0035023 A1 | 2/2015 | Kim et al. |
| 2016/0322304 A1 | 11/2016 | Kim et al. |

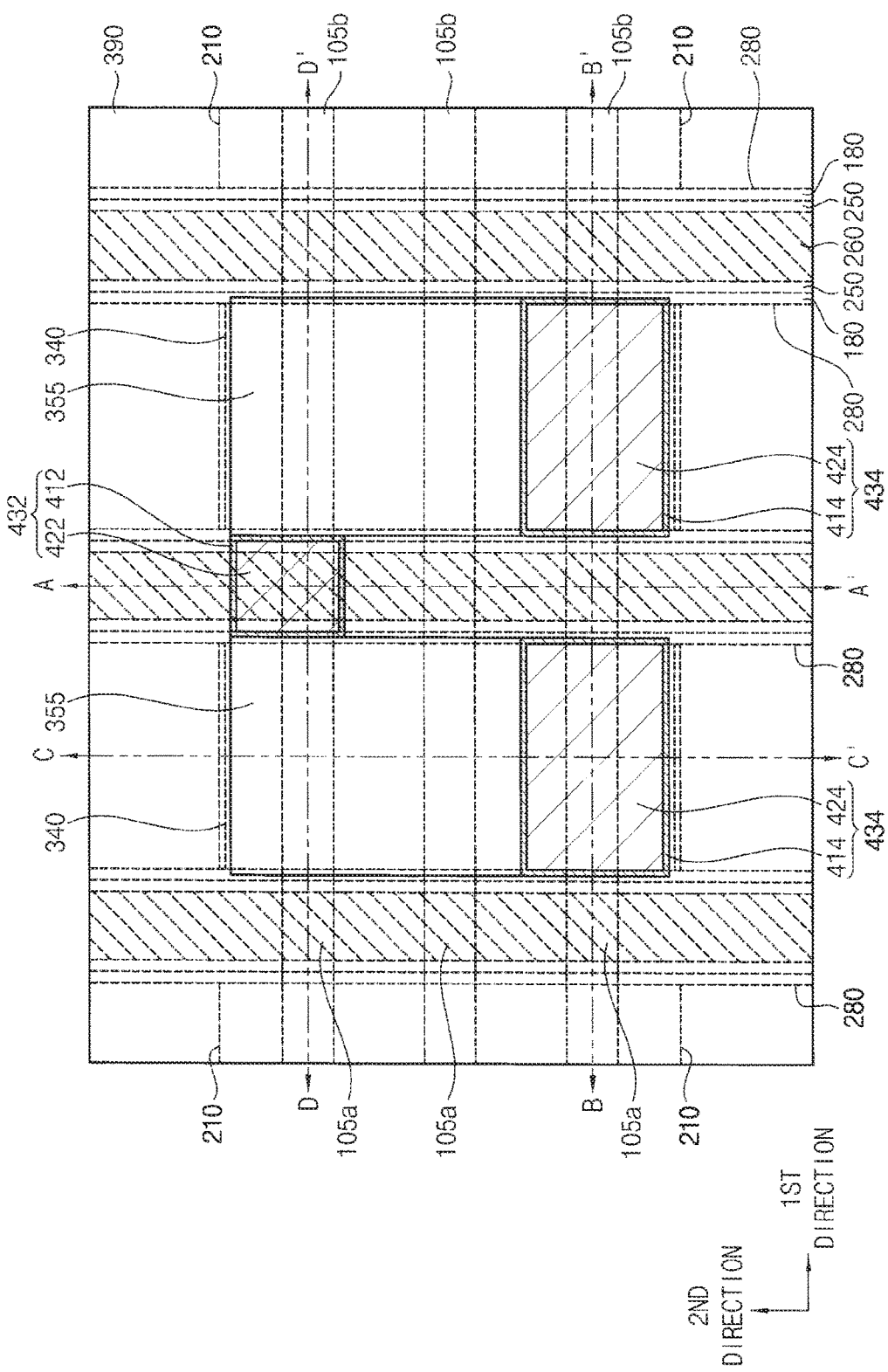

SEMICONDUCTOR DEVICES AND METHODS OF MANUFACTURING THE SAME

CROSS-REFERENCE TO RELATED APPLICATIONS

This application is a divisional application of U.S. application Ser. No. 15/001,568 filed Jan. 20, 2016, which claims priority under 35 USC § 119 to Korean Patent Application No. 10-2015-0061423, filed on Apr. 30, 2015 in the Korean Intellectual Property Office (KIPO), the disclosures of which are incorporated by reference in their entireties herein.

BACKGROUND

1. Technical Field

Exemplary embodiments relate to semiconductor devices and methods of manufacturing the same. More particularly, exemplary embodiments relate to semiconductor devices including contact plugs and methods of manufacturing the same.

2. Discussion of Related Art

In a logic device, a contact plug may contact a top surface of a gate electrode or a source/drain layer on an active region of a substrate. A short circuit may develop between a first contact plug contacting a top surface of a gate electrode extending in a direction and a second contact plug contacting a source/drain layer. A short circuit is an electrical circuit that allows a current to travel along an unintended path. However, the presence of this short circuit may deteriorate the integration degree of the logic device.

SUMMARY

At least one embodiment of the inventive concept provides a semiconductor device having an enhanced integration degree.

At least one embodiment of the inventive concept provides a method of manufacturing a semiconductor device having an enhanced integration degree.

According to an exemplary embodiment of the inventive concept, there is provided a semiconductor device. The semiconductor device includes a gate structure extending in a second direction on a substrate, a source/drain layer disposed on a portion of the substrate adjacent the gate structure in a first direction crossing the second direction, a first conductive contact plug disposed on the gate structure, and a second contact plug structure disposed on the source/drain layer. The second contact plug structure includes a second conductive contact plug and an insulation pattern, and the second conductive contact plug and the insulation pattern are disposed in the second direction and contact each other. The first conductive contact plug and the insulation pattern are adjacent to each other in the first direction. The first and second conductive contact plugs are spaced apart from each other.

In an exemplary embodiment, the semiconductor device further includes a metal silicide pattern disposed on the source/drain layer, where the second contact plug contacts an upper surface of the metal silicide pattern.

In an exemplary embodiment, the metal silicide pattern is formed on an entire upper surface of the source/drain layer, and the second conductive contact plug contacts an upper surface of a portion of the metal silicide pattern.

In an exemplary embodiment, the first conductive contact plug and the insulation pattern contact each other.

In an exemplary embodiment, the semiconductor device further includes a gate spacer disposed on sidewalls of the gate structure in the first direction, where the second contact plug structure contacts an outer sidewall of the gate spacer.

In an exemplary embodiment, the semiconductor device further includes a metal silicide pattern and a conductive pattern structure sequentially stacked between the source/drain layer and the second contact plug structure, where an upper surface of a portion of the metal silicide pattern and a top surface of the conductive pattern structure contact the second contact plug structure.

In an exemplary embodiment, the metal silicide pattern is disposed on an inner wall of a recess, the recess being on the source/drain layer, and the conductive pattern structure fills a remaining portion of the recess on the metal silicide pattern.

In an exemplary embodiment, the conductive pattern structure includes a first conductive pattern and a first barrier pattern covering a bottom and a sidewall of the first conductive pattern.

In an exemplary embodiment, the first conductive pattern includes tungsten, and the first barrier pattern includes titanium nitride.

In an exemplary embodiment, the semiconductor device further includes a gate spacer disposed on sidewalls of the gate structure in the first direction, where the second contact structure does not contact an outer sidewall of the gate spacer.

In an exemplary embodiment, the insulation pattern includes a low-k dielectric material.

In an exemplary embodiment, the first conductive contact plug includes a second conductive pattern and a second barrier pattern covering a bottom and a sidewall of the second conductive pattern, where the second conductive contact plug includes a third conductive pattern and a third barrier pattern covering a bottom and a sidewall of the third conductive pattern.

In an exemplary embodiment, the second and third conductive patterns include tungsten, and the second and third barrier patterns include titanium nitride.

In an exemplary embodiment, the semiconductor device further includes an isolation pattern disposed on the substrate, and an active fin protruding from the substrate, where a lower sidewall of the active fin is covered by the isolation pattern.

In an exemplary embodiment, a plurality of active fins are formed to be spaced apart from each other in the second direction, where a source/drain layer commonly contacts first active fins among the plurality of active fins, and the first active fins are adjacent to each other in the second direction.

In an exemplary embodiment, a plurality of source/drain layers are spaced apart from each other on the substrate in the second direction, where the second contact plug structure vertically overlaps each of the source/drain layers, and the first conductive contact plug is disposed on the gate structure adjacent the second contact plug structure in the first direction, and the first conductive contact plug and the second contact plug structure are not disposed between neighboring ones of the source/drain layer spaced apart from each other in the second direction.

In an exemplary embodiment, the semiconductor device further includes an isolation pattern disposed on the substrate, where the substrate is divided into an active region and a field region by the isolation pattern, and a plurality of active regions are spaced apart from each other in the second direction.

In an exemplary embodiment, the source/drain layer is disposed between neighboring ones of the active regions spaced apart from each other in the second direction, where the first conductive contact plug and the second contact plug structure vertically overlap each of the active regions, and are not disposed on the field region between neighboring ones of the active regions spaced apart from each other in the second direction.

In an exemplary embodiment, the source/drain layer includes doped single crystalline silicon, doped single crystalline silicon carbide, or doped single crystalline silicon-germanium.

In an exemplary embodiment, the gate structure includes a gate electrode and a gate insulation pattern covering a bottom and a sidewall of the gate electrode.

In an exemplary embodiment, the gate electrode includes a metal, and the gate insulation pattern includes a high-k dielectric material.

In an exemplary embodiment, the semiconductor device further includes an interface pattern including an oxide disposed between the substrate and the gate insulation pattern.

In an exemplary embodiment, the first and second directions cross each other at a right angle.

According to an exemplary embodiment of the inventive concept, there is provided a semiconductor device. The semiconductor device includes a plurality of first active fin groups, a gate structure, a plurality of source/drain layers, a metal silicide pattern, a second conductive contact plug, and a first conductive contact plug. The plurality of first active fin groups are spaced apart from each other in a second direction at a second distance, and each of the first active fin groups includes a plurality of first active fins spaced apart from each other in the second direction at a first distance smaller than the second distance. Each of the first active fins protrude from the substrate and extend in a first direction substantially perpendicular to the second direction. The gate structure extends in the second direction and is disposed on a portion of the substrate having the first active fin groups. The plurality of source/drain layers are spaced apart from each other in the second direction, and each of the source/drain layers are disposed on a portion of each of the first active fin groups adjacent the gate structure. The metal silicide pattern is disposed on each of the source/drain layers. The second conductive contact plug contacts an upper surface of a first portion of the metal silicide pattern. The first conductive contact plug contacts an upper surface of a portion of the gate structure adjacent each of the source/drain layers in the first direction, and is spaced apart from the second conductive contact plug.

In an exemplary embodiment, the semiconductor device further includes an insulation pattern contacting an upper surface of a second other portion of the metal silicide pattern, where the insulation pattern and the second conductive contact plug are disposed in the second direction and contacting each other.

In an exemplary embodiment, the semiconductor device further includes a conductive pattern structure disposed between the metal silicide pattern and the second contact plug structure, where the second contact plug structure includes the second conductive contact plug and the insulation pattern.

In an exemplary embodiment, the conductive pattern structure includes a first conductive pattern and a first barrier pattern covering a bottom and a sidewall of the first conductive pattern.

In an exemplary embodiment, the insulation pattern includes a low-k dielectric material.

In an exemplary embodiment, the semiconductor device further includes a gate spacer disposed on sidewalls of the gate structure in the first direction, where the second contact plug structure contacts an outer sidewall of the gate spacer.

In an exemplary embodiment, the semiconductor device further includes a gate spacer disposed on sidewalls of the gate structure in the first direction, where the second contact plug structure does not contact an outer sidewall of the gate spacer.

In an exemplary embodiment, top surfaces of the first and second conductive contact plugs and a top surface of the insulation pattern are substantially coplanar with each other.

In an exemplary embodiment, the first and second conductive contact plugs include substantially the same material.

In an exemplary embodiment, the semiconductor device further includes an isolation pattern covering a lower sidewall of each of the active fins on the substrate, where the gate structure is disposed on the first active fins and the isolation pattern.

In an exemplary embodiment, a plurality of gate structures are disposed on the substrate and spaced apart from each other in the first direction, and each of the source/drain layers are disposed on a portion of each of the first active fin groups between the gate structures.

In an exemplary embodiment, each of the source/drain layers include doped single crystalline silicon, doped single crystalline silicon carbide, or doped single crystalline silicon-germanium.

According to an exemplary embodiment of the inventive concept, there is provided a semiconductor device. The semiconductor device includes an active region, a gate structure, a source/drain layer, a metal silicide pattern, a second conductive contact plug, and a first conductive contact plug. The active region is defined by an isolation pattern disposed on a substrate, and extends in a first direction. The gate structure is disposed on the active region and the isolation pattern and extends in a second direction substantially perpendicular to the first direction. The source/drain layer is disposed on a portion of the active region adjacent sidewalls of the gate structure in the first direction. The metal silicide pattern is disposed on the source/drain layer. The second conductive contact plug contacts an upper surface of a first portion of the metal silicide pattern. The first conductive contact plug contacts a top surface of a portion of the gate structure vertically overlapping the active region, and spaced apart from the second conductive contact plug.

In an exemplary embodiment, the semiconductor device further includes an insulation pattern contacting an upper surface of a second other portion of the metal silicide pattern, where the insulation pattern and the second conductive contact plug are disposed in the second direction and contact each other. The second conductive contact plug and the insulation pattern may form a second contact plug structure.

In an exemplary embodiment, the semiconductor device further includes a conductive pattern structure disposed between the metal silicide pattern and the second contact plug structure.

In an exemplary embodiment, top surfaces of the first and second conductive contact plugs and a top surface of the insulation pattern are substantially coplanar with each other.

In an exemplary embodiment, a plurality of active regions are spaced apart from each other on the substrate in the second direction, where the first and second conductive contact plugs are not disposed between the active regions spaced apart from each other in the second direction.

According to an exemplary embodiment of the inventive concept, there is provided a method of manufacturing a semiconductor device. The method includes: forming a dummy gate structure extending in a second direction on a substrate; forming a source/drain layer on a portion of the substrate adjacent the dummy gate structure in a first direction crossing the second direction; replacing the dummy gate structure with a gate structure; forming a first conductive contact plug on a top surface of a portion of the gate structure; and forming a second contact plug structure on the source/drain layer. The second contact plug structure includes a second conductive contact plug and an insulation pattern disposed in the second direction and contacting each other. The first conductive contact plug and the insulation pattern are adjacent to each other in the first direction, and the first and second conductive contact plugs are spaced apart from each other.

In an exemplary embodiment, after the dummy gate structure is replaced with the gate structure, a metal silicide pattern is formed on the source/drain layer, where the second contact plug structure contacts an upper surface of the metal silicide pattern.

In an exemplary embodiment, the forming of the metal silicide pattern includes: forming an insulating interlayer on the substrate to cover the gate structure and the source/drain layer; forming a first opening to expose an upper surface of the source/drain layer; forming a metal layer on the exposed upper surface of the source/drain layer, a sidewall of the first opening, and the insulating interlayer; and performing a heat treatment process so that the metal layer and the exposed upper surface of the source/drain layer react with each other to form the metal silicide pattern.

In an exemplary embodiment, after the metal layer is formed, the method includes: forming a first barrier layer on the metal layer; and forming a first conductive layer on the first barrier layer to fill a remaining portion of the first opening, where the heat treatment process is performed after the first conductive layer is formed.

In an exemplary embodiment, after the heat treatment process is performed, the method includes removing the first conductive layer and the first barrier layer.

In exemplary embodiment, the first conductive layer and the first barrier layer are partially removed, so that a first barrier pattern and a first conductive pattern sequentially stacked remain on the metal silicide pattern.

In exemplary embodiment, after the metal silicide pattern is formed, the method includes: forming an insulation layer on the metal silicide pattern and the insulating interlayer to fill the first opening; partially removing the insulation layer to form a second opening partially exposing an upper surface of the metal silicide pattern; forming a sacrificial layer on the exposed upper surface of the metal silicide pattern, the insulating interlayer and the insulation layer to fill the second opening; and partially removing the sacrificial layer, the insulation layer and the insulating interlayer to form a third opening partially exposing the top surface of the portion of the gate structure.

In an exemplary embodiment, the forming of the first conductive contact plug on the top surface of the portion of the gate structure and the forming of the second contact plug structure on the source/drain layer includes: removing the sacrificial layer to form the second opening again exposing an upper surface of a portion of the metal silicide pattern; forming a second barrier layer on the exposed upper surface of the portion of the metal silicide pattern, the exposed top surface of the portion of the gate structure, and inner walls of the second and third openings; and forming a second conductive layer on the second barrier layer to fill remaining portions of the second and third openings.

In an exemplary embodiment, the second conductive layer, the second barrier layer and the insulation layer are planarized, such that the first conductive contact plug is formed on the top surface of the portion of the gate structure and the second contact plug structure is formed on the upper surface of the portion of the metal silicide pattern. In this embodiment, the first conductive contact plug includes a second barrier pattern and a second conductive pattern sequentially stacked. In this embodiment, the second contact plug structure includes the insulation pattern and the second conductive contact plug. In this embodiment, the second conductive contact plug has a third barrier pattern and a third conductive pattern sequentially stacked, where the insulation pattern and the second conductive contact plug are disposed in the second direction.

In an exemplary embodiment, after the dummy gate structure is formed, the method includes forming a gate spacer on sidewalls of the gate structure in the first direction, where the second contact plug structure is formed to contact an outer sidewall of the gate spacer.

In an exemplary embodiment, before the dummy gate structure is formed on the substrate, the method includes forming a trench on the substrate to form an active fin protruding from the substrate; and forming an isolation pattern on the substrate to partially fill the trench, and cover a lower sidewall of the active fin. In this embodiment, the dummy gate structure is formed on the active fin and the isolation pattern.

In an exemplary embodiment, when forming of the active fin includes forming a plurality of active fins spaced apart from each other in the second direction. In an exemplary embodiment, the forming of the source/drain layer includes: forming the source/drain layer to commonly contact first active fins among the plurality of active fins, where the first active fins are adjacent to each other in the second direction.

In an exemplary embodiment, the forming of the source/drain layer includes forming a plurality of source/drain layers spaced apart from each other in the second direction, where the second contact plug structure is formed to vertically overlap each of the source/drain layers, the first conductive contact plug is formed on the gate structure adjacent the second contact plug structure in the first direction, and the first conductive contact plug and the second contact plug structure are not formed between the source/drain layers spaced apart from each other in the second direction.

In an exemplary embodiment, before the dummy gate structure is formed on the substrate, the method includes forming an isolation pattern on the substrate, such that the substrate is divided into an active region and a field region, and a plurality of active regions are formed to be spaced apart from each other in the second direction. In an exemplary embodiment, the forming of the source/drain layer includes forming a plurality of source/drain layers on the active regions, respectively, spaced apart from each other in the second direction. The first conductive contact plug and the second contact plug structure do not vertically overlap each of the active regions, and are not formed between the active regions spaced apart from each other in the second direction.

In an exemplary embodiment, the first and second directions cross each other at a right angle.

According to an exemplary embodiment of the inventive concept, there is provided a method of manufacturing a semiconductor device. The method includes forming a trench and an isolation pattern on a substrate to form a plurality of first active fin groups spaced apart from each other at a second distance. Each of the first active fin groups includes a plurality of first active fins spaced apart from each other in the second direction at a first distance smaller than the second distance. Each of the first active fins protrudes from the substrate and extends in a first direction substantially perpendicular to the second direction. A lower sidewall of each of the first active fins is covered by the isolation pattern. The method includes: forming a dummy gate structure extending in the second direction on the first active fin groups and the isolation pattern; forming a source/drain layer on a portion of each of the first active fin groups adjacent the gate structure; replacing a dummy gate structure with a gate structure; forming a metal silicide pattern on the source/drain layer; forming a second conductive contact plug and a first conductive contact plug. The second conductive contact plug contacts an upper surface of a portion of the metal silicide pattern, the first conductive contact plug contacts an upper surface of a first portion of the gate structure adjacent the source/drain layer in the first direction. The first conductive contact plug is spaced apart from the second conductive contact plug.

In an exemplary embodiment, after the metal silicide pattern is formed, an insulation pattern contacting an upper surface of a second other portion of the metal silicide pattern is formed, where a sidewall of the insulation pattern contacts a sidewall of the second conductive contact plug. The second conductive contact plug and the insulation pattern may form a second contact plug structure.

In an exemplary embodiment, before the insulation pattern is formed, a conductive pattern structure is formed on the metal silicide pattern.

According to an exemplary embodiment of the inventive concept, a semiconductor device is provided including a gate electrode, a source electrode, a drain electrode, first through third conductive contact plugs, and first and second insulation patterns. The gate electrode is disposed on a substrate and extends in a second direction. The source electrode is disposed on the substrate adjacent a first side of the gate electrode in a first direction crossing the second direction. The drain electrode is disposed on the substrate adjacent a second side of the gate electrode in the first direction. The first conductive contact plug is disposed on the gate electrode. The second conductive contact plug is disposed on the source electrode in the second direction. The third conductive contact plug is disposed on the drain electrode in the second direction. The first insulation pattern is disposed on the source electrode in the second direction and contacts the second conductive contact plug, and the second insulation pattern is disposed on the drain electrode in the second direction and contacts the third conductive contact plug.

In an embodiment, the second conductive contact plug is spaced apart from the first and the third conductive contact plugs.

In an embodiment, the semiconductor device includes a metal silicide pattern disposed on the source electrode and on the drain electrode.

A semiconductor device in accordance at least one embodiment may include the metal silicide pattern, which is formed on the entire upper surface of the source/drain layer that is commonly formed on the first active fins included in each of the first active fin groups, and thus the contact resistance between the metal silicide pattern and the first and second conductive contact plugs may be lowered. In an embodiment, the first and second conductive contact plugs are formed to overlap a region in which one of the first active fin groups is formed, and are not formed on a region between neighboring ones of the first active fin groups spaced apart from each other in the second direction. Accordingly, the semiconductor device may have an enhanced integration degree.

BRIEF DESCRIPTION OF THE DRAWINGS

Exemplary embodiments of the inventive concept will be more clearly understood from the following detailed description taken in conjunction with the accompanying drawings.

FIGS. 1A, 1B, and 2 to 5 are plan views and cross-sectional views illustrating a semiconductor device in accordance with example embodiments of the inventive concept.

DETAILED DESCRIPTION OF THE EXEMPLARY EMBODIMENTS

Figure 1A:
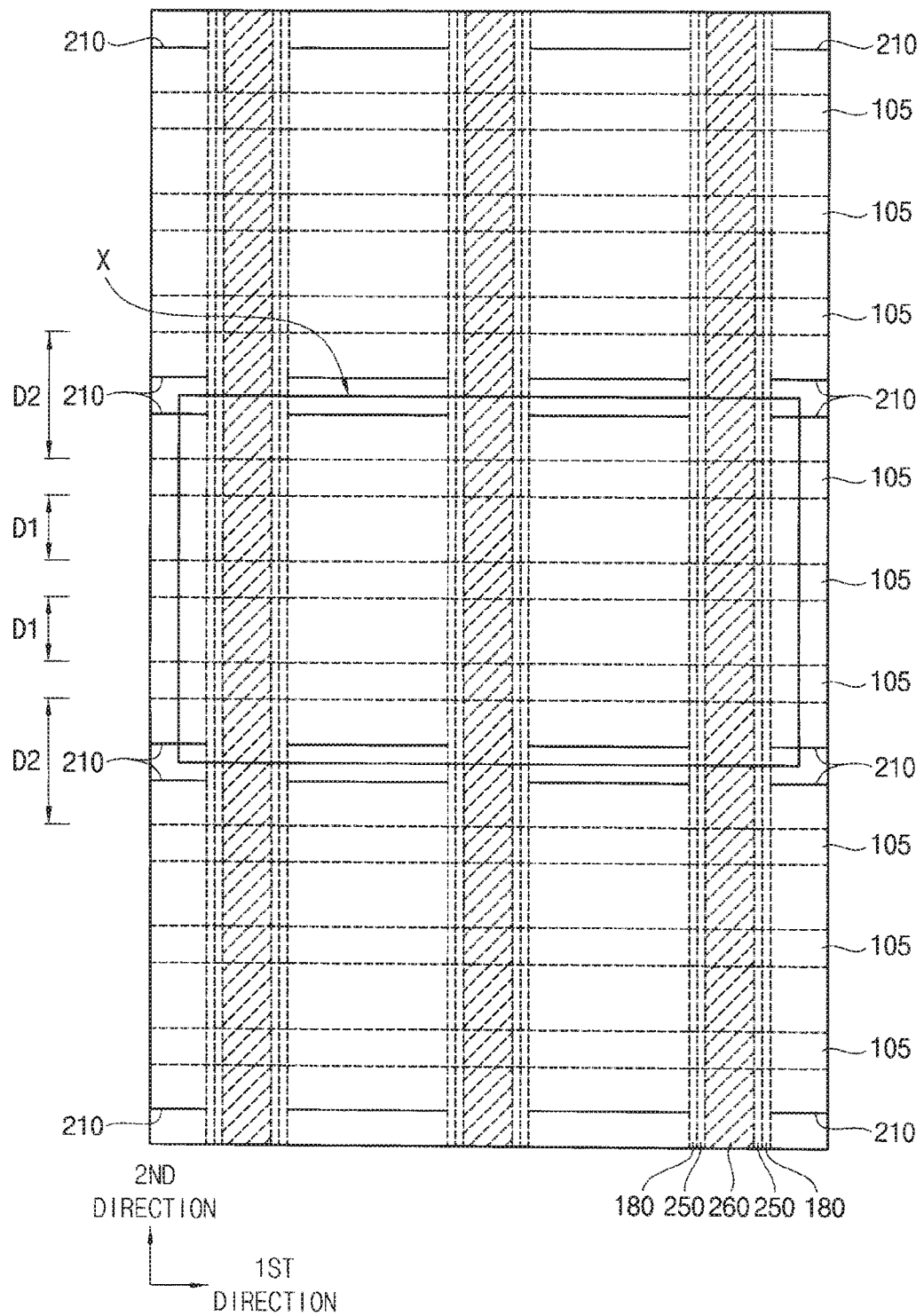

The inventive concept will be described more fully hereinafter with reference to the accompanying drawings, in which exemplary embodiments thereof are shown. The present inventive concept may, however, be embodied in many different forms and should not be construed as limited to the exemplary embodiments set forth herein. Rather, these exemplary embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout. As used herein, the singular forms "a," "an" and "the" are intended to include the plural forms as well, unless the context clearly indicates otherwise.

Exemplary embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, the exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present inventive concept.

FIGS. 1A, 1B, and 2 to 5 are plan views and cross-sectional views illustrating a semiconductor device in accordance with exemplary embodiments of the inventive concept. Particularly, FIGS. 1A and 1B are plan views illustrating the semiconductor device, and FIGS. 2 to 5 are cross-sectional views illustrating the semiconductor device.

Figure 2:
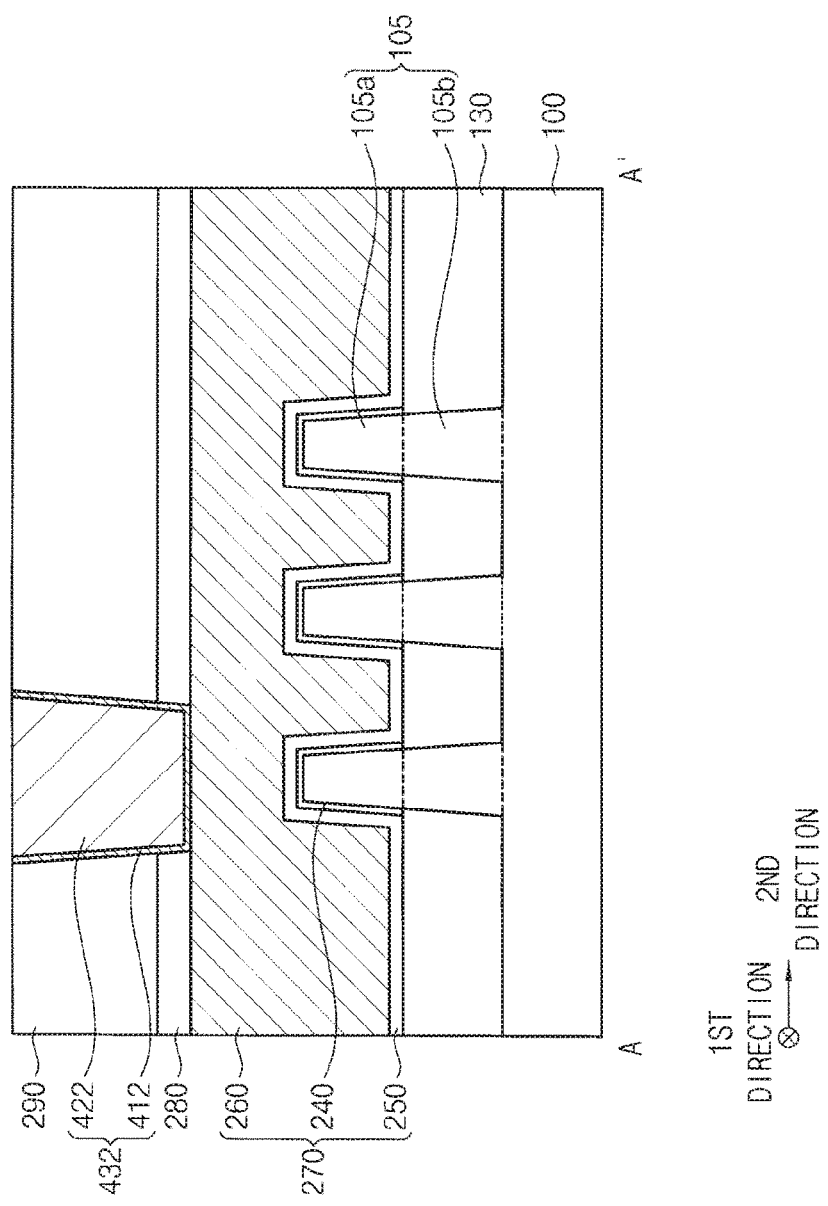
Figure 3:
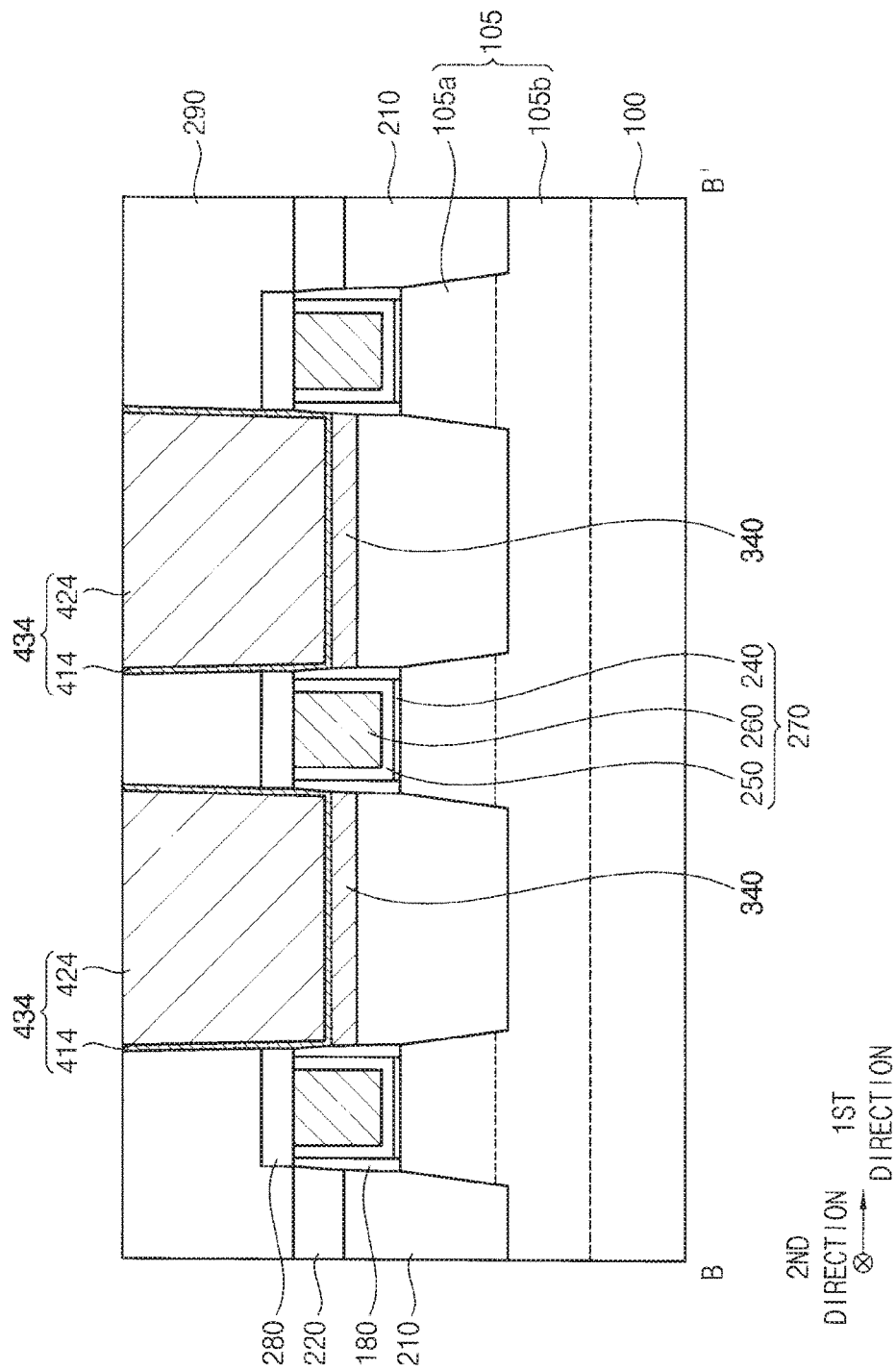
Figure 4:
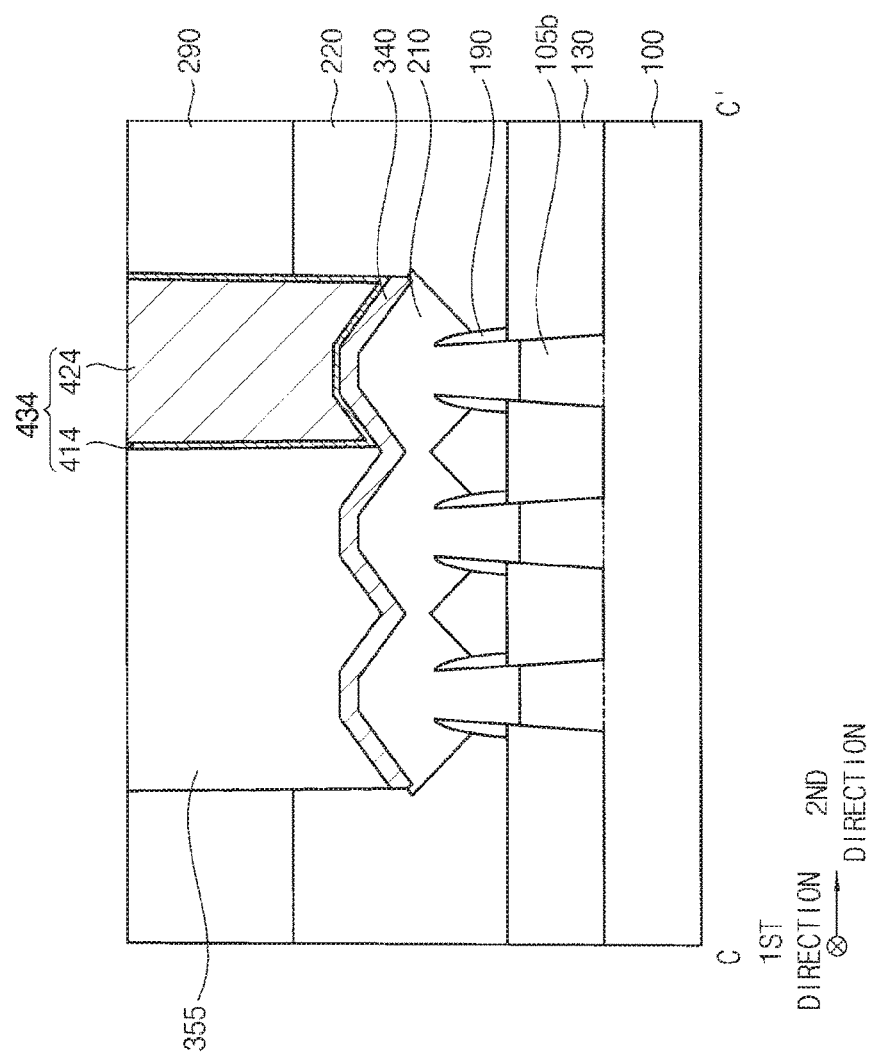
Figure 5:
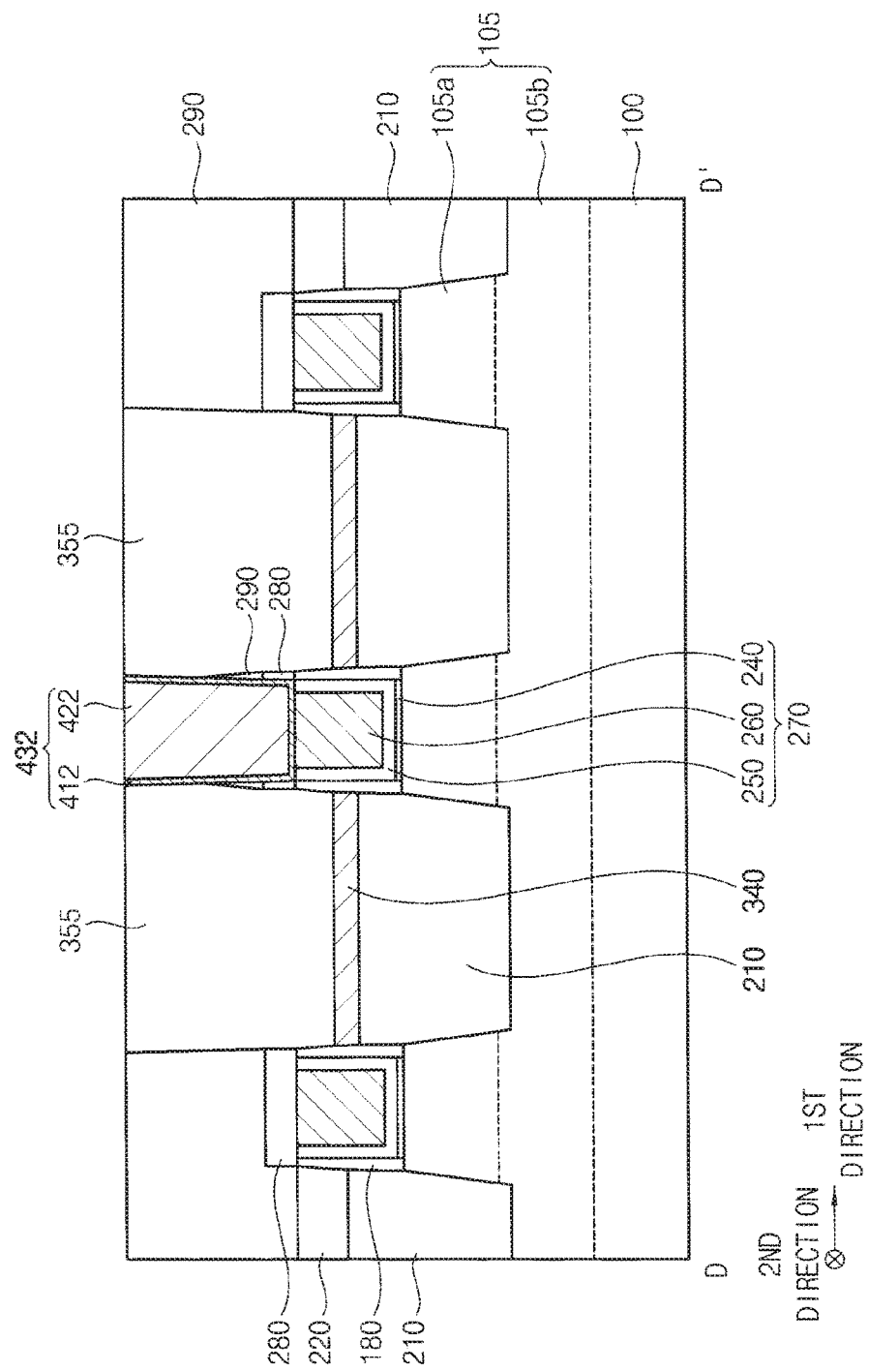

FIG. 2 is a cross-sectional view taken along a line A-A' of FIG. 1B, FIG. 3 is a cross-sectional view taken along a line B-B' of FIG. 1B, FIG. 4 is a cross-sectional view taken along a line C-C' of FIG. 1B, and FIG. 5 is a cross-sectional view taken along a line D-D' of FIG. 1B. FIG. 1B is an enlarged plan view of a region X of FIG. 1A, and FIG. 1A only shows an active fin, a gate structure, a gate spacer, and a source/drain layer in order to avoid the complexity. Hereinafter, the semiconductor device and a method of manufacturing the semiconductor device will be illustrated with reference to the figures of the region X.

Referring to FIGS. 1A, 1B, and 2 to 5, the semiconductor device includes a gate structure 270, a source/drain layer 210, a first conductive contact plug 432 and a second contact plug structure on a substrate 100. The semiconductor device further includes an active fin 105, a gate spacer 180, a fin spacer 190, a gate mask 280, a metal silicide pattern 340, and first and second insulating interlayers 220 and 290.

The substrate 100 may include a semiconductor material (e.g., silicon, germanium, silicon-germanium, etc.) or III-V semiconductor compounds (e.g., GaP, GaAs, GaSb, etc.). In an embodiment, the substrate 100 is a silicon-on-insulator (SOI) substrate, or a germanium-on-insulator (GOI) substrate.

In an embodiment, an isolation pattern 130 is formed on the substrate 100, and thus a field region of which a top surface is covered by the isolation pattern 130, and an active region of which a top surface is not covered by the isolation pattern 130 and that protrudes from a top surface of the isolation pattern 130 is defined in the substrate 100. The active region may be a region in which the active fin 105 having a fin-like shape protruding upwardly is formed, and the field region may be a region in which no active fin is formed. The active fin 105 may be formed by etching an upper portion of the substrate 100 to form trenches 101 and 103 (refer to FIGS. 8 and 9) thereon, and thus may protrude upwardly from other portions of the substrate 100 on which the trenches 101 and 103 are formed. Accordingly, the active fin 105 may include a material substantially the same as that of the substrate 100.

In an exemplary embodiment, the active fin 105 extends in a first direction substantially parallel to a top surface of the substrate 100, and a plurality of active fins 105 are formed in a second direction substantially parallel to the top surface of the substrate 100 and crossing the first direction. In an exemplary embodiment, the first and second directions cross each other at a right angle, and are thus substantially perpendicular to each other. Hereinafter, the first and second directions in all drawings may be defined as those in FIGS. 1A, 1B, and 2 to 5.

In an exemplary embodiment, first active fins 105 among the active fins 105, which are adjacent to each other in the second direction, form a first active fin group, and a plurality of first active fin groups are formed in the second direction. FIG. 1A shows that each of the first active fin groups includes three active fins 105, however, the inventive concept is not limited thereto, as each of the first active fin groups may include any number of the first active fins 105. In an exemplary embodiment, the first active fins 105 included in each of the first active fin groups are spaced apart from each other at a first distance D1 in the second direction, and the first active fin groups are spaced apart from each other at a second distance D2 greater than the first distance D1 in the second direction.

In an exemplary embodiment, the active fin 105 includes lower and upper active patterns 105b and 105a sequentially stacked and integrally formed with each other. As shown in FIG. 2, a sidewall of the lower active pattern 105b is covered by the isolation pattern 130, and the upper active pattern 105a is not covered by the isolation pattern 130, but protrudes from the top surface of the isolation pattern 130. The isolation pattern 130 may include an oxide (e.g., silicon oxide).

The gate structure 270 may extend in the second direction on the active fin 105 and the isolation pattern 130. In an exemplary embodiment, a plurality of gate structures 270 are formed in the first direction. In an exemplary embodiment, the gate structure 270 includes a gate insulation pattern 250 and a gate electrode 260 sequentially stacked. The gate structure 270 may further include an interface pattern 240 located between the active fin 105 and the gate insulation pattern 250.

In an exemplary embodiment, the gate insulation pattern 250 is formed on a top surface and a sidewall of the upper active pattern 105a of the active fin 105, a top surface of the isolation pattern 130, an inner wall of the gate spacer 180, and covers a bottom and a sidewall of the gate electrode 260. In an embodiment where the interface pattern 240 is formed, the interface pattern 240 is formed only on the top surface and the sidewall of the upper active pattern 105a of the active fin 105. In an exemplary embodiment, the interface pattern 240 is omitted. In an exemplary embodiment, the interface pattern 240 is formed on the top surface and the sidewall of the upper active pattern 105a of the active fin 105, the top surface of the isolation pattern 130, and the inner wall of the gate spacer 180, and the gate insulation pattern 250 is formed only on the interface pattern 240.

The interface pattern 240 may include an oxide (e.g., silicon oxide), the gate insulation pattern 250 may include a metal oxide having a high dielectric constant (e.g., hafnium oxide, tantalum oxide, zirconium oxide, etc.), and the gate electrode 260 may include a metal having a low electrical resistance (e.g., aluminum, copper, tantalum, etc.), or a metal nitride. Alternatively, the gate electrode 260 may include doped polysilicon.

The gate spacer 180 may be formed on sidewalls of the gate structure 270 opposite to each other in the first direction, and the fin spacer 190 may be formed on sidewalls of the upper active pattern 105a of the active fin 105 opposite to each other in the second direction. The gate spacer 180 and the fin spacer 190 may include a nitride (e.g., silicon nitride, silicon oxynitride, silicon oxycarbonitride, etc.) and may include substantially the same material. Thus, the gate spacer 180 and the fin spacer 190 are not differentiated from each other at an area at which the gate spacer 180 and the fin spacer 190 contact each other, and may be merged with each other.

In an exemplary embodiment, the gate mask 280 extends in the second direction, and covers a top surface of the gate structure 270. In an exemplary embodiment, a plurality of gate masks 280 are formed in the first direction. While the gate mask 280 is illustrated in FIG. 5 covering a top surface of the gate spacer 180, the inventive concept is not limited thereto. For example, in an exemplary embodiment, the top surface of the gate spacer 180 is not covered by the gate mask 280 and is instead exposed.

The source/drain layer 210 may be formed on a portion of the active fin 105 adjacent the gate structure 270 in the first direction. In an exemplary embodiment, the source/drain layer 210 fills a first recess 200 (refer to FIGS. 18 to 20), which is formed on an upper portion of the active fin 105 between the gate structures 270 spaced apart from each other in the first direction, and a sidewall of which defined by an inner sidewall of the fin spacer 190. The first recess 200 may be formed by partially removing the upper active pattern 105a and/or the lower active pattern 105b, and the source/drain layer 210 may not only fill the first recess 200 but also grow (e.g., extend) upwardly to contact a portion of the gate spacer 180. The source/drain layer 210 may grow (e.g., extend) both in the vertical and horizontal directions over the fin spacer 190, and may have a cross-section taken along the second direction of which a shape may be a pentagon or a hexagon.

In an exemplary embodiment, pairs of the source/drain layers 210 on the first active fins 105, respectively, spaced apart from each other in the second direction at a first distance D1 may grow (e.g., extend) to be merged with each other. Thus, only one merged source/drain layer 210 may be formed on the first active fins 105 included in each of the first active fin groups. A plurality of source/drain layers 210 may be formed on the plurality of first active fin groups, respectively, spaced apart from each other in the second direction, which may be spaced apart from each other in the second direction.

The source/drain layer 210 may include single crystalline silicon or single crystalline silicon carbide doped with n-type impurities, and thus may serve as a source/drain region of a negative-channel metal oxide semiconductor (NMOS) transistor. Alternatively, the source/drain layer 210 may include single crystalline silicon-germanium doped with p-type impurities, and thus may serve as a source/drain region of a positive-channel metal oxide semiconductor (PMOS) transistor.

In an exemplary embodiment, the first source/drain layer 210 illustrated in FIG. 5 is source region (e.g., source electrode) of a metal oxide semiconductor transistor, the second source/drain layer 210 illustrated in FIG. 5 is a drain region (e.g., drain electrode) of the metal oxide semiconductor, and the gate structure 270 is a gate electrode of the metal oxide semiconductor. In an exemplary embodiment, a semiconductor device includes the substrate 100, a gate electrode 260 disposed on the substrate and extending in a second direction, the source electrode disposed on the substrate 100 adjacent a first side of the gate electrode in a first direction crossing the second direction, the drain electrode disposed on the substrate 100 adjacent a second side of the gate electrode 260 in the first direction, a first conductive contact plug 432 disposed on the gate electrode 260, a second conductive contact plug 434 disposed on the source electrode in the second direction, and a third conductive contact plug (e.g., another 434), where the first and second conductive contact plugs are spaced apart from one another.

In an embodiment, the metal silicide pattern 340 is formed on the source/drain layer 210. In an exemplary embodiment, the metal silicide pattern 340 is formed on the entire upper surface of the source/drain layer 210 except for both end portions of the upper surface of the source/drain layer 210 in the second direction. The metal silicide pattern 340 may include a metal silicide (e.g., titanium silicide, cobalt silicide, nickel silicide, etc.).

In an embodiment, the first insulating interlayer 220 is formed on the active fin 105 and the isolation pattern 130, and covers an outer sidewall of the gate spacer 180 on the sidewall of the gate structure 270, the source/drain layer 210, the metal silicide pattern 340, and the fin spacer 190. In an embodiment, the second insulating interlayer 290 is formed on the first insulating interlayer 220, and covers the gate mask 280. The first and second insulating interlayers 220 and 290 may include an oxide (e.g., silicon oxide). The first and second insulating interlayers 220 and 290 may include a material substantially the same as or different from each other.

In an embodiment, the first conductive contact plug 432 penetrate through the second insulating interlayer 290 and the gate mask 280, and contact a top surface of the gate structure 270. While the first conductive contact plug 432 also is illustrated in FIG. 5 as contacting a top surface of the gate spacer 180, the inventive concept is not limited thereto.

In an exemplary embodiment, the second contact plug structure includes a second conductive contact plug 434 and an insulation pattern 355, which may be disposed in the second direction and contact each other. In an embodiment, the second contact plug structure penetrates through the first and second insulating interlayers 220 and 290, and contacts an upper surface of the metal silicide pattern 340. In an exemplary embodiment, the second contact plug structure contacts the outer sidewall of the gate spacer 180.

In an exemplary embodiment, the first conductive contact plug 432 and the insulation pattern 355 are adjacent to each other in the first direction, and further contact each other. However, the first and second conductive contact plugs 432 and 434 do not contact each other, and are spaced apart from each other.

In an embodiment, the second conductive contact plug 434 contacts an upper surface of a first portion of the metal silicide pattern 340 on a first source/drain layer among the source/drain layers 210, and the first conductive contact plug 432 contacts a top surface of the gate structure 270 adjacent a second portion of the metal silicide pattern 340 on the first source/drain layer among the source/drain layers 210. In an embodiment, the first and second portions of the metal silicide pattern 340 are spaced apart from each other in the second direction, and thus the first and second conductive contact plugs 432 and 434 do not contact each other, but are spaced apart from each other in the second direction.

In an exemplary embodiment, the first portion of the metal silicide pattern 340 is formed on a portion of the source/drain layer 210 on one of the first active fins 105 in each of the first active fin groups, and the second portion of the metal silicide pattern 340 is formed on a portion of the source/drain layer 210 on another of the first active fins 105 in each of the first active fin groups. The first and second portions of the metal silicide pattern 340 may be spaced apart from each other in the second direction.

In an embodiment, the first conductive contact plug 432 includes a second conductive pattern 422, and a second barrier pattern 412 covering a bottom and a sidewall of the second conductive pattern 422. In an embodiment, the second conductive contact plug 434 includes a third conductive pattern 424, and a third barrier pattern 414 covering a bottom and a sidewall of the third conductive pattern 424.

In an embodiment, the insulation pattern 355 includes a low-k dielectric material. A low-k dielectric material may refer to a material with a small dielectric constant relative to silicon dioxide. The insulation pattern 355 may include a material that has good gap-filling characteristics and can be easily planarized. Thus, in an exemplary embodiment, the insulation pattern 355 includes single layer alumina metalized (SLAM).

In an exemplary embodiment, the second conductive contact plug 434 and the insulation pattern 355 have substantially the same width in the first direction, and the first and second conductive contact plugs 432 and 434 have top surfaces substantially coplanar with each other. The top surfaces of the first and second conductive contact plugs 432 and 434 and the insulation pattern 355 may be substantially coplanar with a top surface of the second insulating interlayer 290.

In an exemplary embodiment, a semiconductor device includes the metal silicide pattern 340, which is formed on the entire upper surface of the source/drain layer 210 except for both end portions of the upper surface of the source/drain layer 210 in the second direction that is commonly formed on the first active fins 105 included in each of the first active fin groups, and thus the contact resistance between the metal silicide pattern 340 and the first and second conductive contact plugs 432 and 434 is lowered. In an embodiment, the first and second conductive contact plugs 432 and 434 are formed to overlap a region in which one of the first active fin groups is formed, and is not formed on a region between neighboring ones of the first active fin groups spaced apart from each other in the second direction. Accordingly, the semiconductor device may have an enhanced integration degree.

FIGS. 6 to 50 are plan views and cross-sectional views illustrating stages of a method of manufacturing a semiconductor device in accordance with an exemplary embodiment of the inventive concept. Particularly, FIGS. 6, 8, 10, 12, 15, 18, 21, 24, 27, 29, 32, 35, 44 and 47 are plan views, and FIGS. 7, 9, 11, 13-14, 16-17, 19-20, 22-23, 25-26, 28, 30-31, 33-34, 36-43, 45-46 and 48-50 are cross-sectional views.

Figure 50:
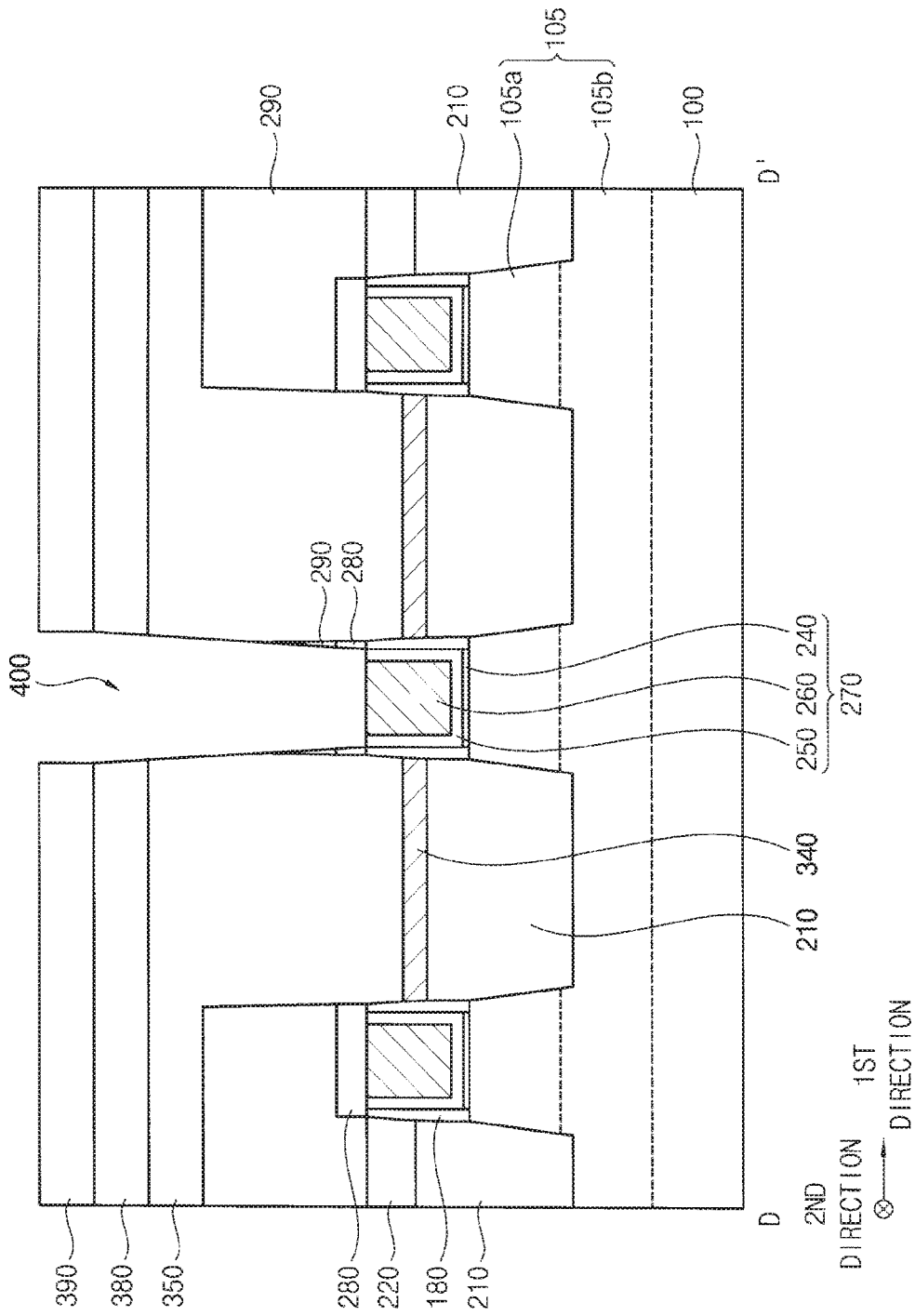

FIGS. 7, 9, 11, 13, 31 and 33 are cross-sectional views taken along lines A-A' of corresponding plan views, respectively, FIGS. 14, 16, 19, 22, 25, 28, 30, 34, 36, 38, 40, 42, 45 and 48 are cross-sectional views taken along lines B-B' of corresponding plan views, respectively, FIGS. 17, 20, 23, 26, 37, 39, 41, 43, 46 and 49 are cross-sectional views taken along lines C-C' of corresponding plan views, respectively, and FIG. 50 is a cross-sectional view taken along a line D-D' of a corresponding plan view.

Figure 6:
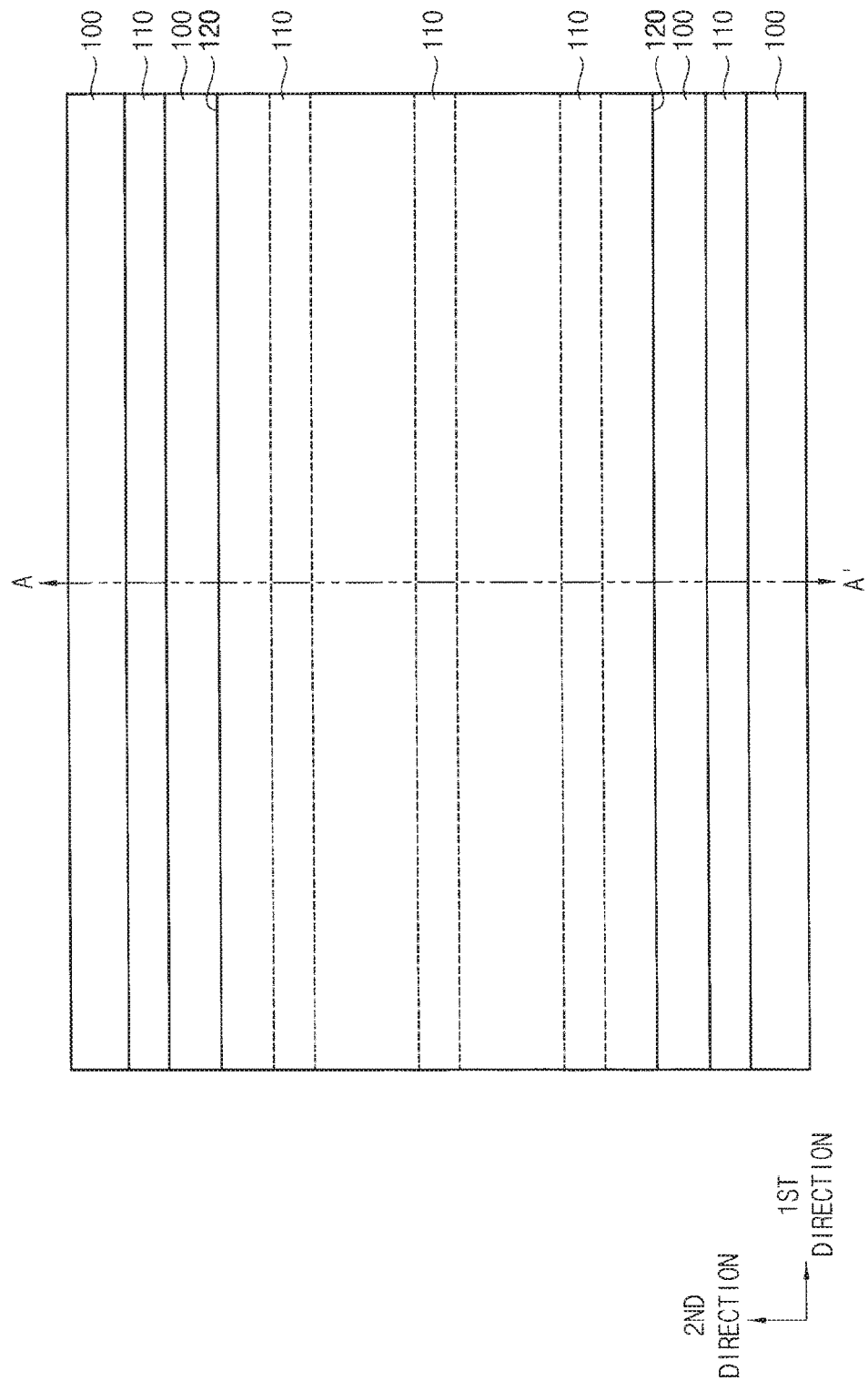
FIGS. 6 to 50 are plan views and cross-sectional views illustrating stages of a method of manufacturing a semiconductor device in accordance with exemplary embodiments of the inventive concept.
Figure 7:
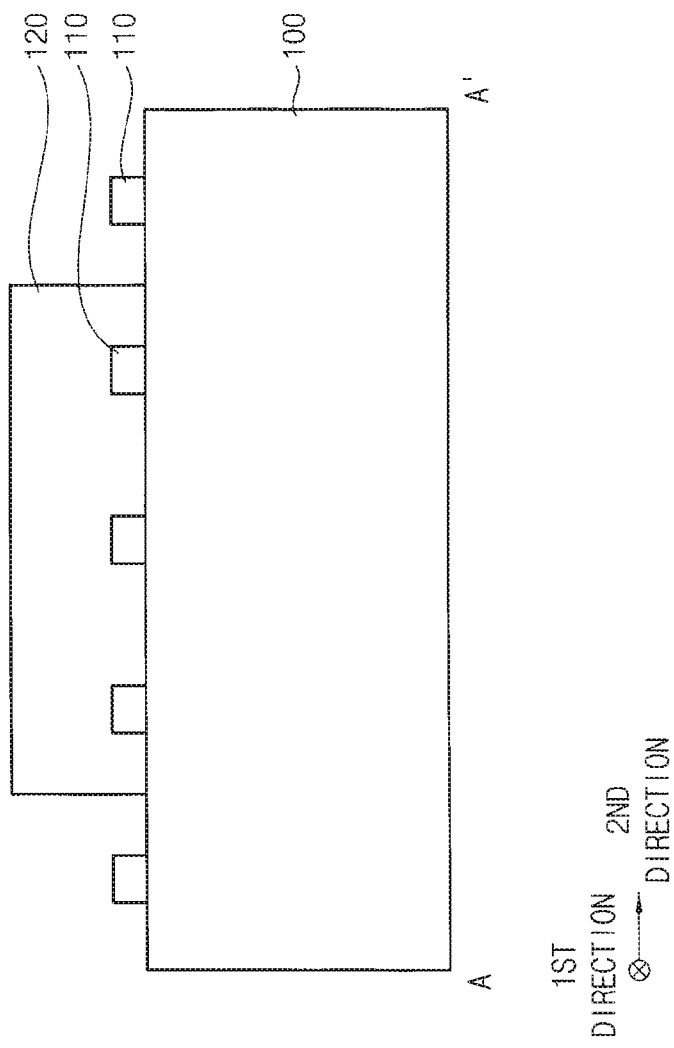

Referring to FIGS. 6 and 7, a plurality of masks 110 is formed on a top surface of a substrate 100. In an embodiment, each of the masks 110 extend in a first direction substantially parallel to a top surface of a substrate 100, are formed in a second direction substantially parallel to the top surface of the substrate 100, and cross the first direction. A first photoresist pattern 120 is formed on the substrate 100 to cover some of the masks 110. In an exemplary embodiment, the first and second directions are substantially perpendicular to each other. The photoresist pattern 120 may be a light-sensitive material, which becomes soluble when exposed to light as an example.

The substrate 100 may include a semiconductor material (e.g., silicon, germanium, silicon-germanium, etc.) or III-V semiconductor compounds (e.g., GaP, GaAs, GaSb, etc.). In an exemplary embodiment, the substrate 100 is a silicon-on-insulator (SOI) substrate or a germanium-on-insulator (GOI) substrate.

In an exemplary embodiment, the masks 110 are formed to be spaced apart from each other in the second direction at a constant distance. For example, the distance between each pair of masks 110 may be the same. The first photoresist pattern 120 may extend in the first direction, and cover a plurality of first masks 110 among the masks 110 that are adjacent to each other in the second direction. FIGS. 6 and 7 show that the first photoresist pattern 120 covers three first masks 110, however, the inventive concept is not limited thereto, as the first photoresist pattern 120 may cover any number of the first masks 110 adjacent to each other in the second direction.

The plurality of first masks 110 adjacent to each other that are covered by the first photoresist pattern 120 form a first mask group, and a plurality of first mask groups may be formed in the second direction.

Each of the masks 110 may include a nitride (e.g., silicon nitride).

Figure 8:
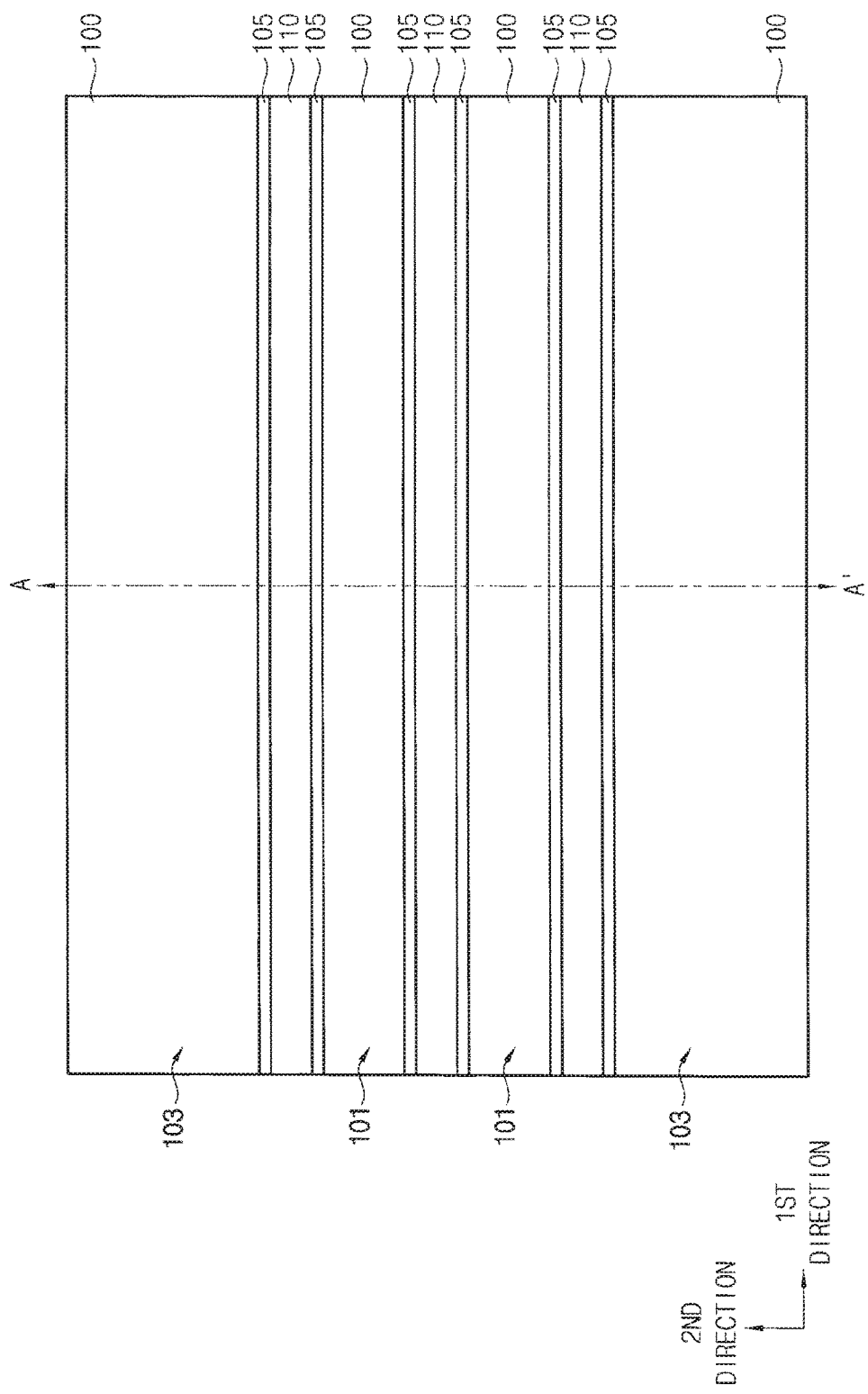
Figure 9:
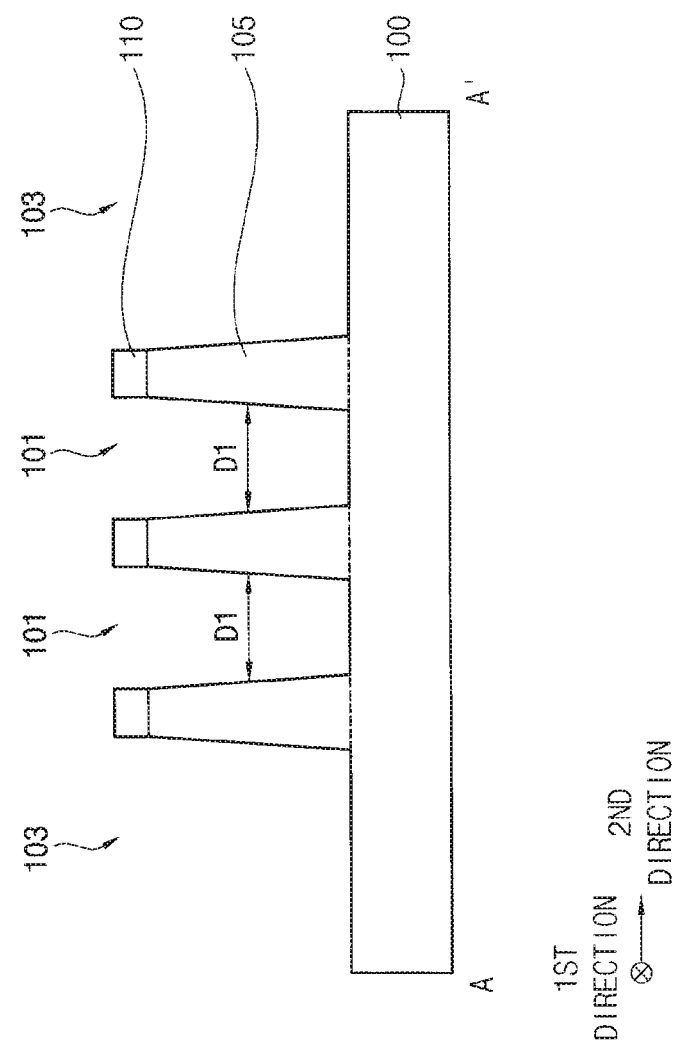

Referring to FIGS. 8 and 9, after removing the masks 110 not covered by the first photoresist pattern 120, the first photoresist pattern 120 is removed. In an exemplary embodiment, the first photoresist pattern 120 is removed by an ashing process (e.g., plasma ashing) and/or a stripping process.

Upper portions of the substrate 100 may be etched using the first masks 110 as an etching mask to form first and second trenches 101 and 103.

The first trench 101 may be formed between neighboring ones of the first masks 110 spaced apart from each other in the second direction, which is included in each of the first mask groups, and the second trench 103 may be formed between neighboring ones of the plurality of first mask groups spaced apart from each other in the second direction. Thus, an active fin 105 may be formed under each of the first masks 110, which may protrude upwardly from the trenches 101 and 103.

In an exemplary embodiment, the active fin 105 extends in the first direction, and a plurality of active fins 105 are formed in the second direction. The active fins 105 formed by one of the first mask groups form a first active fin group, and a plurality of first active fin groups may be formed in the second direction. In an exemplary embodiment, the active fins 105 included in one of the first active fin groups (e.g., the first active fins 105) are spaced apart from each other in the second direction at a first distance D1, and the plurality of first active fin groups are spaced apart from each other in the second direction at a second distance D2 greater than the first distance D1 (refer to FIG. 1A).

Figure 10:
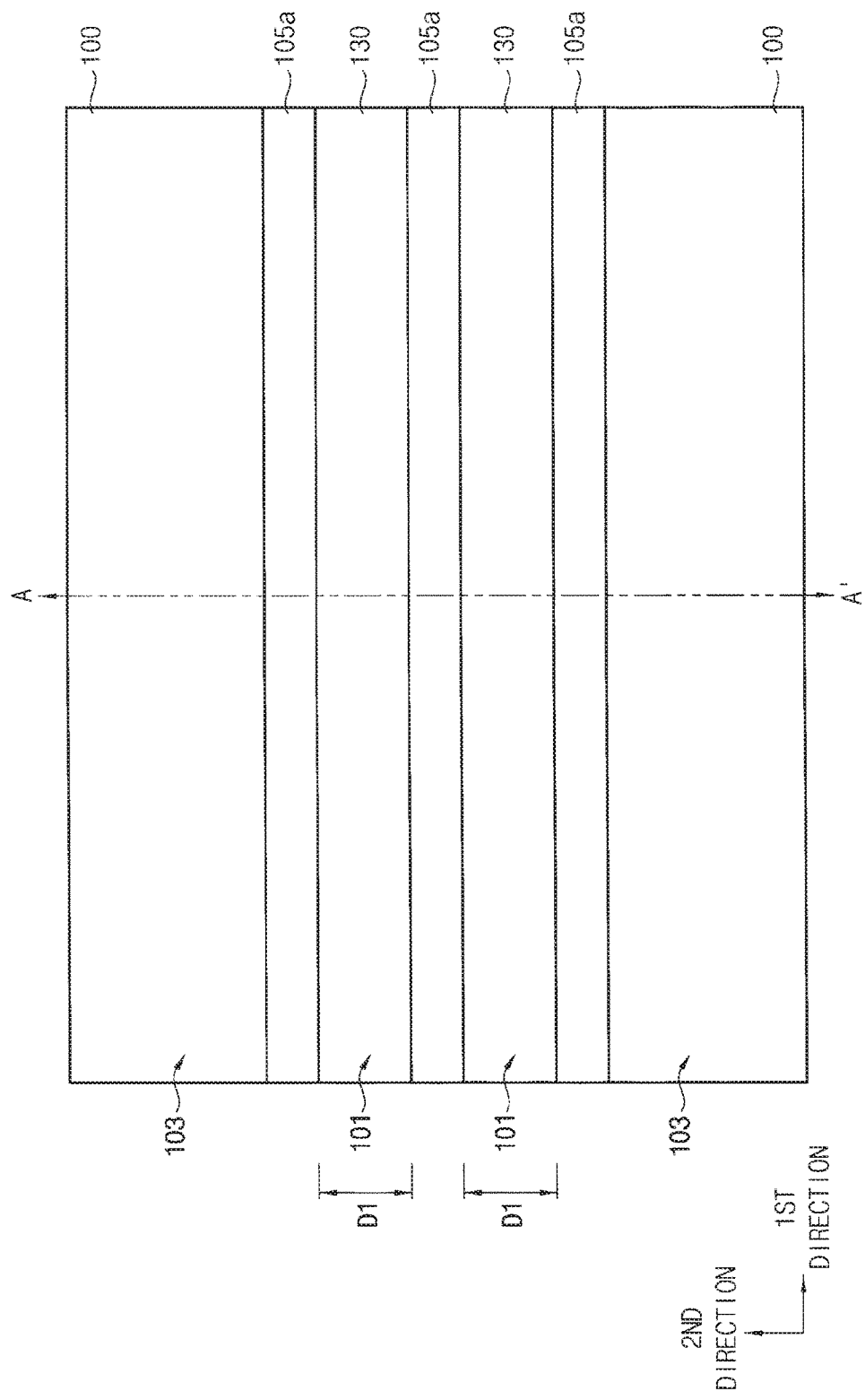
Figure 11:
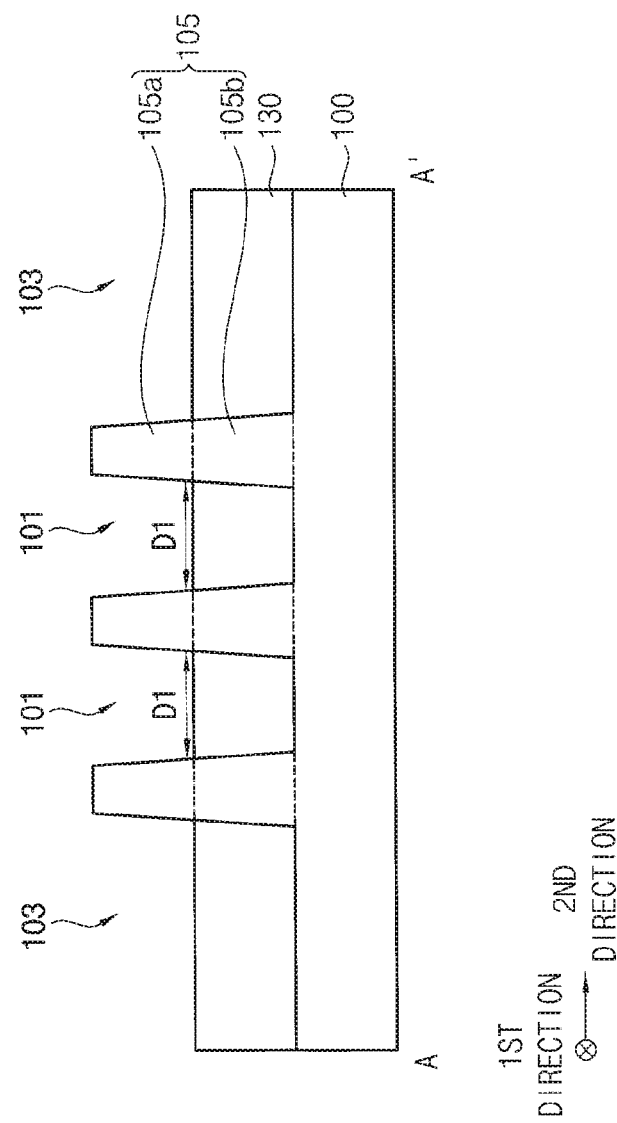

Referring to FIGS. 10 and 11, an isolation pattern 130 is formed on the substrate 100 to fill a lower portion of each of the first and second trenches 101 and 103.

In an exemplary embodiment, the isolation pattern 130 is formed by forming an isolation layer on the substrate 100 and the first masks 110 to sufficiently fill the first and second trenches 101 and 103, planarizing the isolation layer until a top surface of the active fin 105 is exposed, and removing an upper portion of the isolation layer to expose upper portions of the first and second trenches 101 and 103. When the upper portion of the isolation layer is removed, the first masks 110 are also removed.

When the upper portion of the isolation layer is removed, a portion of the active fin 105 adjacent thereto may be also removed, and thus a width of a portion of an upper active pattern 105a of which a sidewall is not covered by the isolation pattern 130 may be smaller than a width of a portion of a lower active pattern 105b of which a sidewall is covered by the isolation pattern 130. The isolation layer may be formed of an oxide (e.g., silicon oxide).

Alternatively, the isolation pattern 130 may be formed, after removing the first masks 110, by forming an isolation layer on the substrate 100 to sufficiently fill the trenches 101 and 103, planarizing the isolation layer until the top surface of the active fin 105 is exposed, and removing an upper portion of the isolation layer to expose the upper portions of the first and second trenches 101 and 103.

Accordingly, as the isolation pattern 130 is formed on the substrate 100, a field region having a top surface covered by the isolation pattern 130, and an active region having a top surface not covered by the isolation pattern 130 may be defined in the substrate 100. That is, the active region may be a region in which the active fin 105 is formed, and the field region may be a region in which no active fin is formed.

Figure 12:
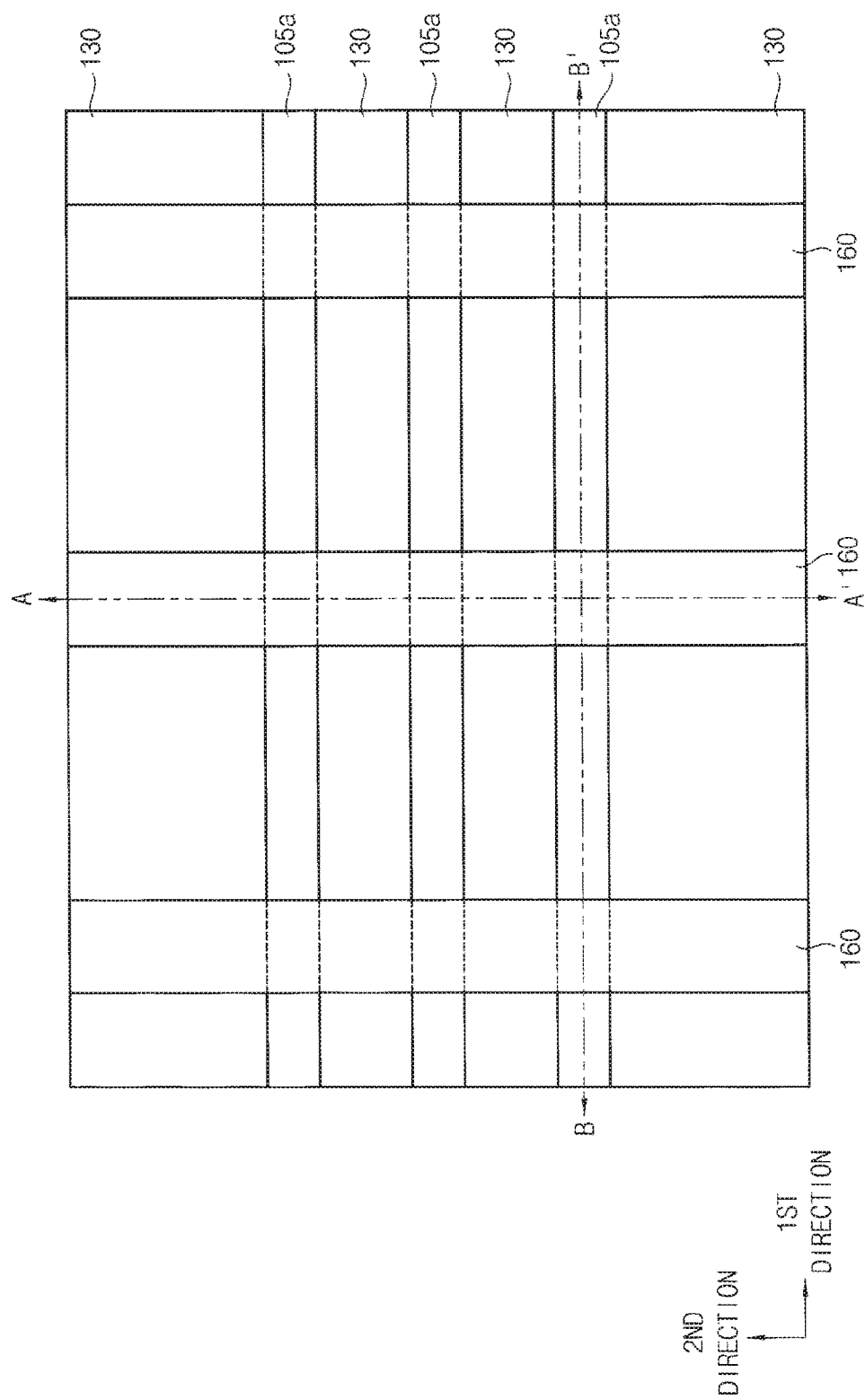
Figure 13:
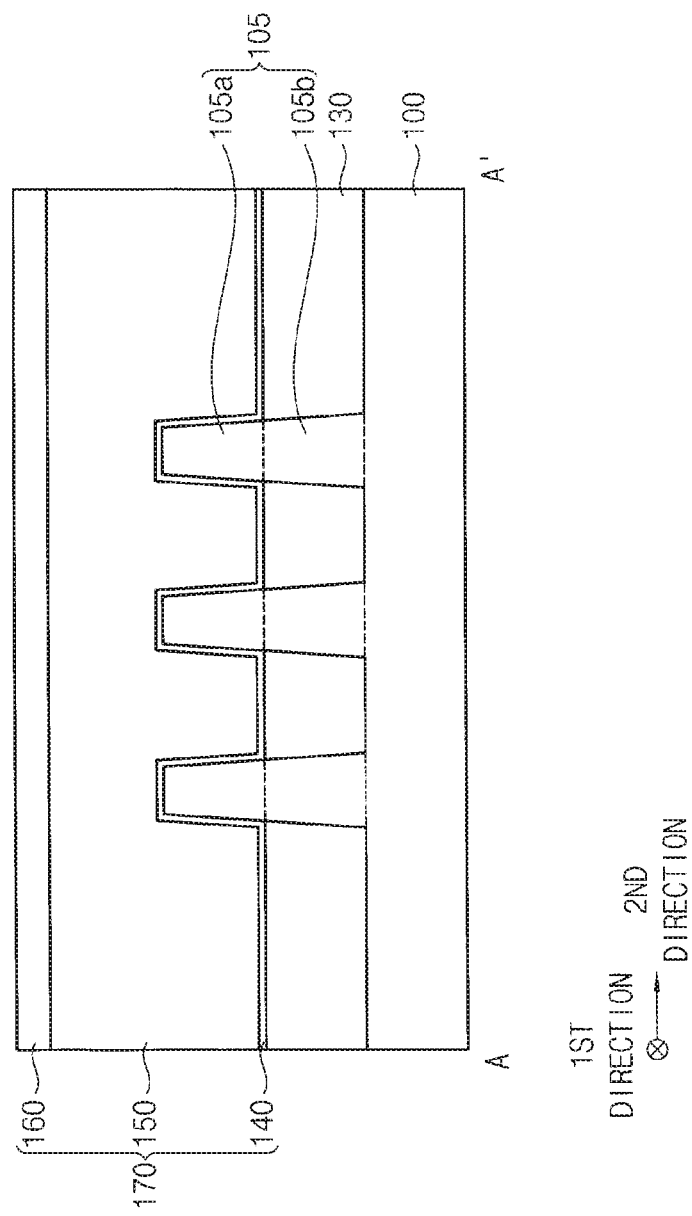
Figure 14:
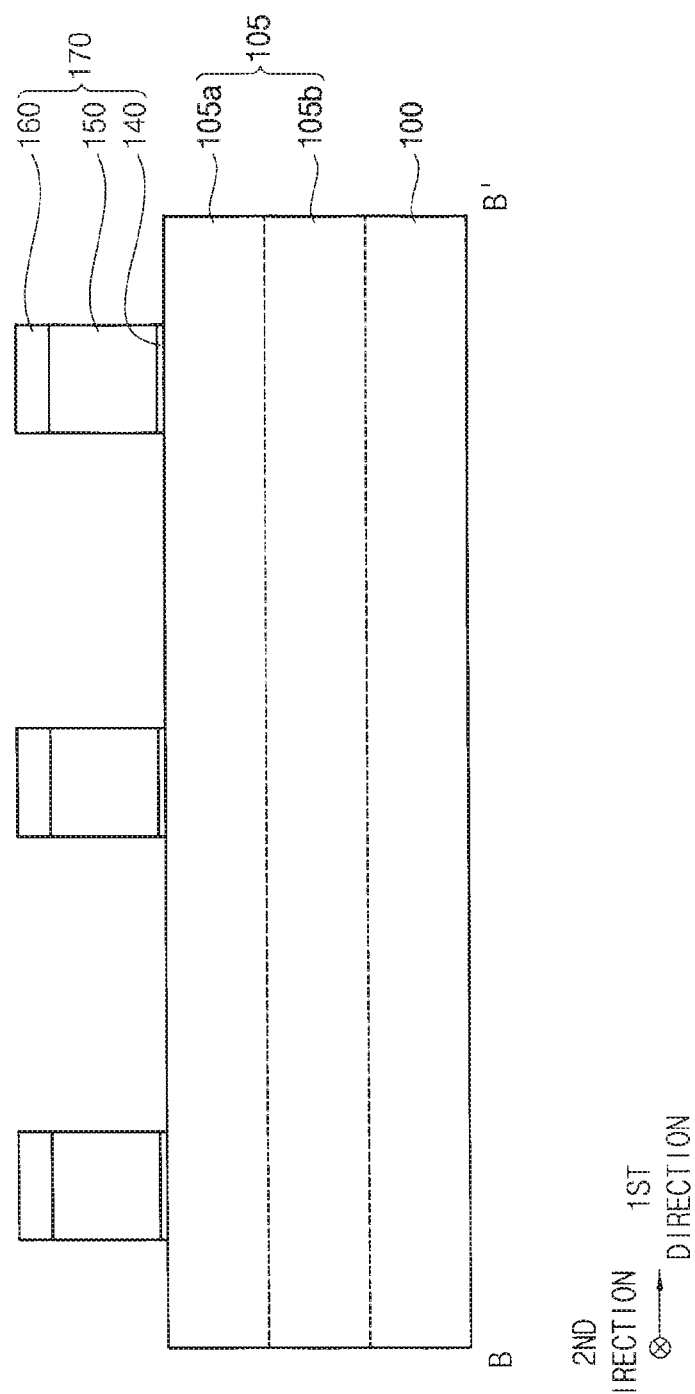

Referring to FIGS. 12 to 14, a dummy gate structure 170 is formed on the substrate 100.

The dummy gate structure 170 may be formed by sequentially forming a dummy gate insulation layer, a dummy gate electrode layer and a dummy gate mask layer on the active fin 105 of the substrate 100 and the isolation pattern 130, patterning the dummy gate mask layer by a photolithography process using a second photoresist pattern (not shown) to form a dummy gate mask 160, and sequentially etching the dummy gate electrode layer and the dummy gate insulation layer using the dummy gate mask 160 as an etching mask. Thus, the dummy gate structure 170 may be formed to include a dummy gate insulation pattern 140, a dummy gate electrode 150 and the dummy gate mask 160 sequentially stacked on the active fin 105 of the substrate 100 and a portion of the isolation pattern 130 adjacent thereto in the second direction.

The dummy gate insulation layer may be formed of an oxide (e.g., silicon oxide), the dummy gate electrode layer may be formed of silicon (e.g., polysilicon), and the dummy gate mask layer may be formed of a nitride (e.g., silicon nitride). The dummy gate insulation layer may be formed by a chemical vapor deposition (CVD) process, an atomic layer deposition (ALD) process, or the like. In CVD, a wafer (e.g., a substrate) is exposed to one or more volatile precursors, which react and/or decompose on the substrate surface to produce the desired deposit. In ALD, a film is grown on a substrate by exposing its surface to gaseous precursors. In an embodiment, the dummy gate insulation layer is formed by a thermal oxidation process on an upper portion of the substrate 100, and in this embodiment, the dummy gate insulation layer is formed only on the upper active pattern 105a. In thermal oxidation, an oxidizing agent is forced to diffuse into the wafer at a high temperature and react with it. The dummy gate electrode layer and the dummy gate mask layer may be formed by a CVD process, an ALD process, etc.

In an exemplary embodiment, the dummy gate structure 170 is formed to extend in the second direction on the active fins 105 of the substrate 100 and the isolation pattern 130, and a plurality of dummy gate structures 170 are formed to be spaced apart from each other in the first direction.

An ion implantation process may be further performed to form an impurity region (not shown) at an upper portion of the active fin 105 adjacent the dummy gate structure 170. The ion implantation process may make use of an ion source (e.g., where ions of the desired element are produced), an accelerator (e.g., where the ions are electrostatically accelerated), and a target chamber, where the ions impinge on a target (i.e., the material being implanted).

Figure 15:
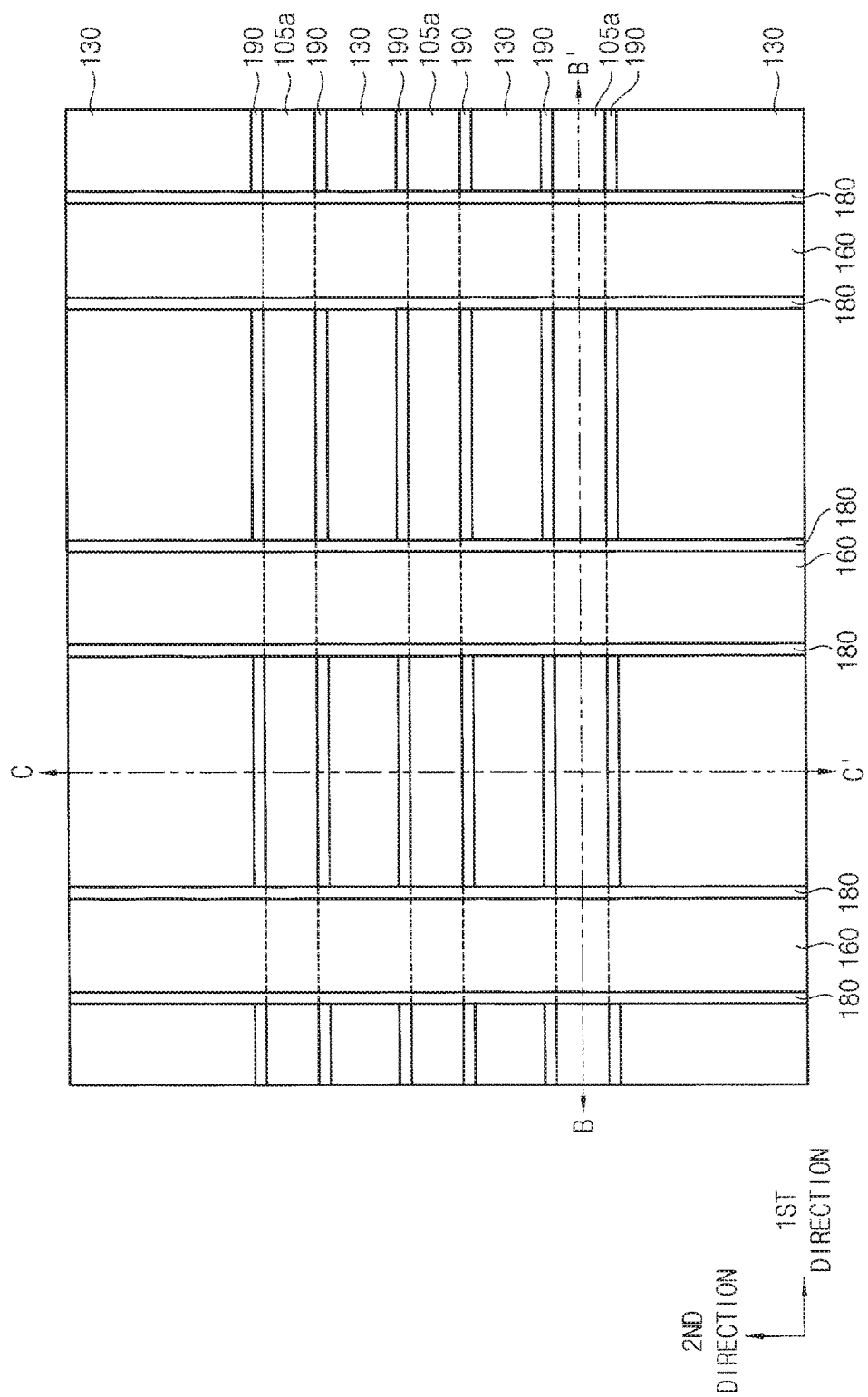
Figure 16:
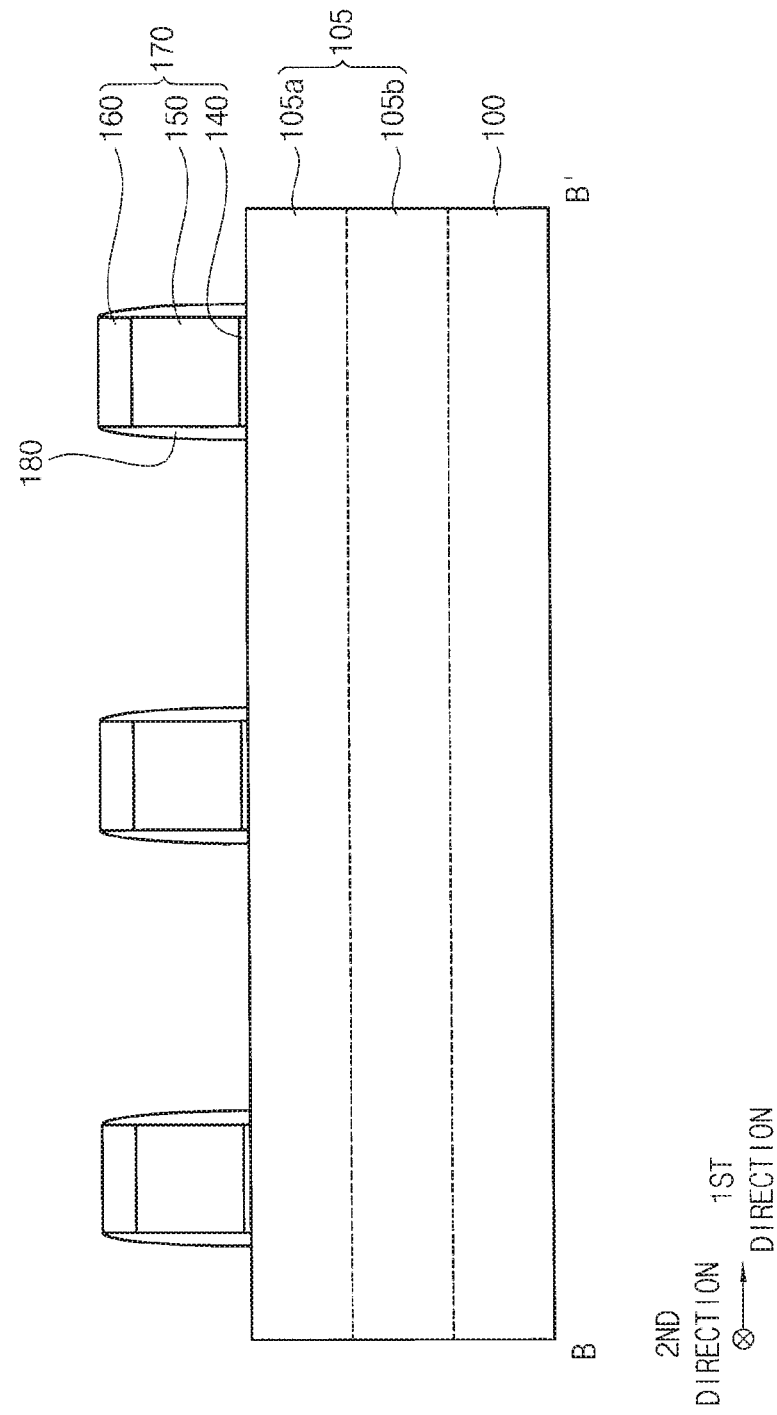
Figure 17:
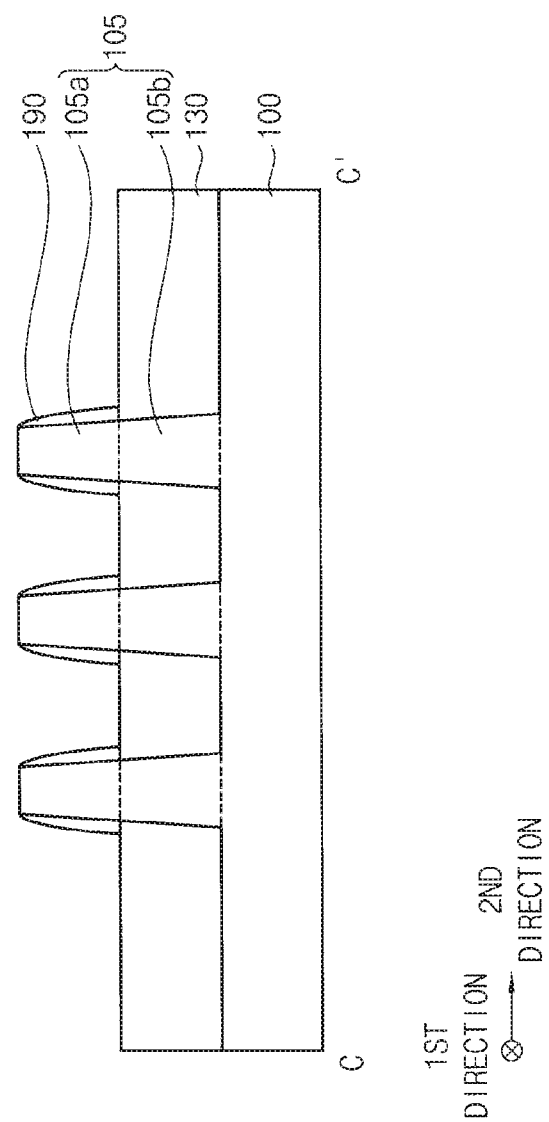

Referring to FIGS. 15 to 17, a gate spacer 180 and a fin spacer 190 are formed on sidewalls of the dummy gate structure 170 and the upper active pattern 105a, respectively.

In an exemplary embodiment, the gate spacer 180 and the fin spacer 190 are formed by forming a spacer layer on the dummy gate structure 170, the active fin 105, and the isolation pattern 130, and anisotropically etching the spacer layer. Thus, the gate spacer 180 and the fin spacer 190 are not differentiated from each other at an area at which the gate spacer 180 and the fin spacer 190 contact each other, and thus may be merged with each other. The spacer layer may be formed of a nitride (e.g., silicon nitride, silicon oxynitride, silicon oxycarbonitride, etc.).

The gate spacer 180 is formed on sidewalls of the dummy gate structure 170 opposite to each other in the first direction, and the fin spacer 190 is formed on sidewalls of the active fin 105 opposite to each other in the second direction.

Figure 18:
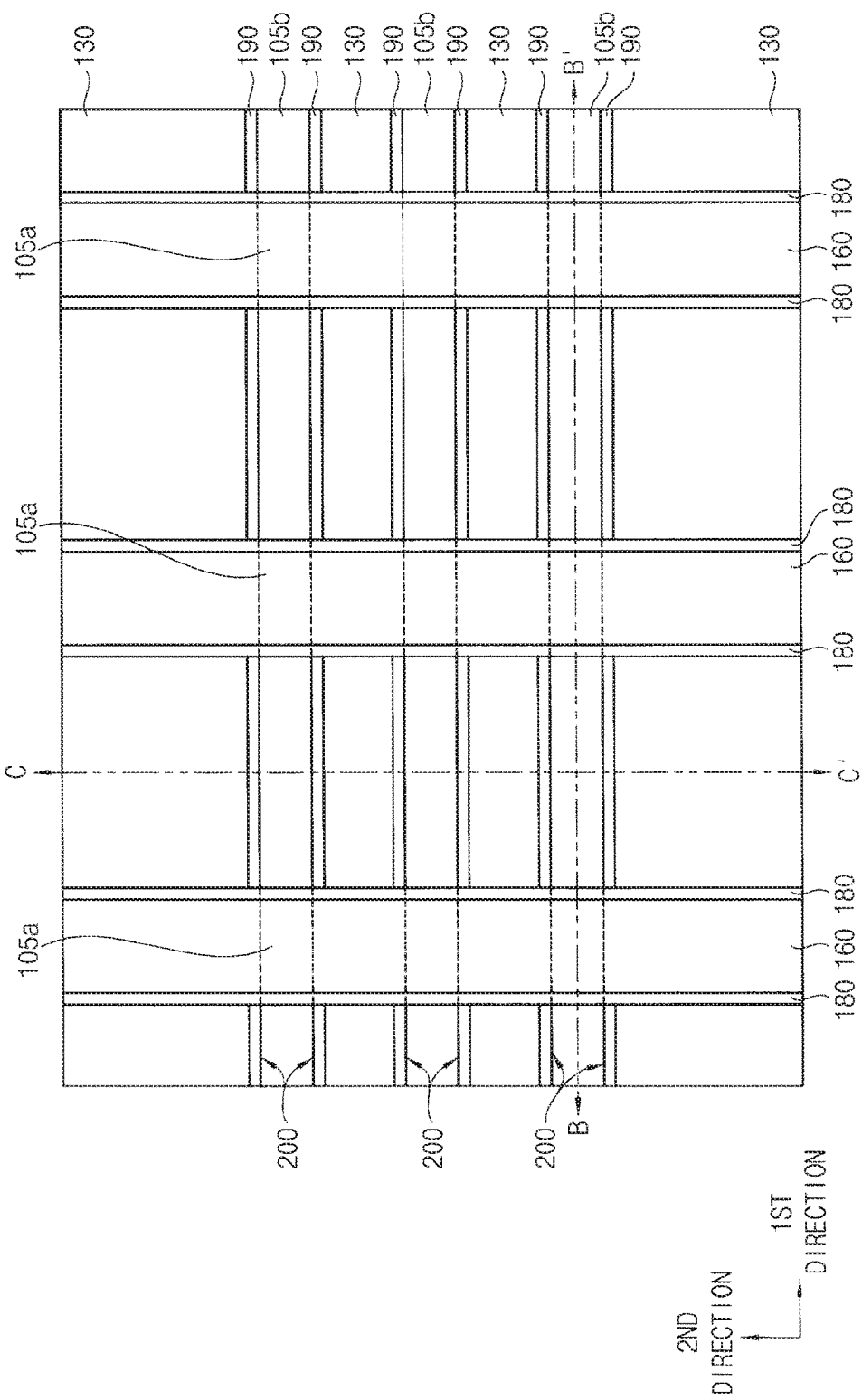
Figure 19:
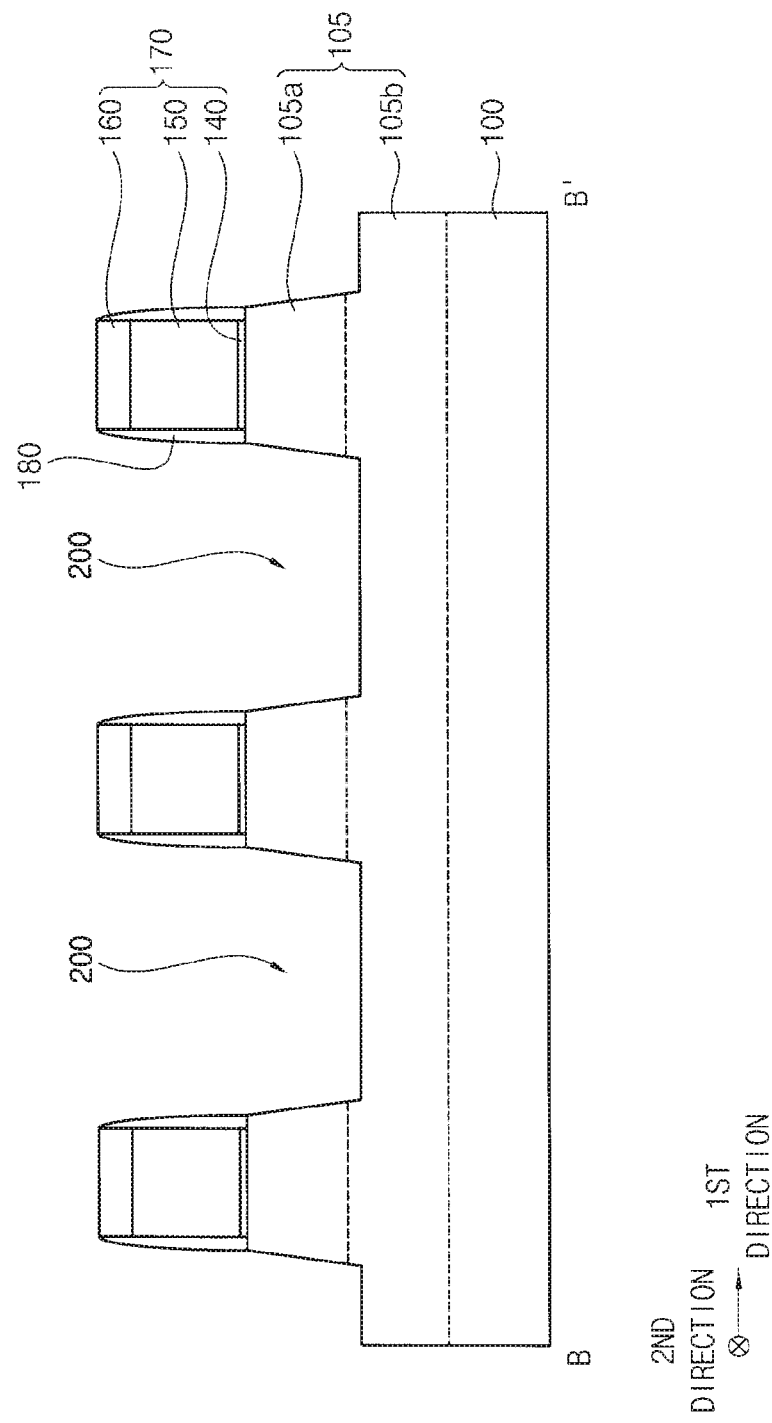
Figure 20:
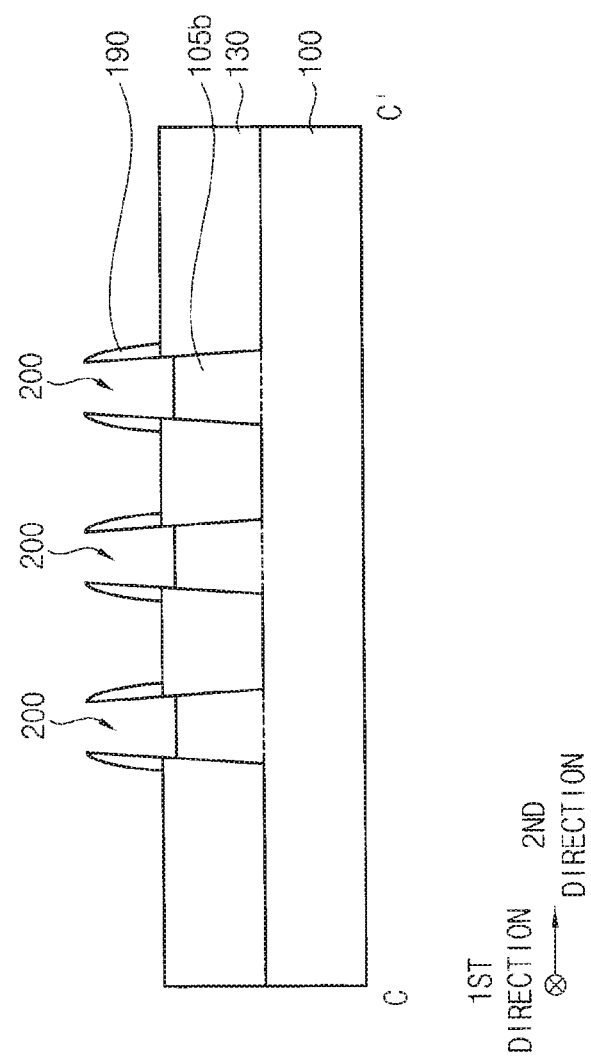

Referring to FIGS. 18 to 20, an upper portion of the exposed active fin 105 is removed to form a first recess 200.

In an exemplary embodiment, the upper active pattern 105a of the active fin 105 is removed to form the first recess 200, and thus a top surface of the lower active pattern 105b is exposed. In this embodiment, an upper portion of the lower active pattern 105b may be also removed. Alternatively, only the upper active pattern 105a is partially removed to form the first recess 200, and thus the lower active pattern 105b is not exposed.

Figure 21:
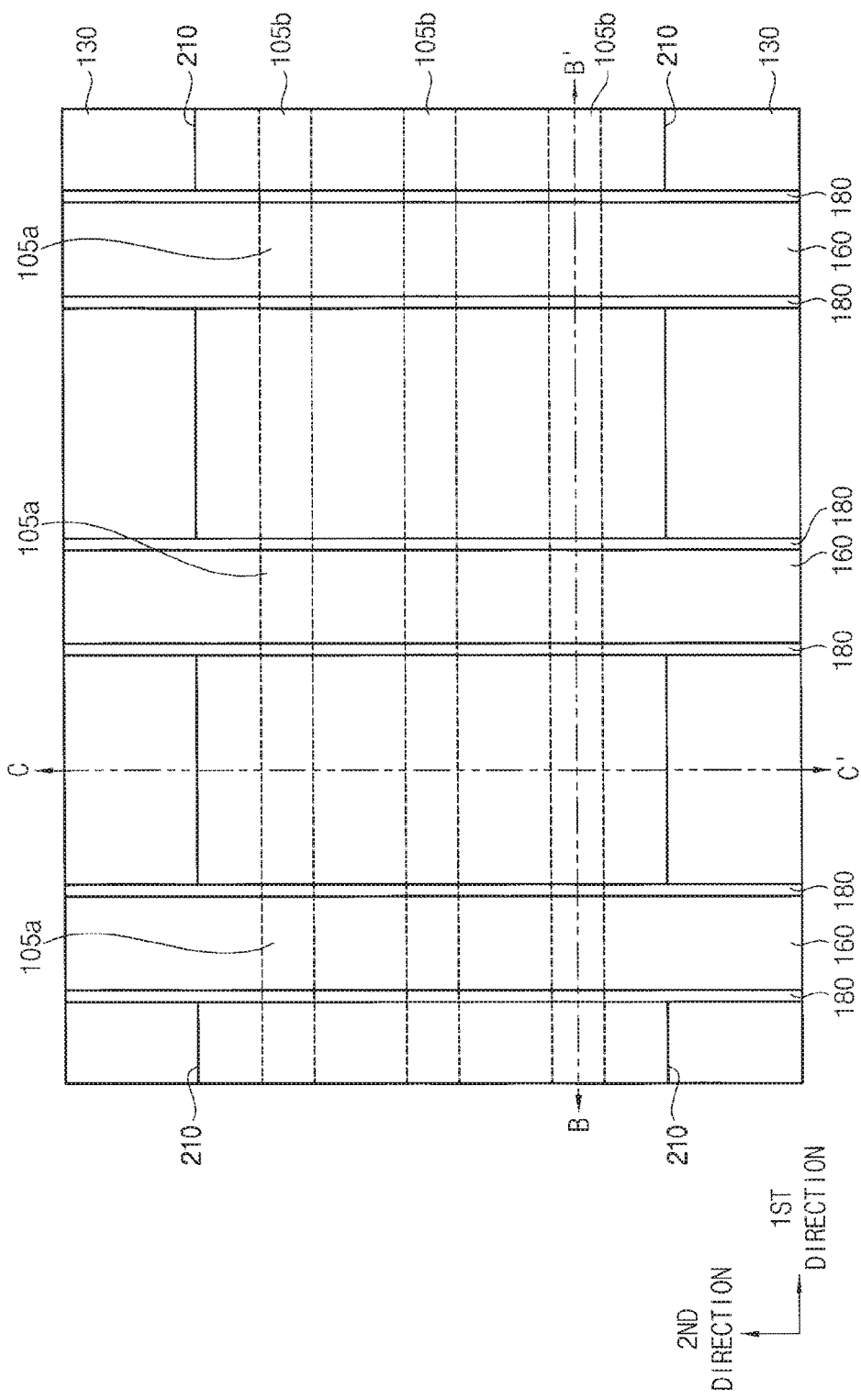
Figure 22:
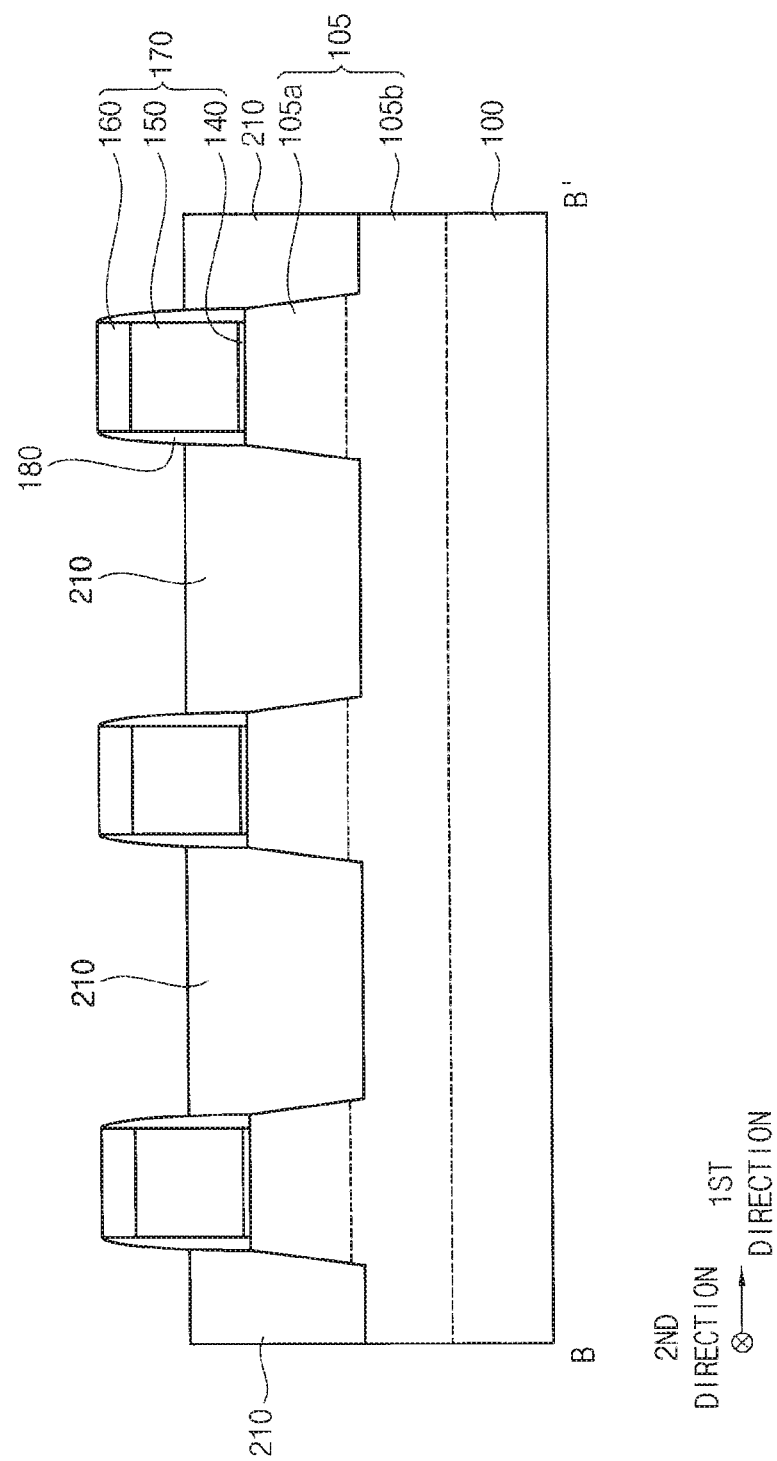
Figure 23:
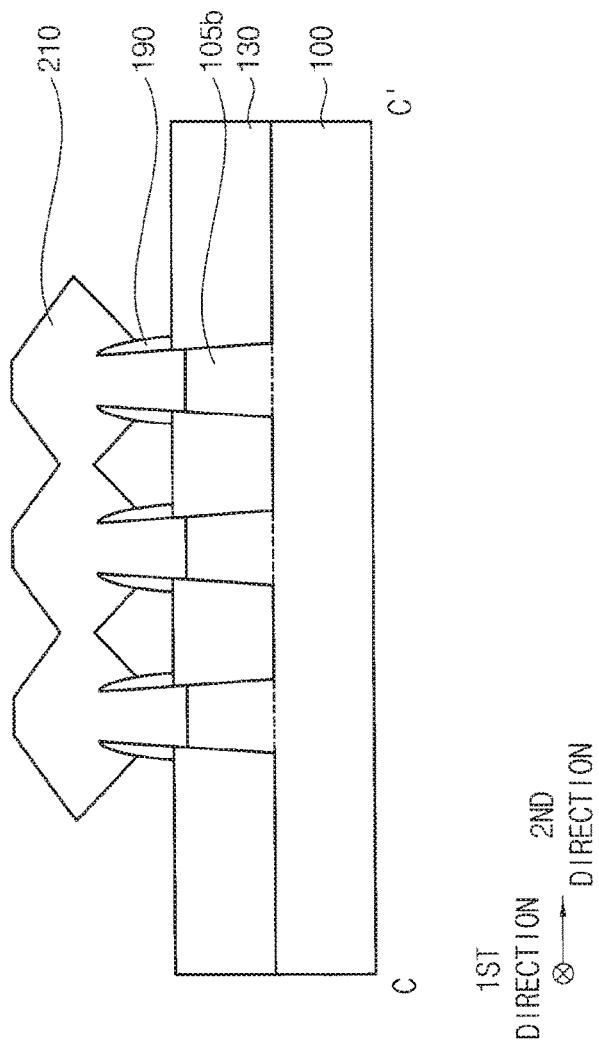

Referring to FIGS. 21 to 23, a source/drain layer 210 filling the first recess 200 is formed on the active fin 105.

In an exemplary embodiment, the source/drain layer 210 is formed by a selective epitaxial growth (SEG) process using the top surface of the active fin 105 exposed by the first recess 200 as a seed.

In an exemplary embodiment, the source/drain layer 210 is formed by performing an SEG process using a silicon source gas (e.g., disilane ($Si_2H_6$) gas) and a carbon source gas (e.g., monomethylsilane ($SiH_3CH_3$) gas) to form a single crystalline silicon carbide layer. Alternatively, the SEG process may be performed using only the silicon source gas (e.g., disilane ($Si_2H_6$) gas) to form a single crystalline silicon layer. In an exemplary embodiment, an n-type impurity source gas (e.g., phosphine ($PH_3$) gas) is also used to form a single crystalline silicon carbide layer doped with n-type impurities or a single crystalline silicon layer doped with n-type impurities. Thus, the source/drain layer 210 may serve as a source/drain region of a negative-channel metal oxide semiconductor (NMOS) transistor.

Alternatively, the source/drain layer 210 may be formed by performing an SEG process using a silicon source gas (e.g., dichlorosilane ($SiH_2Cl_2$) gas) or a germanium source gas (e.g., germane ($GeH_4$) gas) to form a single crystalline silicon-germanium layer. In an exemplary embodiment, a p-type impurity source gas (e.g., diborane ($B_2H_6$) gas) is also used to form a single crystalline silicon-germanium layer doped with p-type impurities. Thus, the source/drain layer 210 may serve as a source/drain region of a positive-channel metal oxide semiconductor (PMOS) transistor.

The source/drain layer 210 may fill the first recess 200, and may be further grown to contact a portion of the gate spacer 180. The source/drain layer 210 may grow not only in the vertical direction but also in the horizontal direction, and thus may have a cross-section taken along the second direction of which a shape may be a pentagon or a hexagon. In an exemplary embodiment, the source/drain layers 210 on the first active fins 105 spaced apart from each other in the second direction at the first distance D1 grow to be merged with each other. Accordingly, one merged source/drain layer 210 is formed on the active fins 105 included in each of the first active fin groups. A plurality of source/drain layers 210 may be formed on the plurality of first active fin groups, respectively, spaced apart from each other in the second direction, and may be spaced apart from each other in the second direction.

Figure 24:
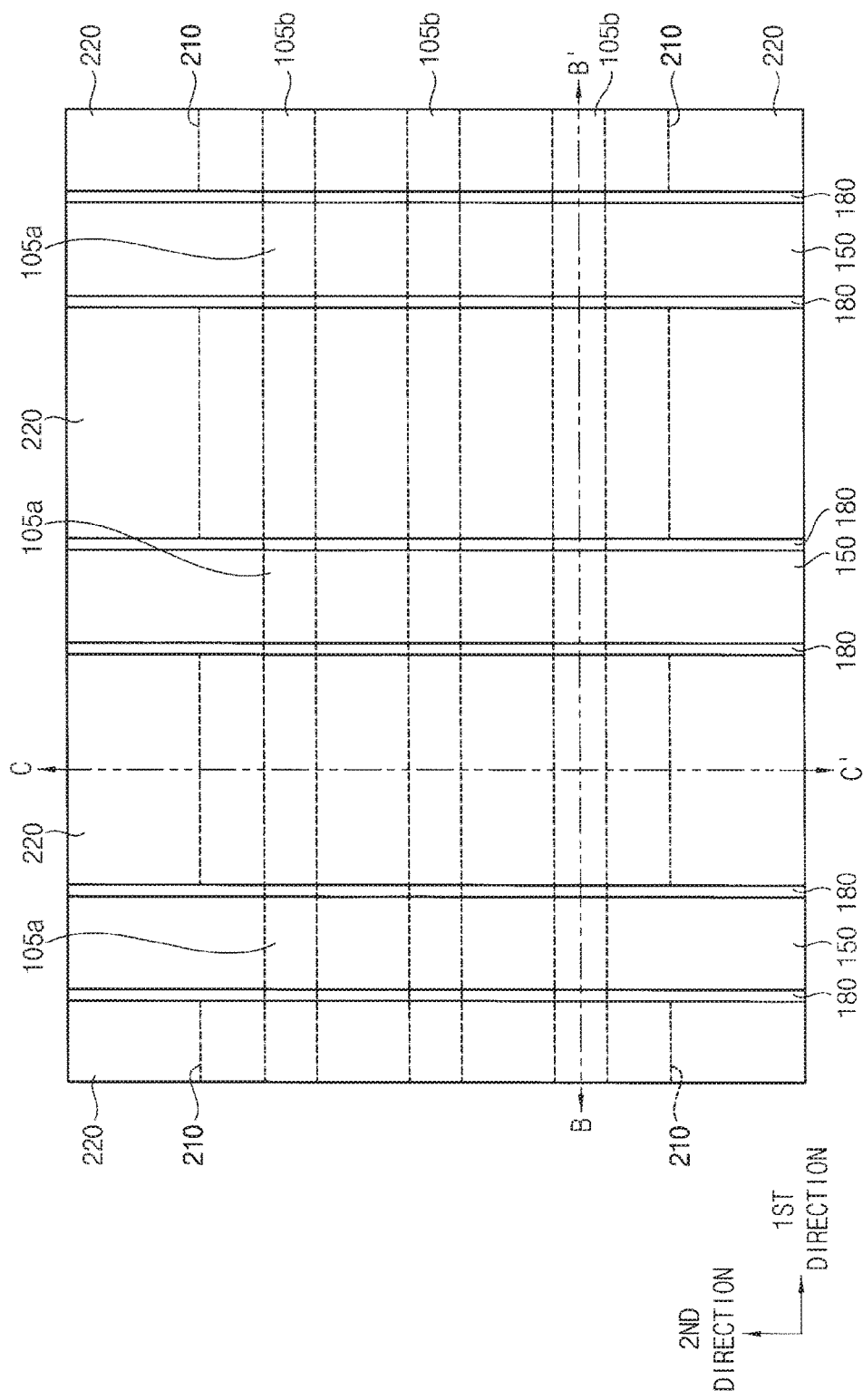
Figure 25:
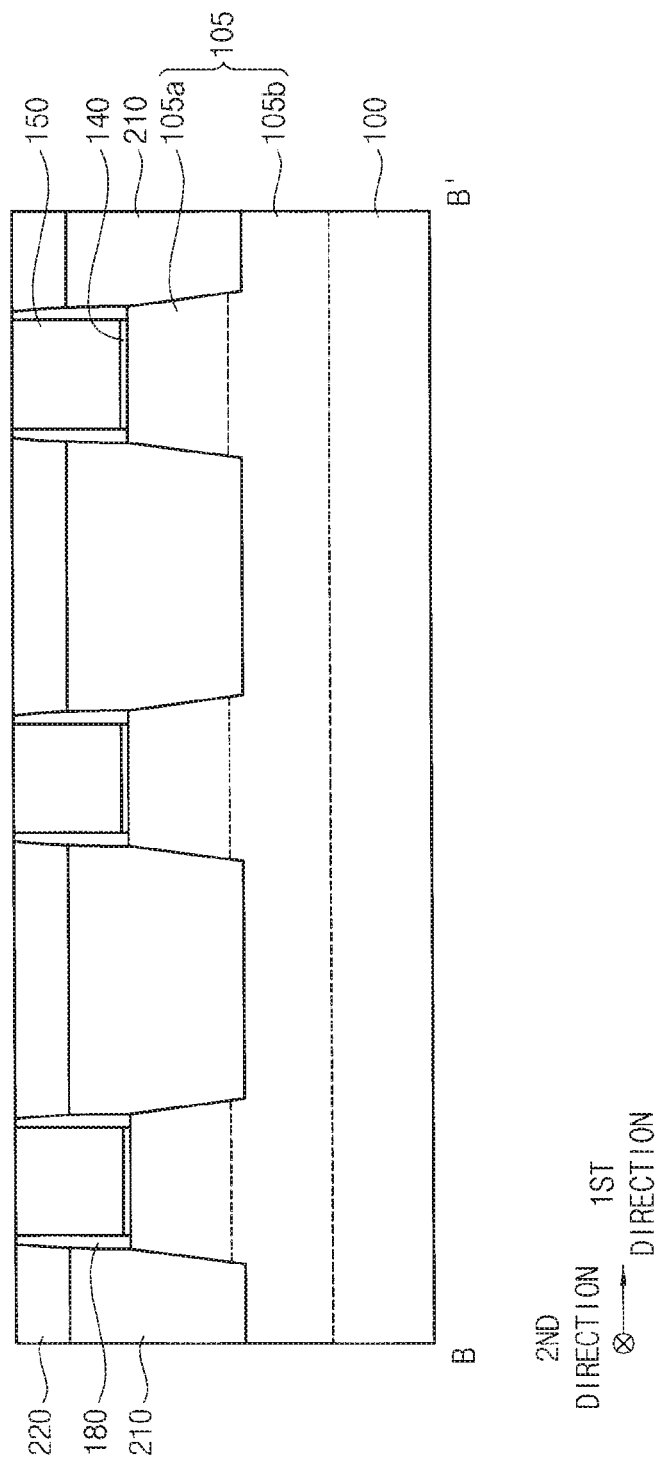
Figure 26:
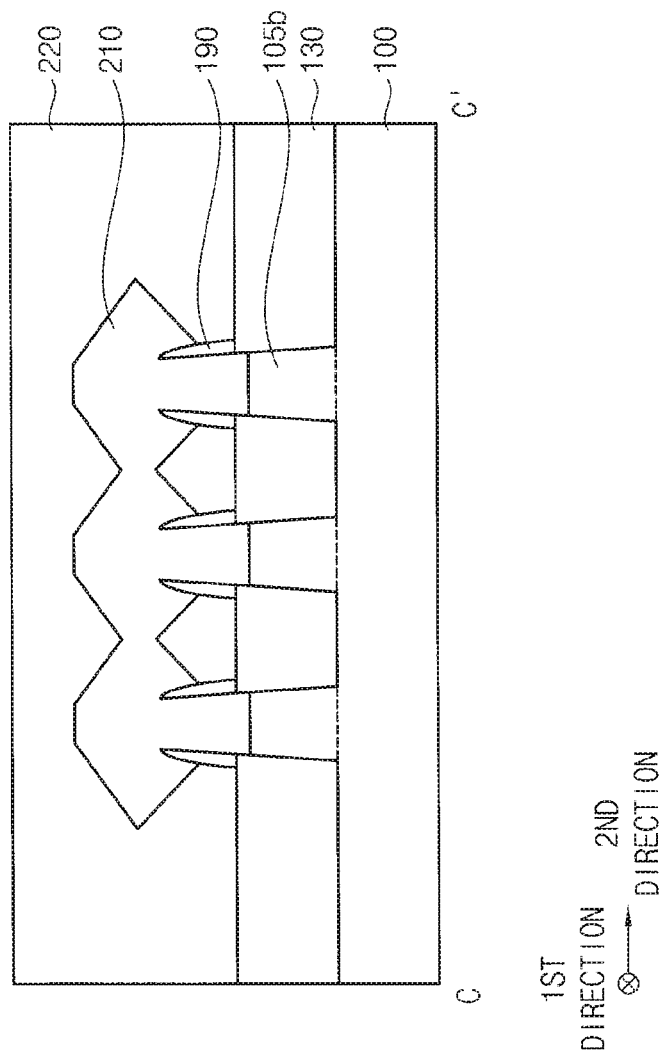

Referring to FIGS. 24 to 26, a first insulating interlayer 220 is formed on the active fin 105 and the isolation pattern 130 to cover the dummy gate structure 170, the gate spacer 180, the fin spacer 190 and the source/drain layer 210 to a sufficient height, and may be planarized until a top surface of the dummy gate electrode 150 of the dummy gate structure 170 is exposed. In the planarization process, the dummy gate mask 160 may be also removed, and an upper portion of the gate spacer 180 may be partially removed.

The first insulating interlayer 220 may be formed of an oxide (e.g., silicon oxide). The planarization process may be performed by a chemical mechanical polishing/planarization (CMP) process and/or an etch back process. CMP uses a combination of chemical and mechanical forces (e.g., an abrasive and corrosive chemical slurry and a polishing pad) to smooth a surface.

Figure 27:
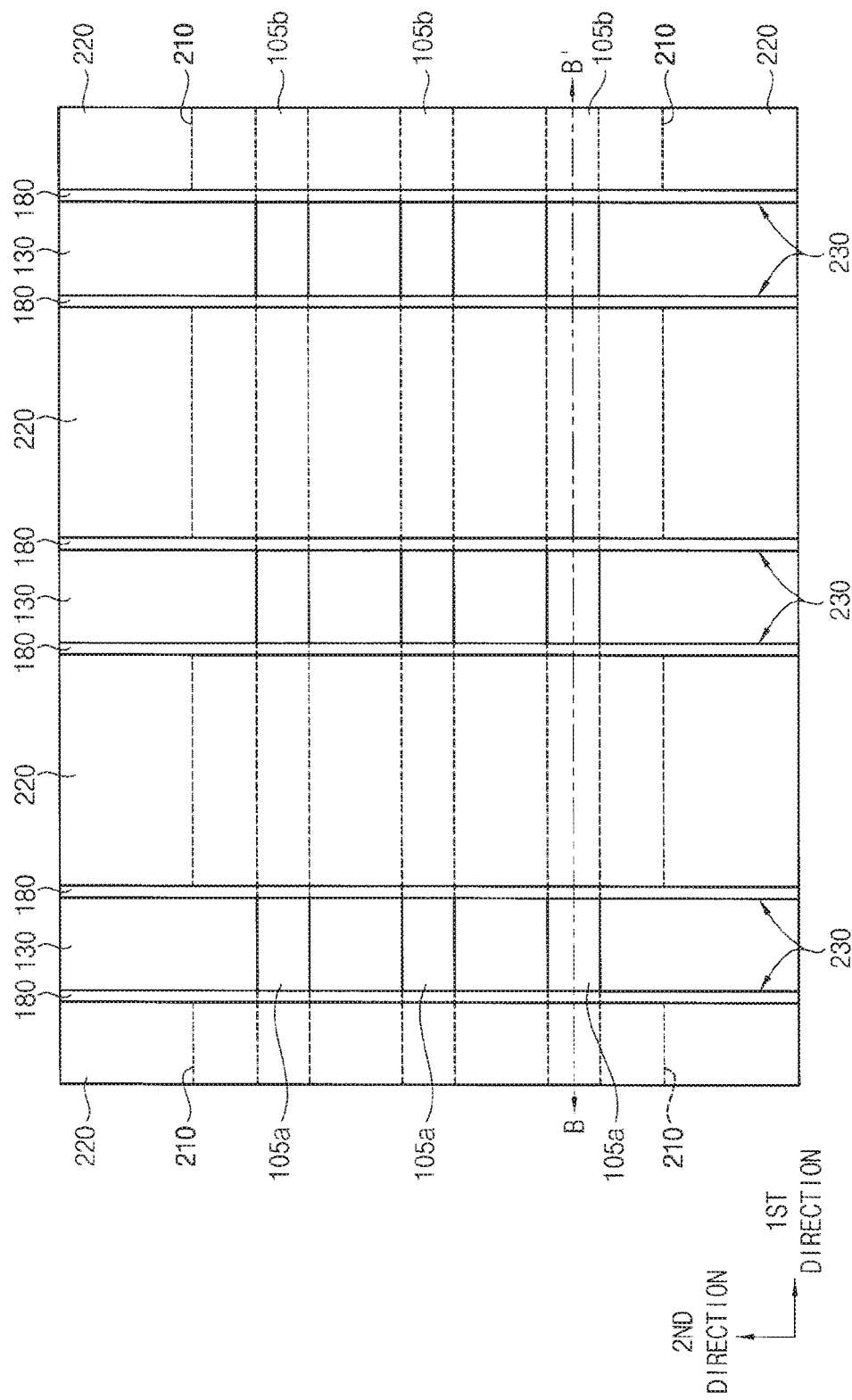
Figure 28:
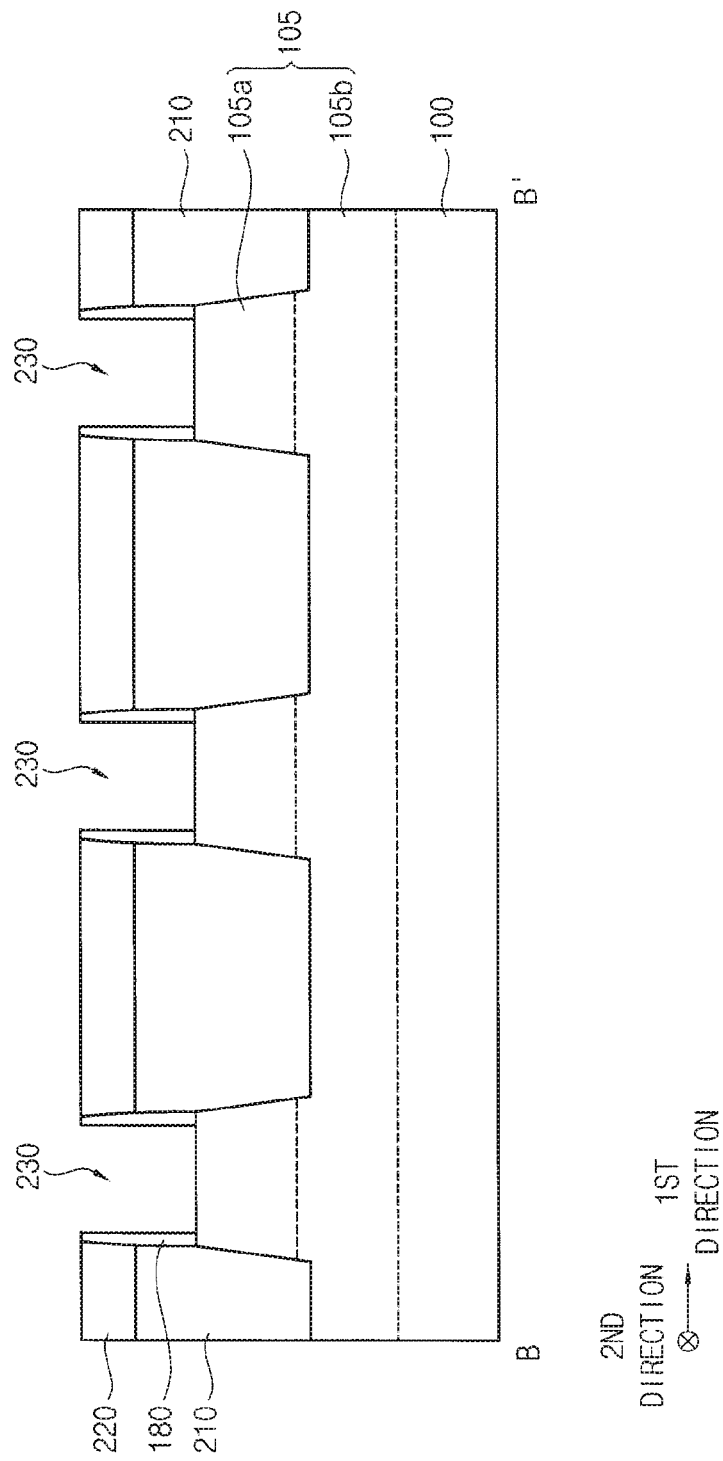

Referring to FIGS. 27 and 28, the exposed dummy gate electrode 150 and the dummy gate insulation pattern 140 under the dummy gate electrode 150 are removed to form a first opening 230 exposing an inner sidewall of the gate spacer 180 and a top surface of the active fin 105 (i.e., a top surface of the upper active pattern 105a).

In an exemplary embodiment, the exposed dummy gate electrode 150 is removed by a dry etch process first, and then a wet etch process using ammonia hydroxide ($NH_4OH$) as an etching solution. The dummy gate insulation pattern 140 may be removed by a dry etch process and/or a wet etch process using hydrogen fluoride (HF) as an etching solution.

Figure 29:
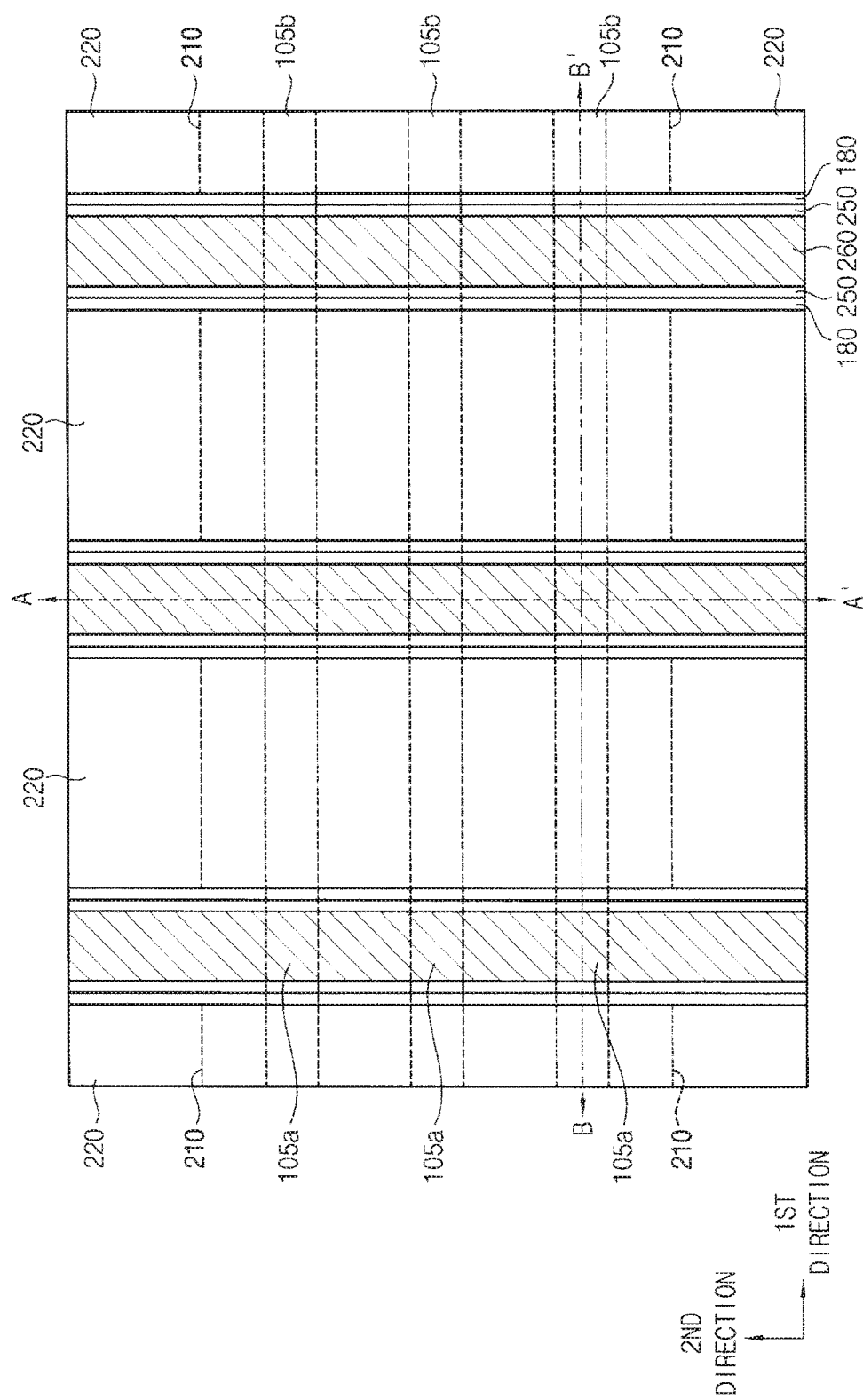
Figure 30:
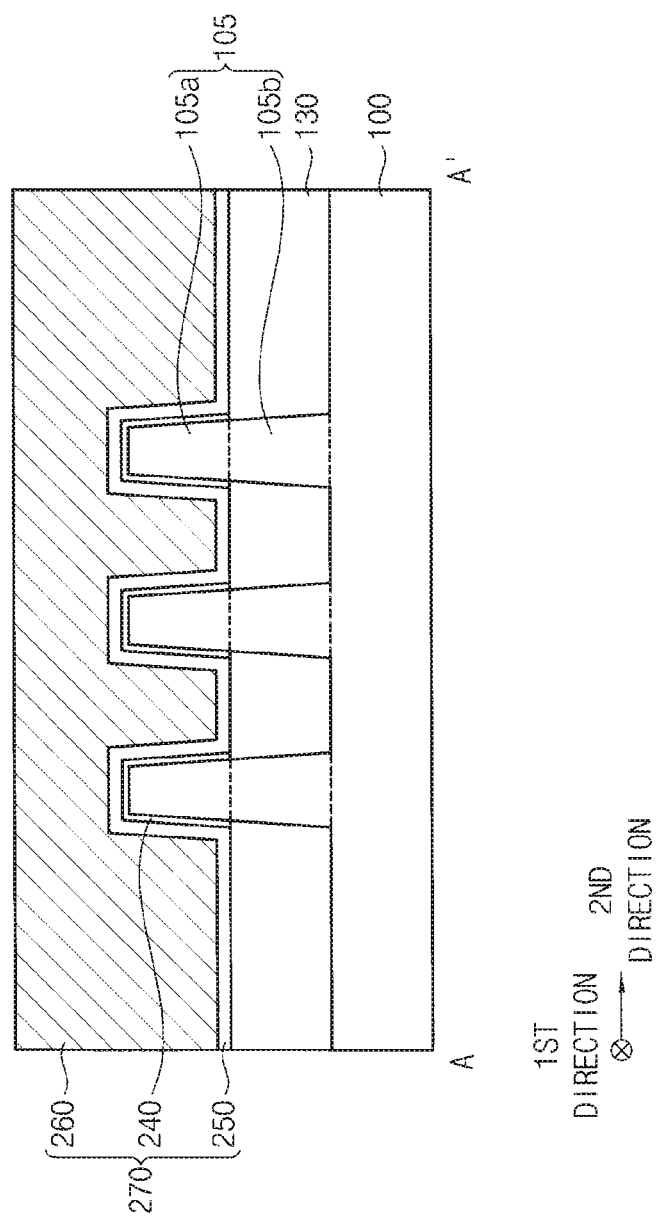
Figure 31:
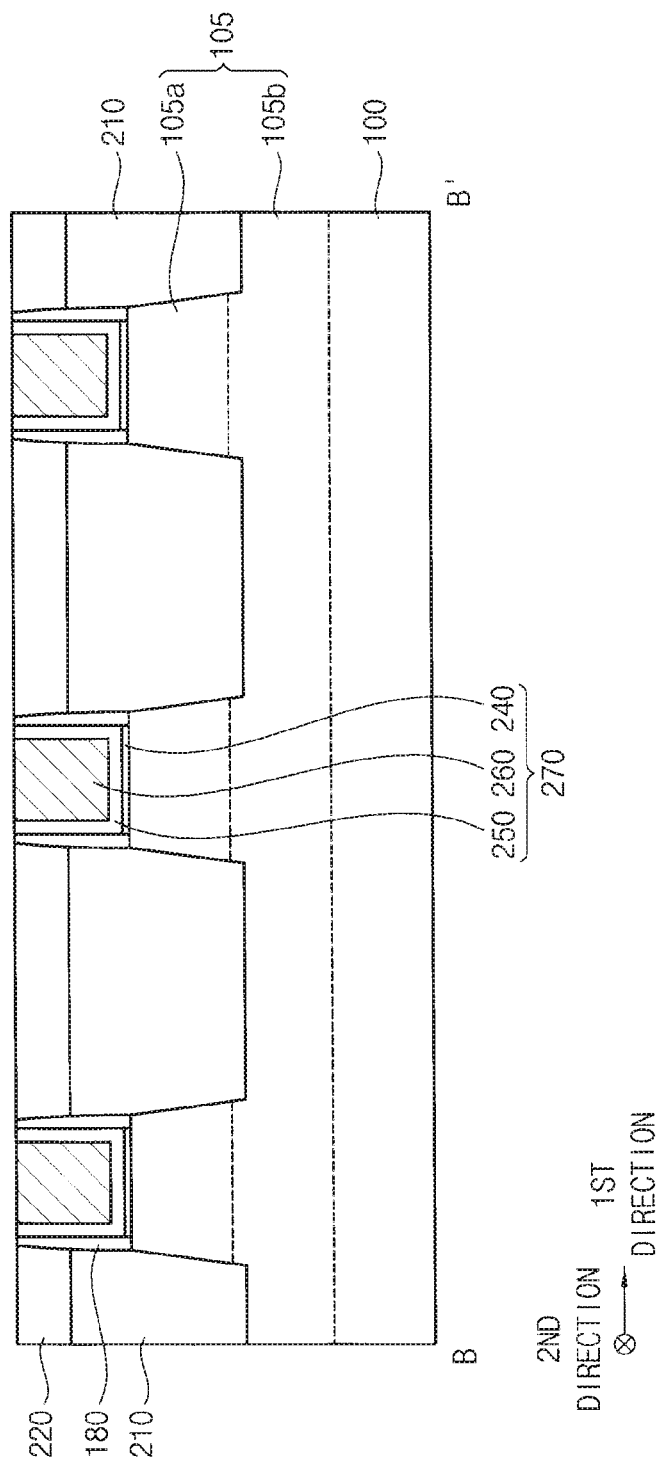

Referring to FIGS. 29 to 31, a gate structure 270 is formed to fill the first opening 230.

In an exemplary embodiment, after performing a thermal oxidation process on the top surface of the active fin 105 exposed by the first opening 230 to form an interface pattern 240, a gate insulation layer is formed on the interface pattern 240, the isolation pattern 130, the gate spacer 180, and the first insulating interlayer 220, and a gate electrode layer is formed on the gate insulation layer to sufficiently fill a remaining portion of the first opening 230.

The gate insulation layer may be formed of a metal oxide having a high dielectric constant (e.g., hafnium oxide, tantalum oxide, zirconium oxide, or the like) by a CVD process or an ALD process. The gate electrode layer may be formed of a material having a low resistance (e.g., a metal such as aluminum, copper, tantalum, etc., or a metal nitride thereof) by an ALD process, a physical vapor deposition (PVD) process, or the like. In an exemplary embodiment, a heat treatment process, e.g., a rapid thermal annealing (RTA) process, a spike rapid thermal annealing (spike RTA) process, a flash rapid thermal annealing (flash RTA) process or a laser annealing process may be further performed. Alternatively, the gate electrode layer may be formed of doped polysilicon.

Instead of forming the interface pattern 240 using the thermal oxidation process, the interface pattern 240 may be formed by a CVD process, an ALD process, or the like, similarly to the gate insulation layer or the gate electrode layer. In this case, the interface pattern 240 may be formed not only on the top surface of the active fin 105 but also on the top surface of the isolation pattern 130 and the inner sidewall of the gate spacer 180.

The gate electrode layer and the gate insulation layer may be planarized until a top surface of the first insulating interlayer 220 is exposed to form a gate insulation pattern 250 on the interface pattern 240 and the inner sidewall of the gate spacer 180, and a gate electrode 260 filling the remaining portion of the first opening 230 on the gate insulation pattern 250. Accordingly, a bottom surface and a sidewall of the gate electrode 260 may be covered by the gate insulation pattern 250. In an exemplary embodiment, the planarization process is performed by a CMP process and/or an etch back process.

The interface pattern 240, the gate insulation pattern 250 and the gate electrode 260 sequentially stacked form the gate structure 270, and the gate structure 270 together with the source/drain layer 210 may form a PMOS transistor or an NMOS transistor according to the conductivity type of the impurities doped into the source/drain layer 210.

Figure 32:
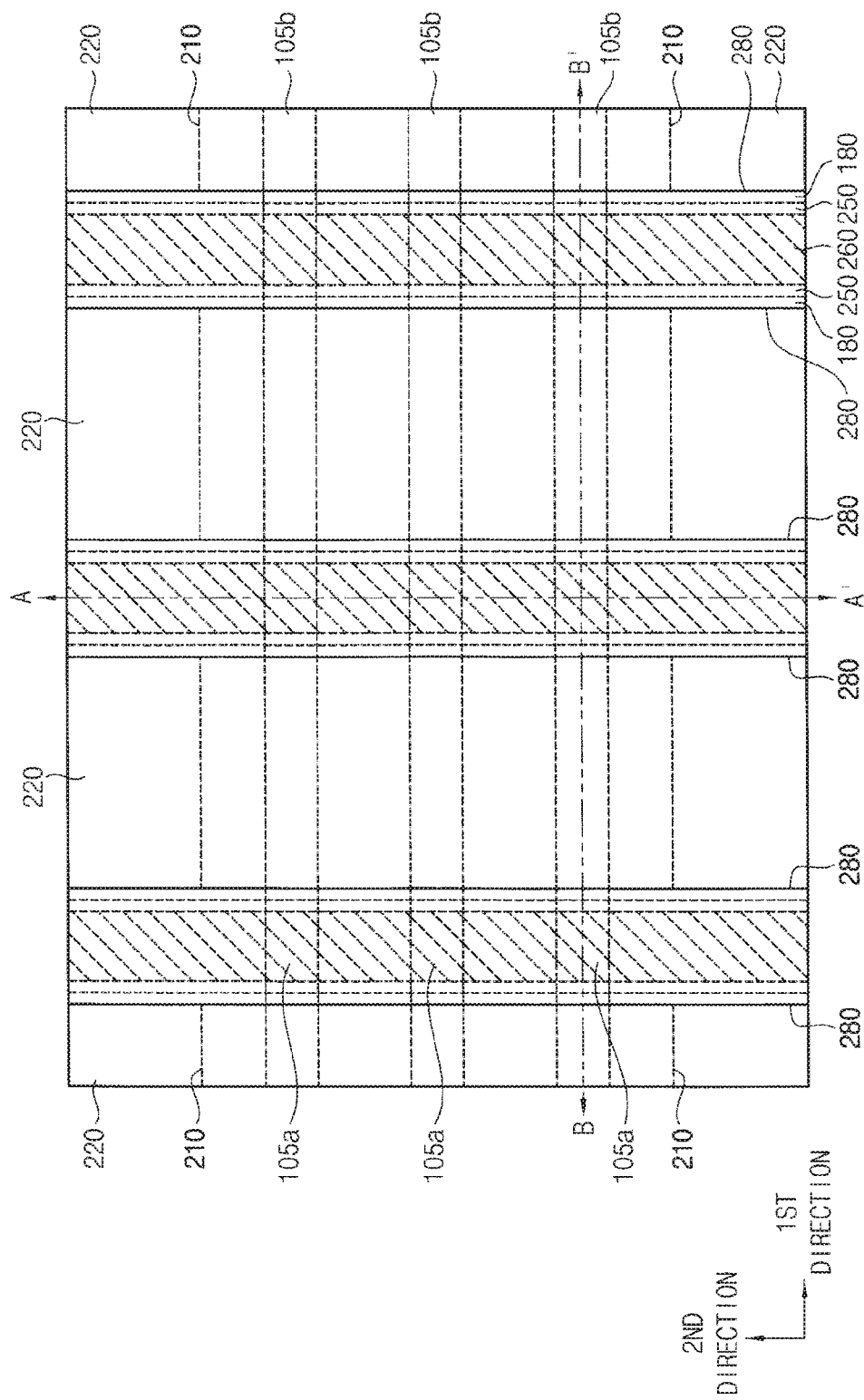
Figure 33:
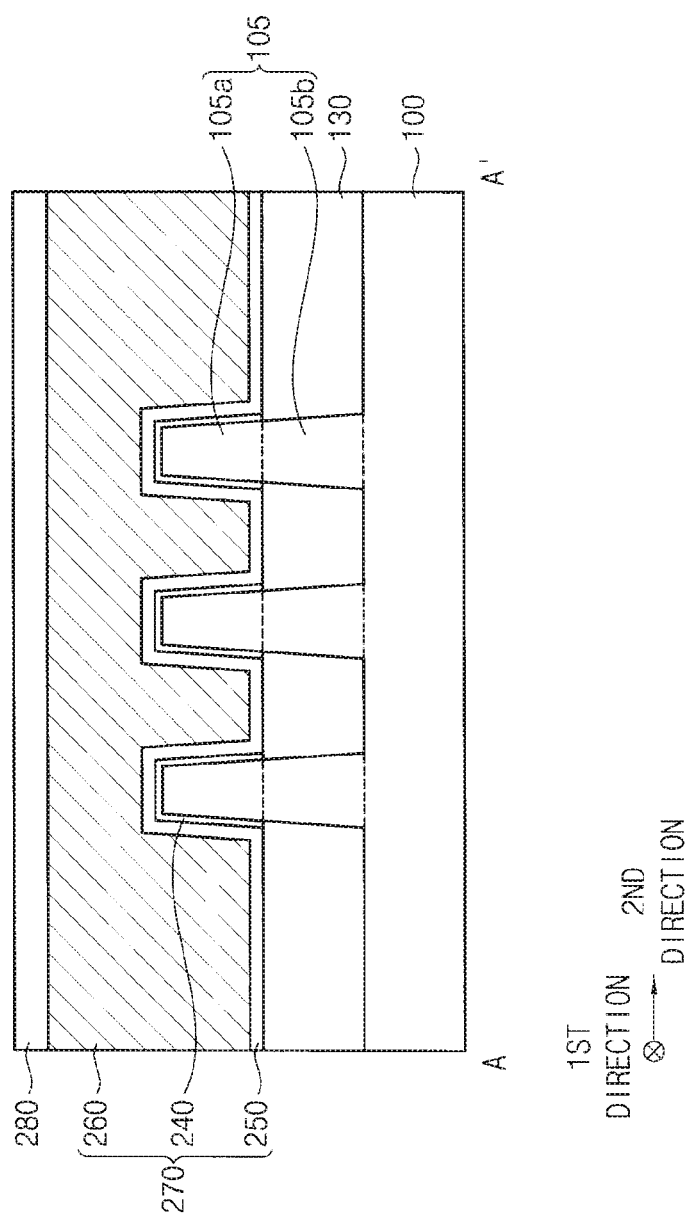
Figure 34:
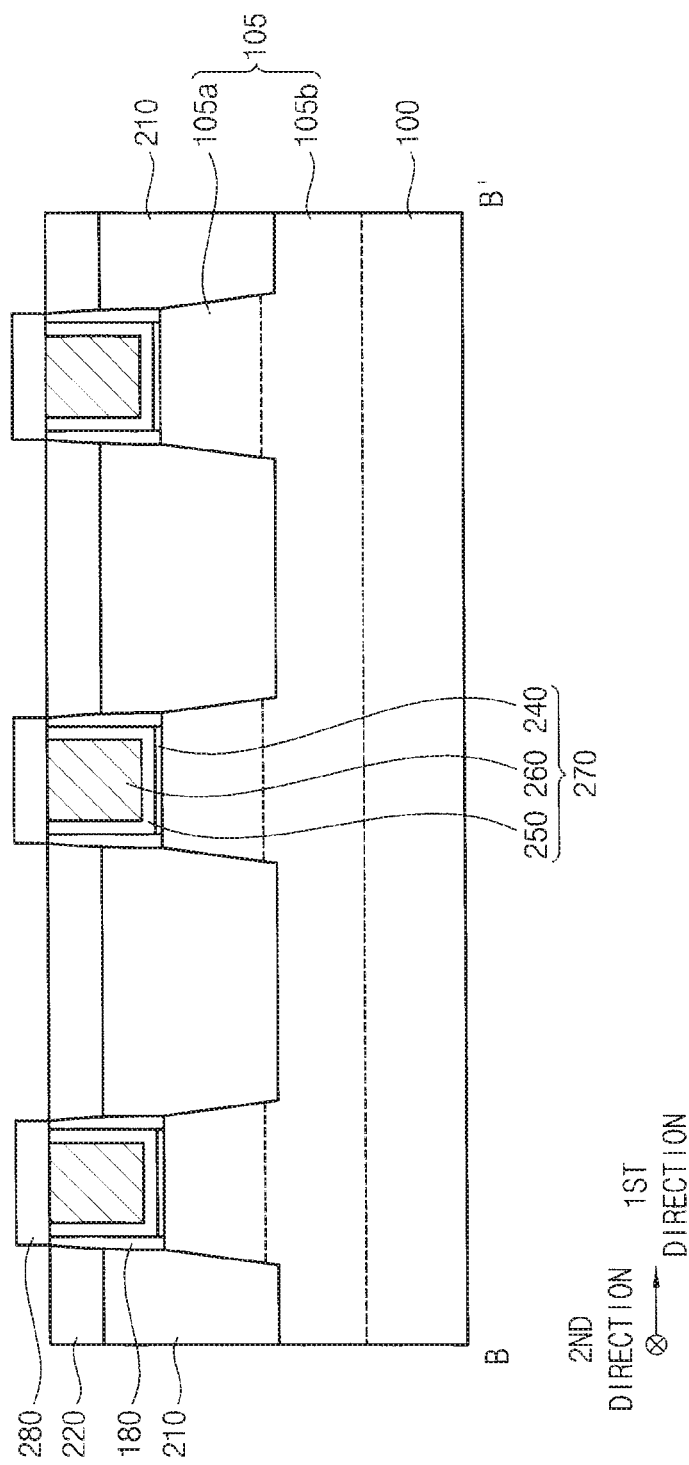

Referring to FIGS. 32 to 34, a gate mask 280 is formed on a top surface of the gate structure 270.

The gate mask 280 may be formed by forming a gate mask layer on the gate structure 270, the gate spacer 180 and the first insulating interlayer 220, and patterning the gate mask layer. The gate mask layer may be formed of a nitride (e.g., silicon nitride).

In an exemplary embodiment, the gate mask 280 extends in the second direction to cover the top surface of the gate structure 270, and a plurality of gate masks 280 are formed in the first direction. While the gate mask 280 is illustrated in FIG. 34 as covering a top surface of the gate spacer 180, the inventive concept is not limited thereto.

Figure 35:
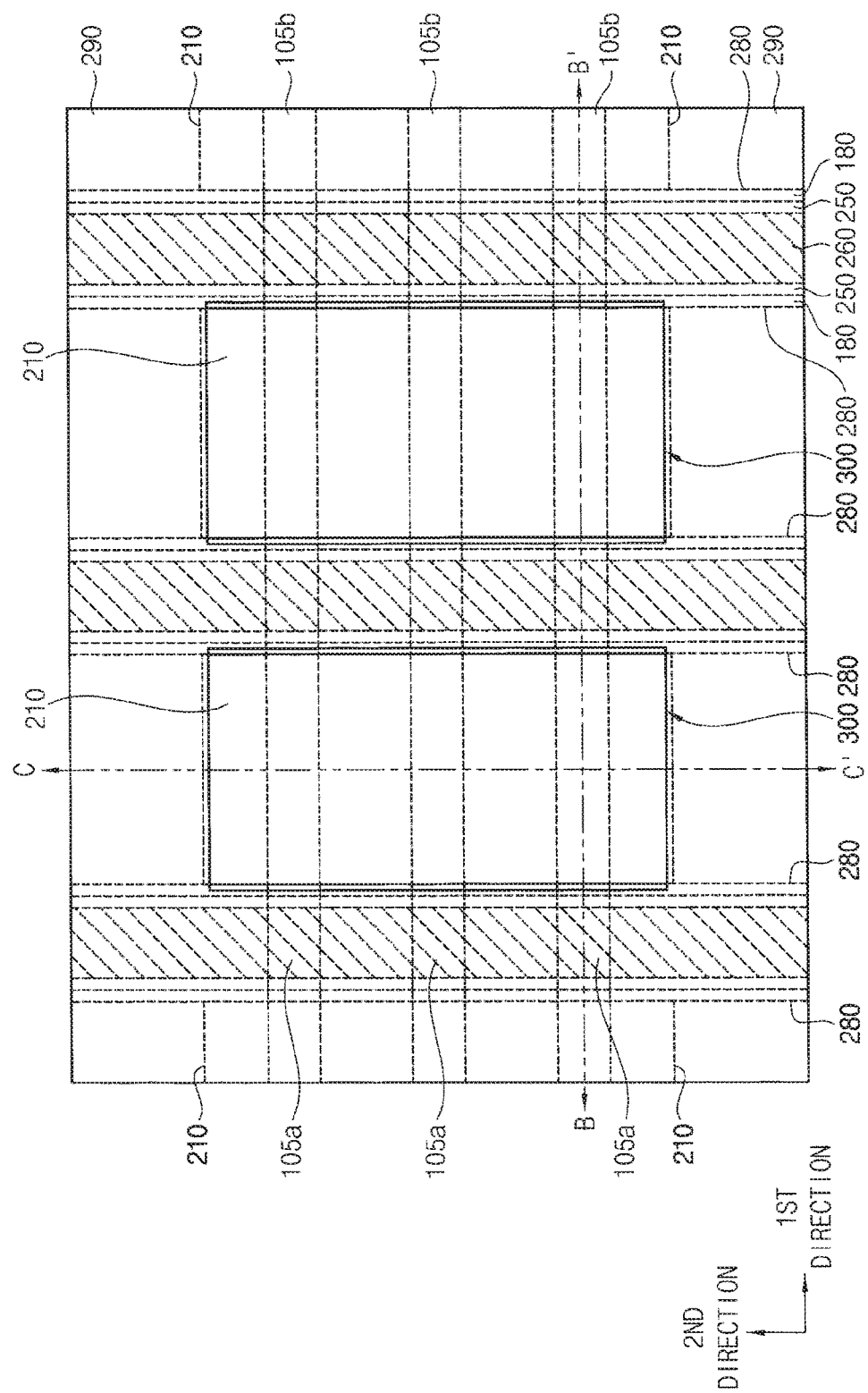
Figure 36:
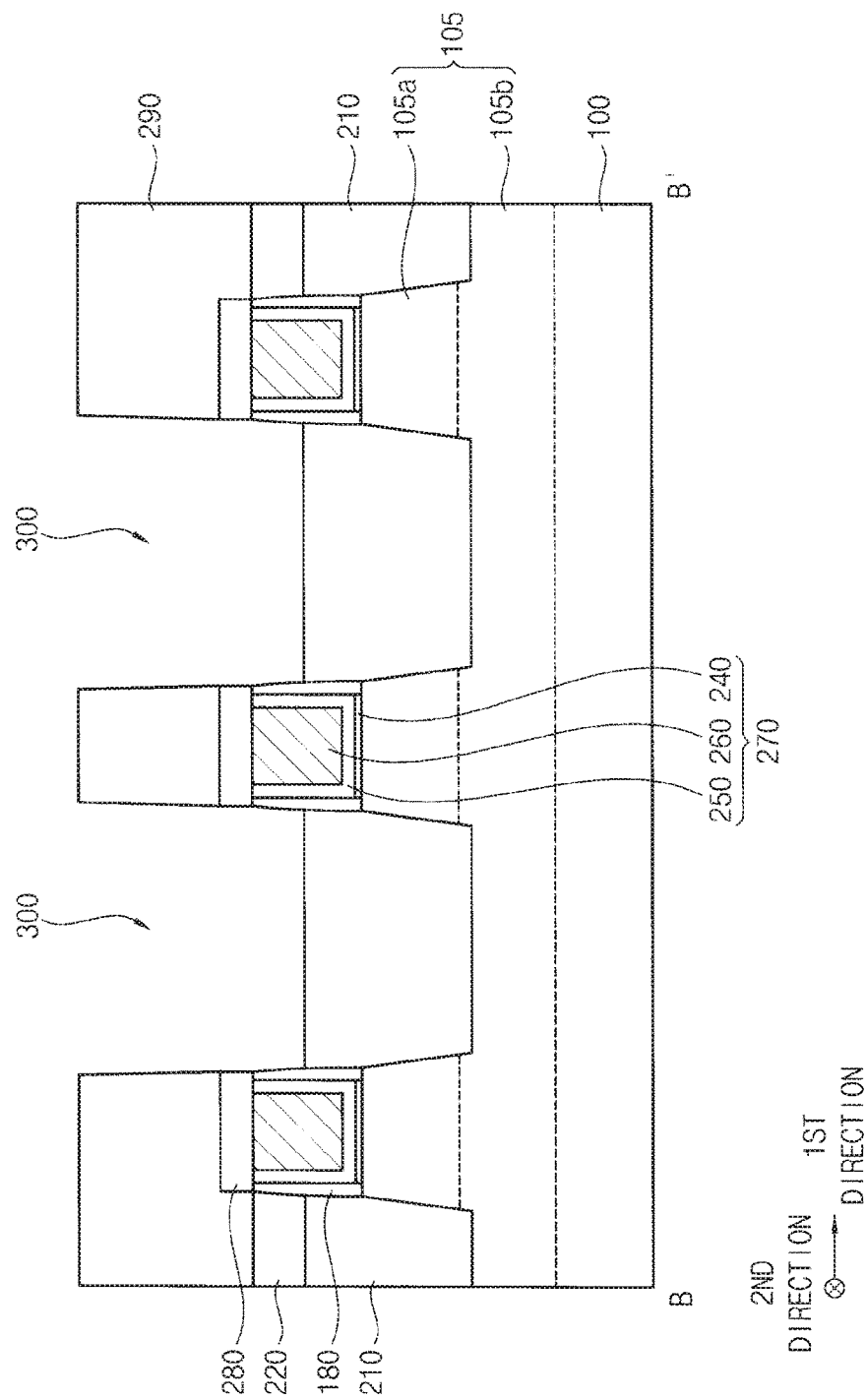
Figure 37:
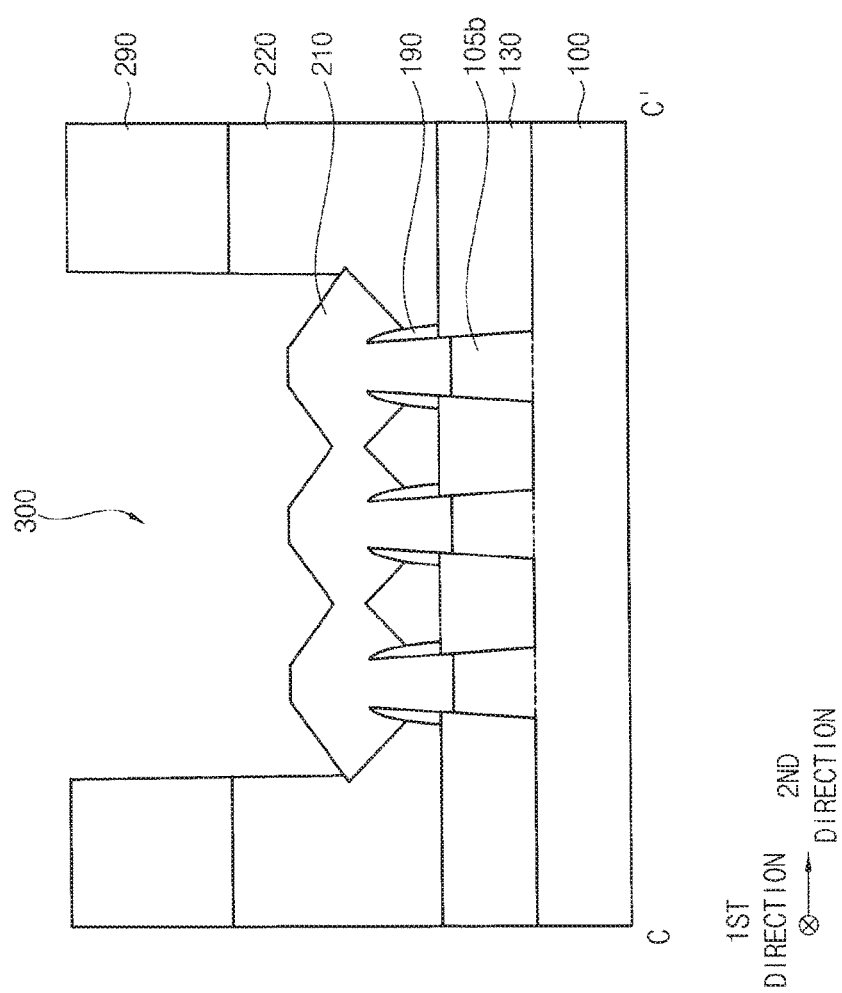

Referring to FIGS. 35 to 37, a second insulating interlayer 290 is formed on the first insulating interlayer 220 to cover the gate mask 280, and the first and second insulating interlayers 220 and 290 are partially etched to form a second opening 300 exposing an upper surface of the source/drain layer 210.

The etching process for the first and second insulating interlayers 220 and 290 may be performed by a photolithography process using a third photoresist pattern (not shown). The second insulating interlayer 290 may be formed of an oxide (e.g., silicon oxide).

In an exemplary embodiment, the second opening 300 almost entirely exposes the upper surface of the source/drain layer 210. That is, the second opening 300 exposes the entire upper surface of one of the source/drain layers 210, which is commonly formed on the first active fins 105 included in each of the first active fin groups and extend in the second direction, except for end portions of a pair of the source/drain layers 210 opposite to each other in the second direction.

In an exemplary embodiment, a plurality of second openings 300 are formed in the second direction to expose the plurality of source/drain layers 210, respectively, spaced apart from each other in the second direction. Additionally, a plurality of second openings 300 may be formed in the first direction to expose the plurality of source/drain layers 210, respectively, between the gate structures 270 disposed in the first direction. In an exemplary embodiment, the second opening 300 is formed to be self-aligned with the gate spacers 180 on the sidewalls of each of the gate structures 270 opposite to each other in the first direction. Even if the second opening 300 are not aligned with the gate spacer 180, the gate structure 270 may be protected by the gate mask 280 thereon.

Figure 38:
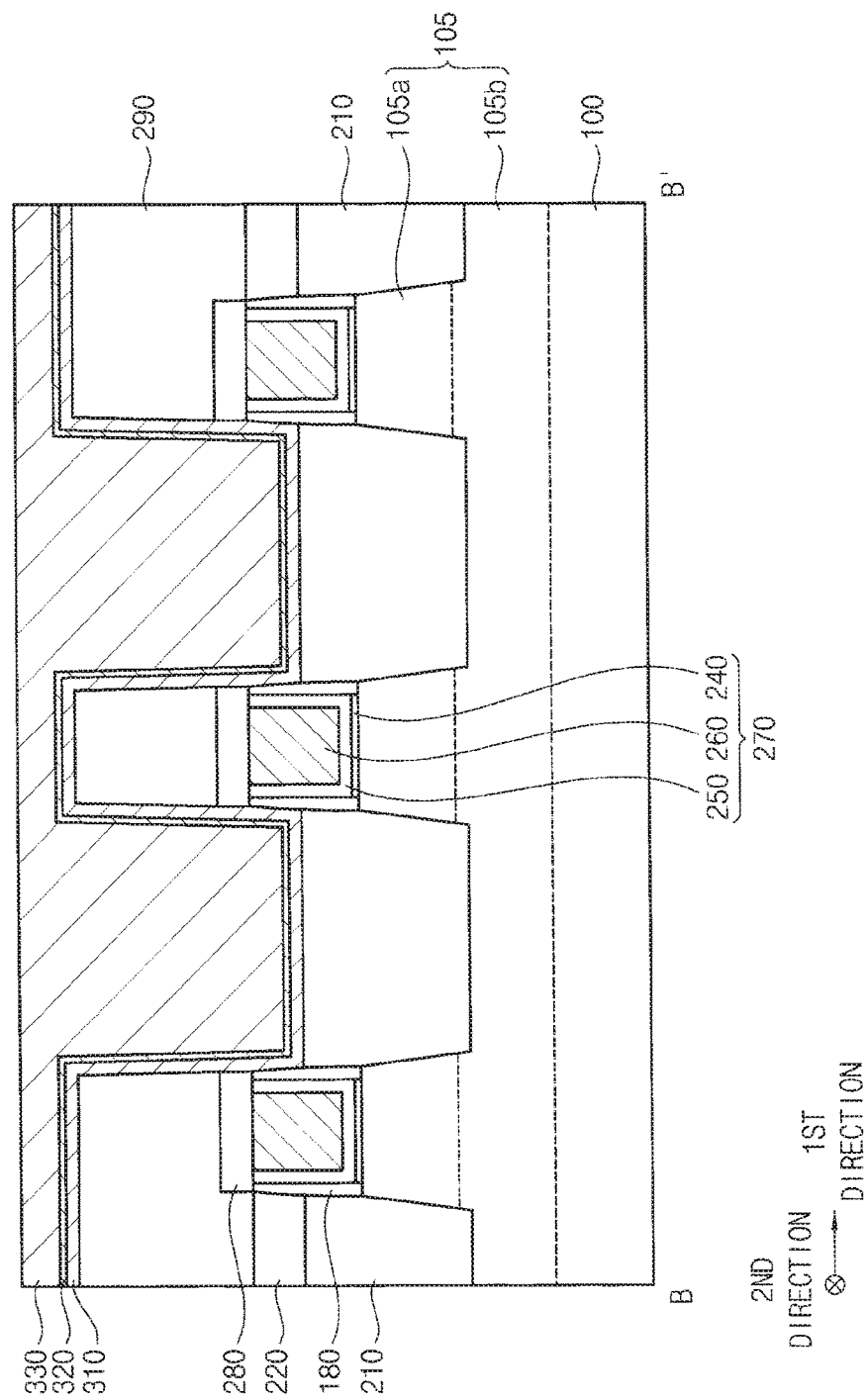
Figure 39:
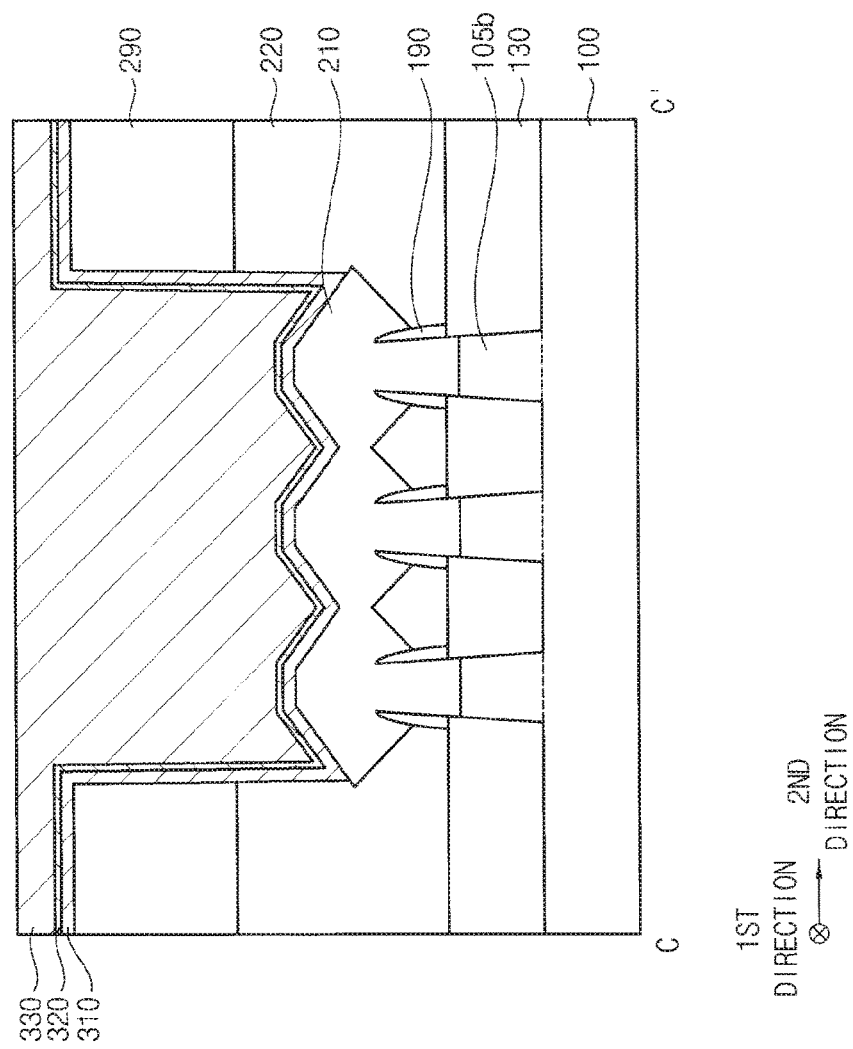

Referring to FIGS. 38 and 39, according to an exemplary embodiment, after forming a metal layer 310 on the exposed upper surface of the source/drain layer 210, a sidewall of the second opening 300, and a top surface of the second insulating interlayer 290, a first barrier layer 320 is formed on the metal layer 310, and a first conductive layer 330 is formed on the first barrier layer 320 to fill a remaining portion of the second opening 300.

Alternatively, after forming the metal layer 310, the first barrier layer 320 and the first conductive layer 330 are omitted.

The metal layer 310 may be formed of a metal (e.g., titanium, cobalt, nickel, etc.), the first barrier layer 320 may be formed of a metal nitride (e.g., titanium nitride, tantalum nitride, etc.), and the first conductive layer 330 may be formed of a metal (e.g., tungsten, aluminum, etc.).

Figure 40:
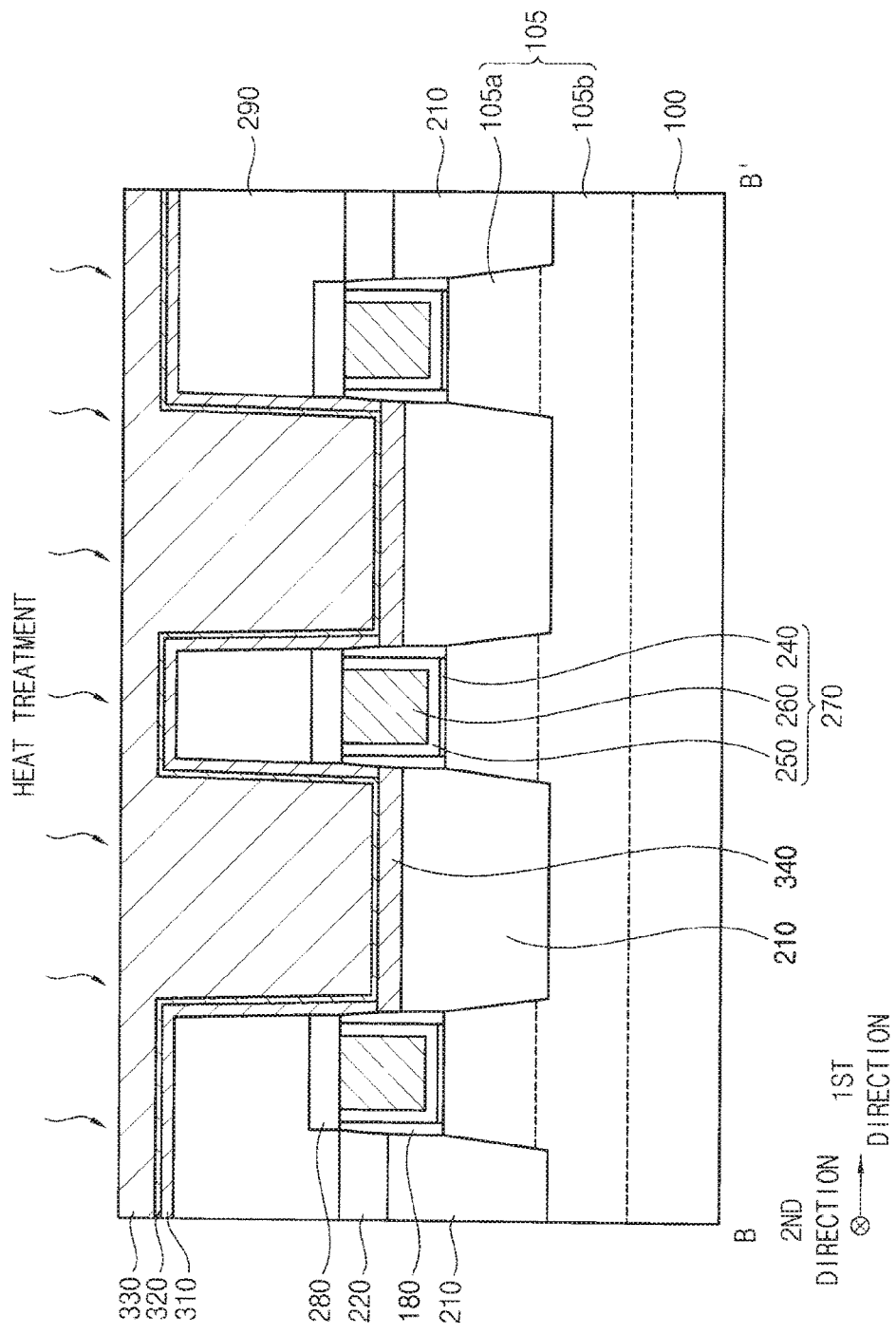
Figure 41:
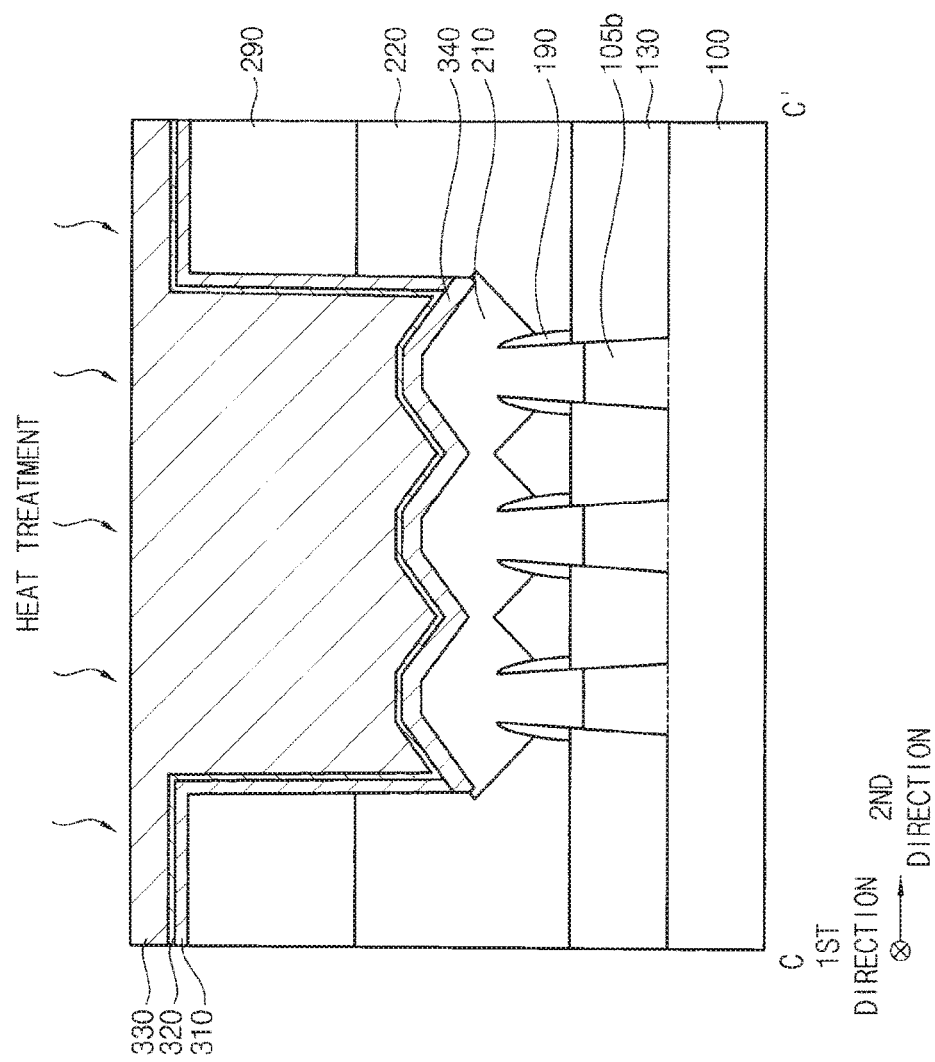

Referring to FIGS. 40 and 41, a heat treatment process is performed on the substrate 100 so that the metal layer 310 and an upper portion of the source/drain layer 210 react with each other to form a metal silicide pattern 340.

Thus, a portion of the metal layer 310 contacting the source/drain layer 210, and the upper portion of the source/drain layer 210 contacting the metal layer 310 may be transformed into the metal silicide pattern 340, and a metal layer 310 may remain on the sidewall of the second opening 300 and the top surface of the second insulating interlayer 290.

In an exemplary embodiment, the metal silicide pattern 340 is formed on the entire upper surface of the source/drain layer 210 except for the end portions thereof in the second direction. The metal silicide pattern 340 may include a metal silicide (e.g., titanium silicide, cobalt silicide, nickel silicide, etc.).

Figure 42:
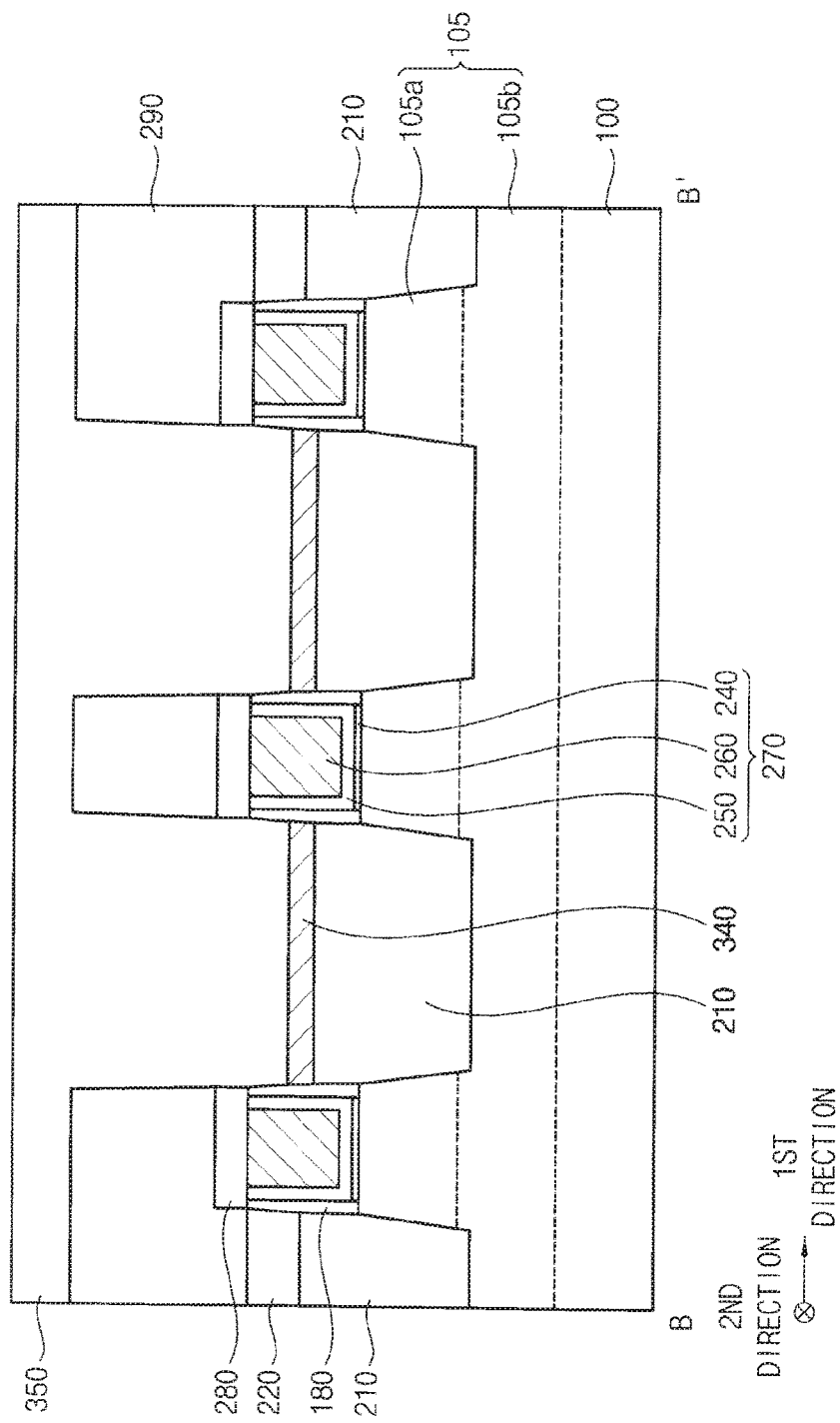
Figure 43:
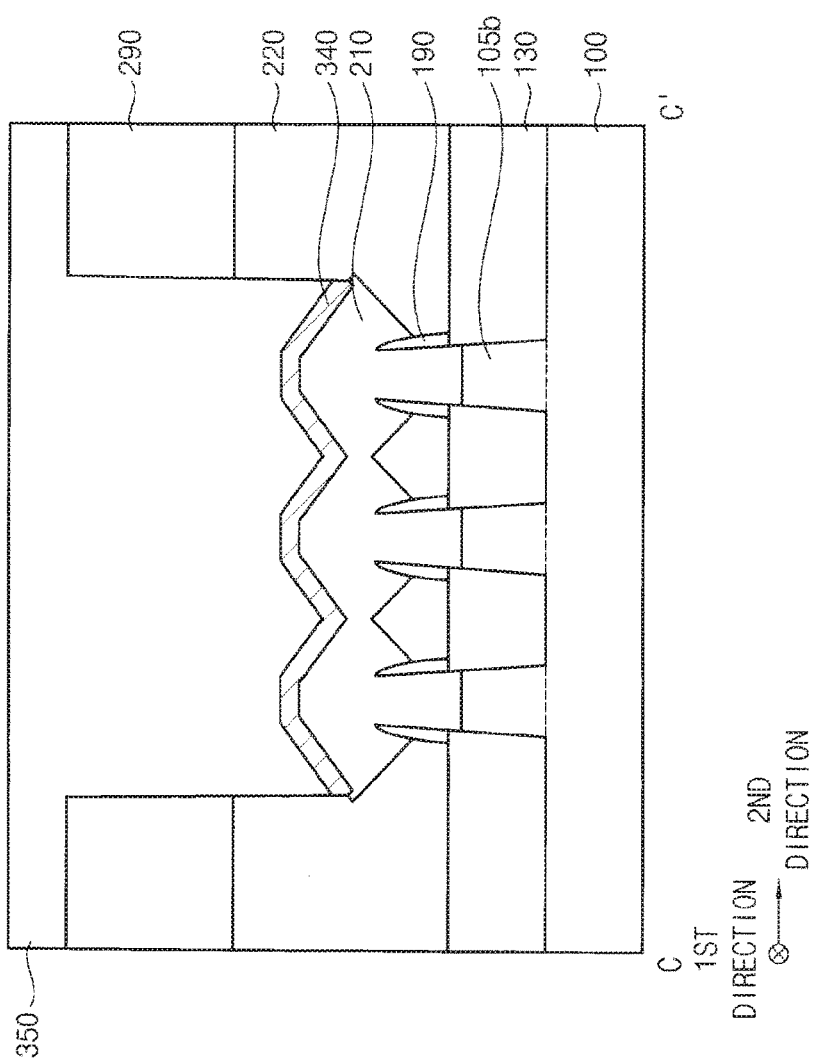

Referring to FIGS. 42 and 43, the first conductive layer 330, the first barrier layer 320 and the remaining metal layer 310 may be removed to form the second opening 300 exposing the metal silicide pattern 340 again, and an insulation layer 350 may be formed on the exposed metal silicide pattern 340 and the second insulating interlayer 290 to fill the second opening 300.

The first conductive layer 330, the first barrier layer 320 and the remaining metal layer 310 may be removed by a dry etch process or a wet etch process. In an exemplary embodiment, the first conductive layer 330 and the first barrier layer 320 are completely removed in the etching process. Alternatively, the first conductive layer 330 and the first barrier layer 320 are not completely removed in the etching process, but some portions of the first conductive layer 330 and the first barrier layer 320 remain to form a conductive pattern structure (not shown) including a first conductive pattern (not shown) and a first barrier pattern (not shown).

The insulation layer 350 may be formed of a low-k dielectric material. The insulation layer 350 may be formed of a material that has good gap-filling characteristics and can be easily planarized. The insulation layer 350 may be formed of, e.g., SLAM.

Figure 44:
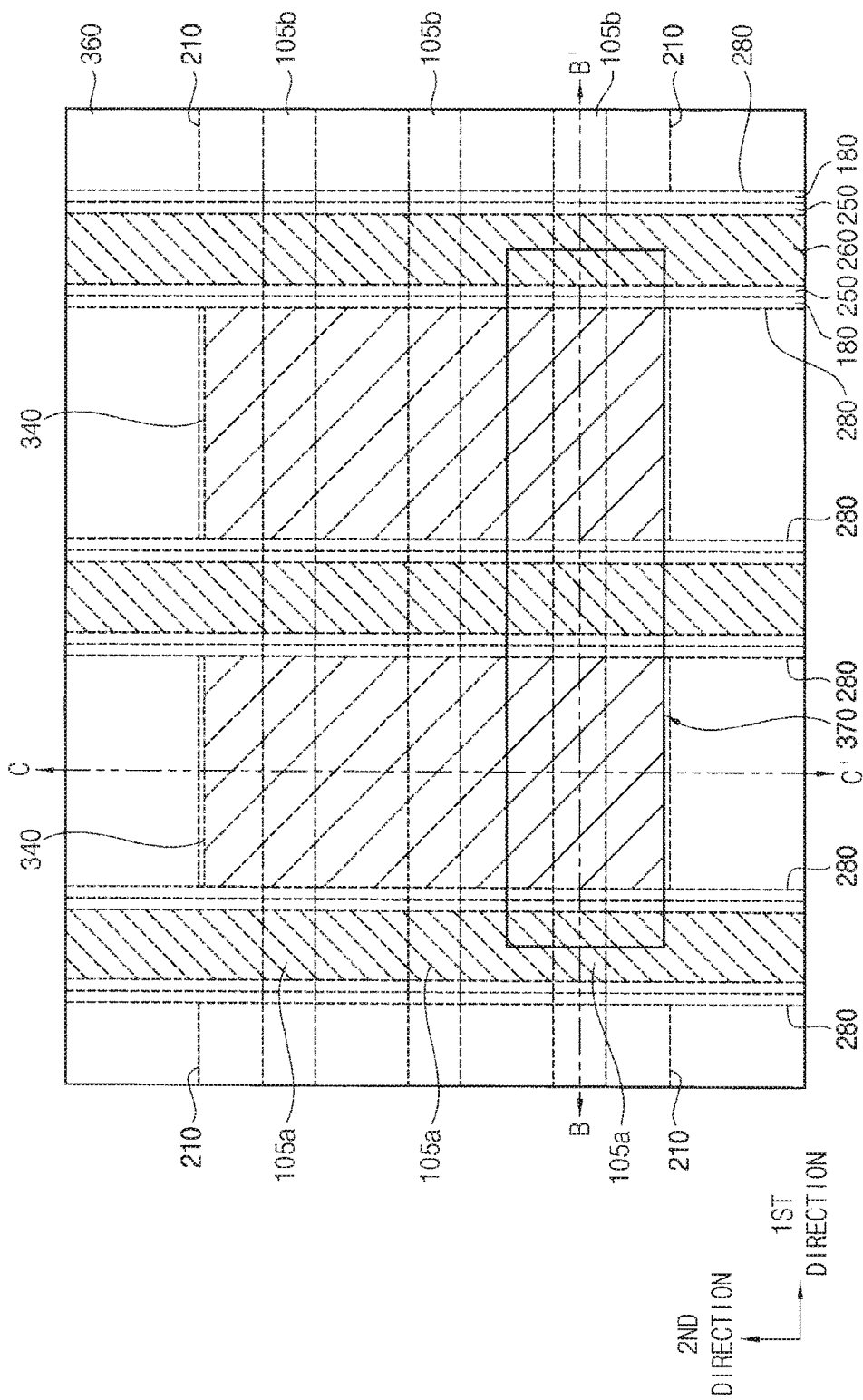
Figure 45:
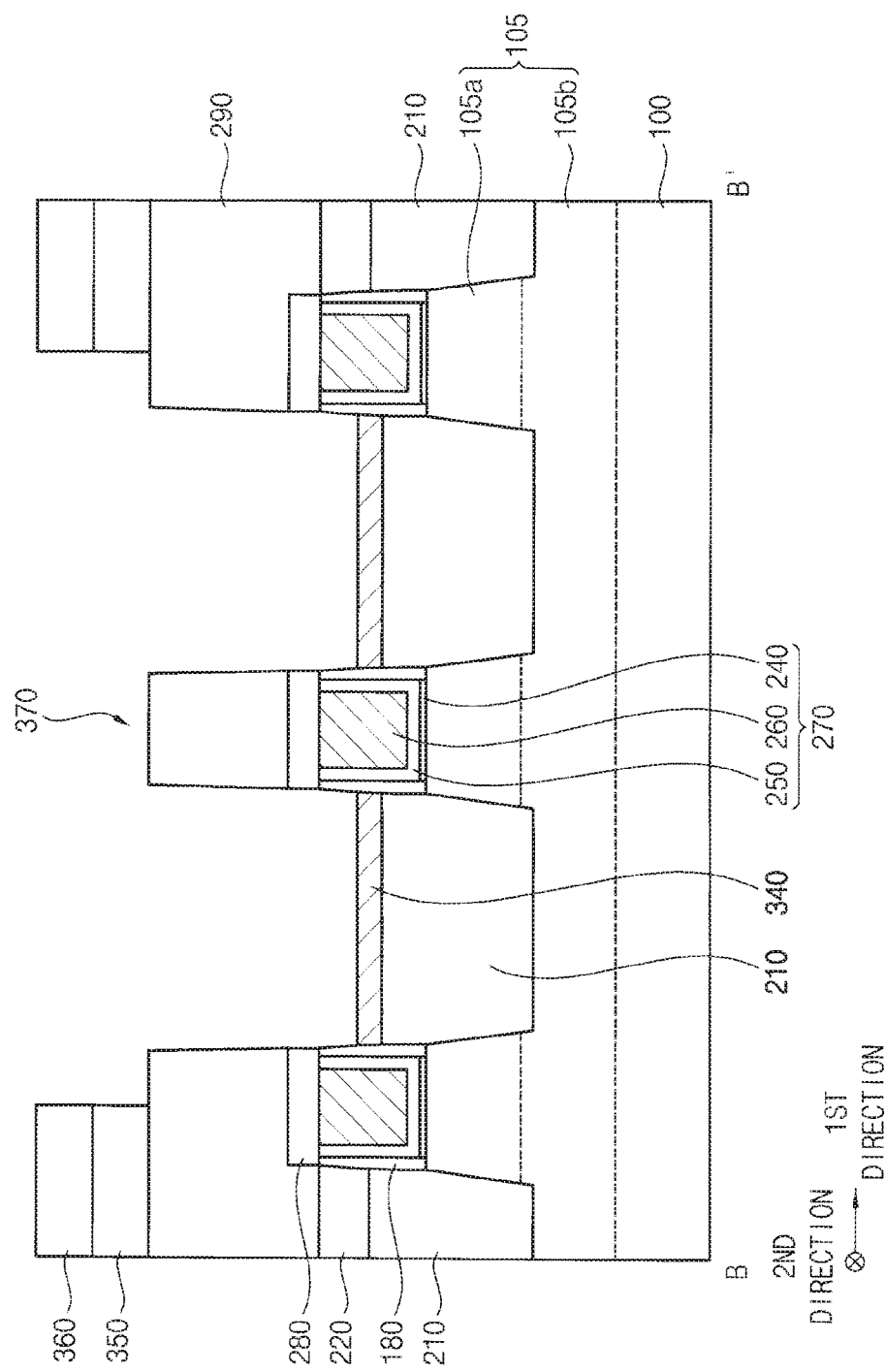
Figure 46:
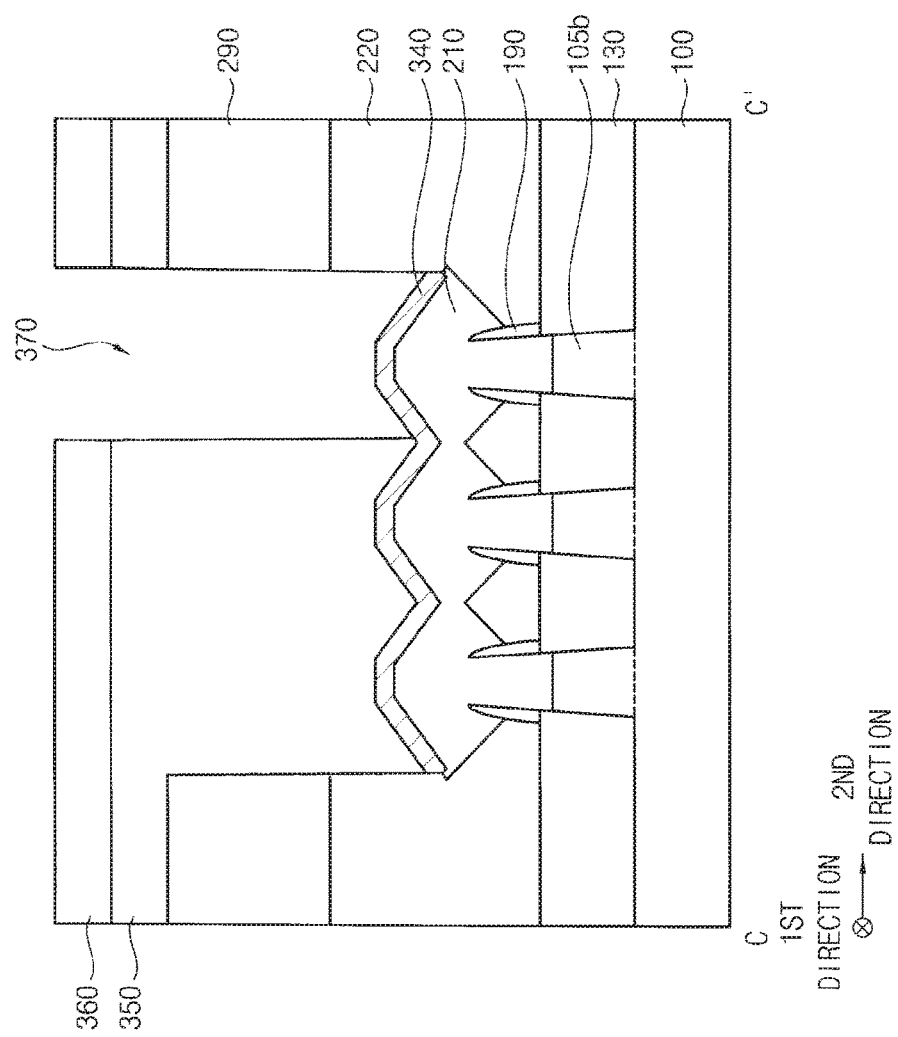
Figure 47:
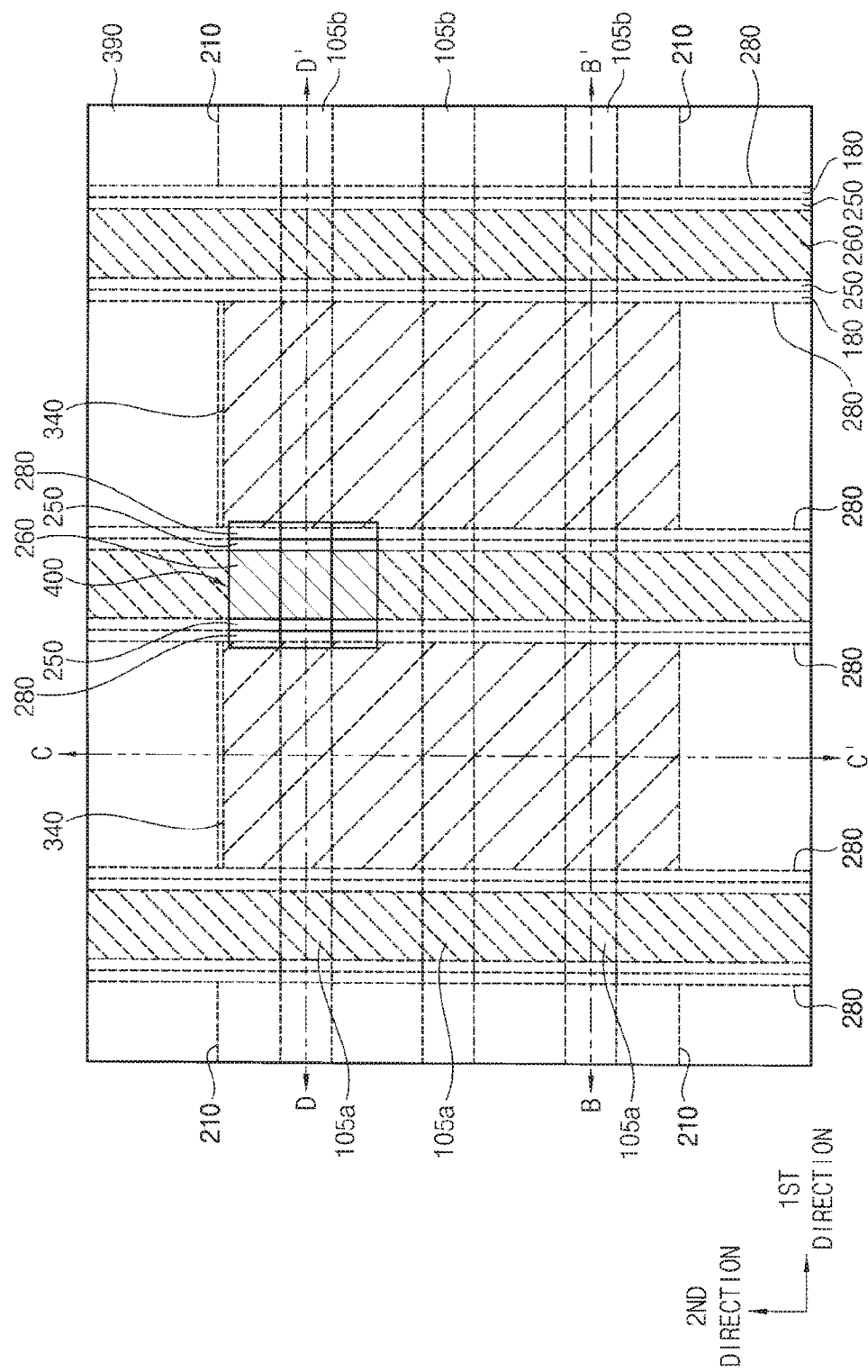
Figure 48:
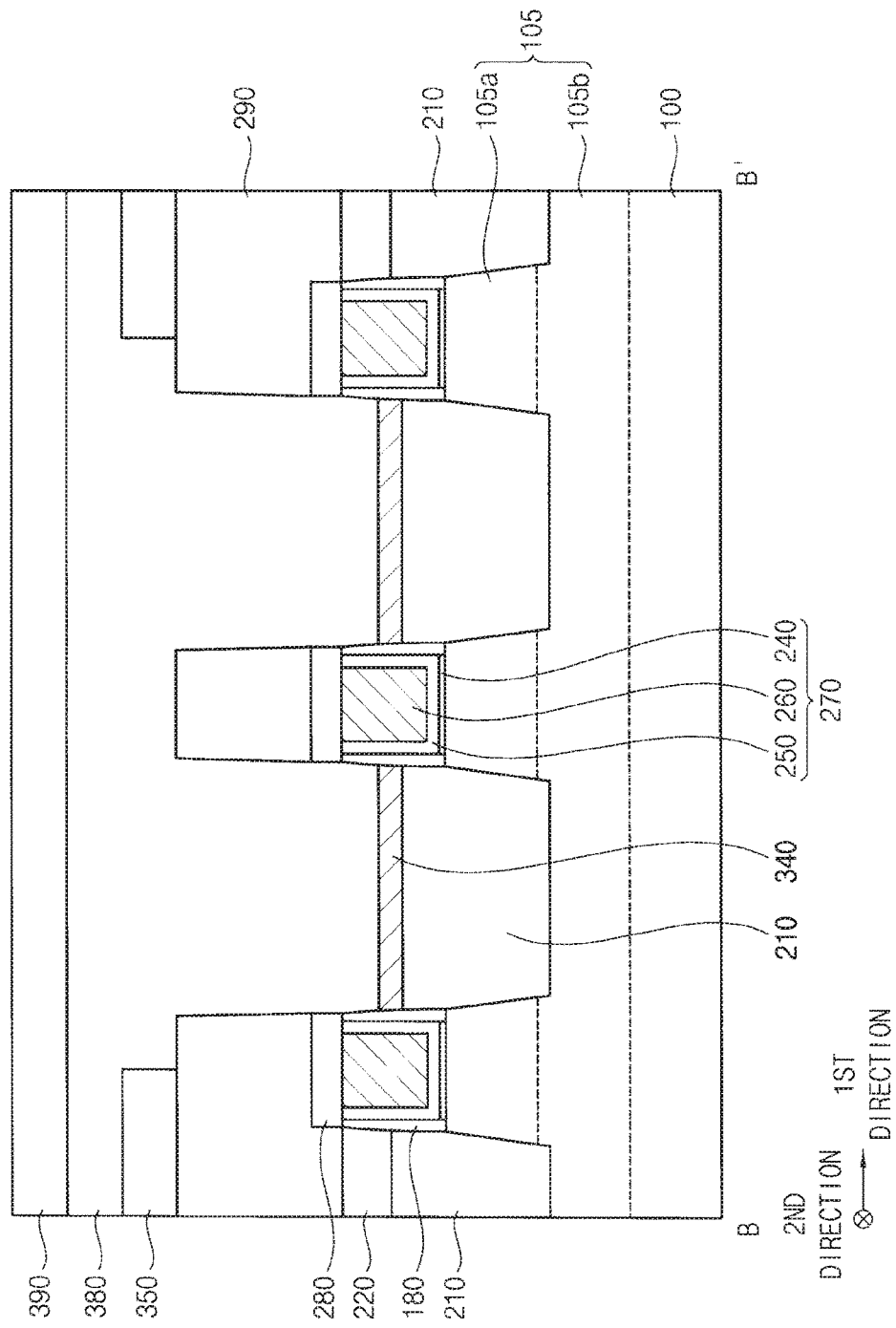
Figure 49:
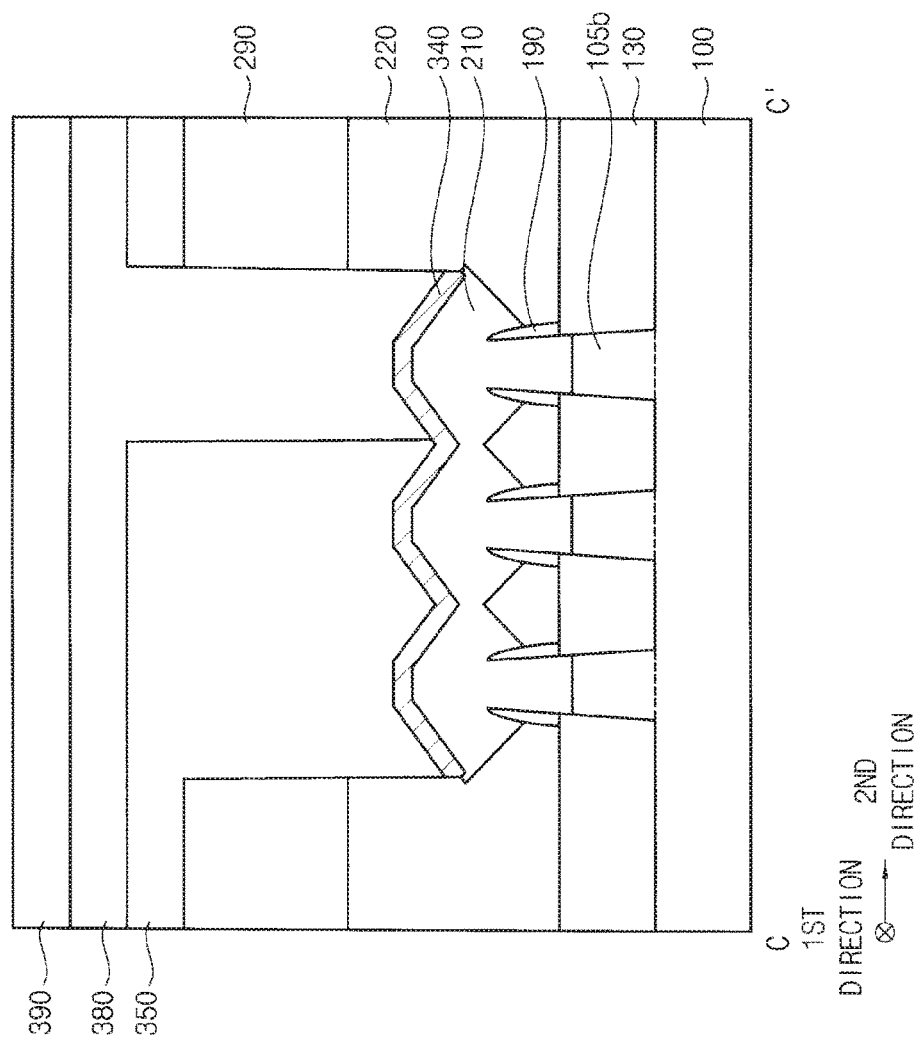

Referring to FIGS. 44 to 46, after forming a fourth photoresist pattern 360 on the insulation layer 350, the insulation layer 350 is etched using the fourth photoresist pattern 360 as an etching mask to form a third opening 370 partially exposing an upper surface of the metal silicide pattern 340.

The third opening 370 may also expose portions of a top surface and a sidewall of the second insulating interlayer 290, a sidewall of the gate mask 280, and a portion of a sidewall of the gate spacer 180.

In an embodiment, the third opening 370 does not entirely expose the upper surface of the metal silicide pattern 340, but exposes an upper surface of a portion of the metal silicide pattern 340 on one of the first active fins 105 included in each of the first active fin groups.

Referring to FIGS. 47 to 50, after removing the fourth photoresist pattern 360, a sacrificial layer 380 is formed on the exposed upper surface of the metal silicide pattern 340 and the insulation layer 350 to fill the third opening 370. A fifth photoresist pattern 390 is formed on the sacrificial layer 380, and the sacrificial layer 380, the insulation layer 350, the second insulating interlayer 290, and the gate mask 280 are partially etched using the fifth photoresist pattern 390 as an etching mask to form a fourth opening 400 exposing a portion of a top surface of the gate structure 270.

The sacrificial layer 380 may be formed of an insulation material, e.g., silicon-based spin-on-hardmask (Si—SOH) or carbon-based spin-on-hardmask (C—SOH).

In an exemplary embodiment, the fourth opening 400 does not entirely expose a top surface of the gate structure 270 adjacent the source/drain layer 210 on each of the first active fin groups, but exposes a top surface of a portion of the gate structure 270 adjacent a portion of the source/drain layer 210 on one of the first active fins 105 included in each of the first active fin groups. That is, a third opening 370 exposes an upper surface of a first portion of the metal silicide pattern 340 on one of the source/drain layers 210, and the fourth opening 400 exposes a top surface of a portion of the gate structure 270 adjacent a second portion of the metal silicide pattern 340 on one of the source/drain layers 210. The first and second portions of the metal silicide pattern 340 may be spaced apart from each other in the second direction.

Referring to FIGS. 1 to 5 again, after removing the fifth photoresist pattern 390 and the sacrificial layer 380 to form the third opening 370 again, a second barrier layer may be formed on the exposed upper surface of the metal silicide pattern 340, the exposed top surface of the gate structure 270, the sidewalls of the third and fourth openings 370 and 400, the top surface of the second insulating interlayer 290 and the top surface of the insulation layer 350, and a second conductive layer may be formed on the second barrier layer to fill remaining portions of the third and fourth openings 370 and 400.

The second conductive layer and the second barrier layer may be planarized until a top surface of the second insulating interlayer 290 is exposed to form second and first conductive contact plugs 434 and 432 to fill the third and fourth openings 370 and 400, respectively, which may contact the metal silicide pattern 340 and the gate structure 270, respectively, and the insulation layer 350 may be transformed into an insulation pattern 355.

The second barrier layer may be formed of a metal nitride (e.g., titanium nitride, tantalum nitride, etc.) and the second conductive layer may be formed of a metal (e.g., tungsten, aluminum, etc.). In an exemplary embodiment, the second barrier layer and the second conductive layer are formed of materials substantially the same as those of the first barrier 320 and the first conductive layer 330, respectively.

The first conductive contact plug 432 may include a second conductive pattern 422, and a second barrier pattern 412 covering a bottom and a sidewall of the second conductive pattern 422, and the second conductive contact plug 434 may include a third conductive pattern 424, and a third barrier pattern 414 covering a bottom and a sidewall of the third conductive pattern 424. The second conductive contact plug 434 and the insulation pattern 355 may be disposed in the second direction and contact each other to form a second contact plug structure.

In an exemplary embodiment, the first conductive contact plug 432 and the insulation pattern 355 are adjacent to each other in the first direction, and may further contact each other. However, the first and second conductive contact plugs 432 and 434 do not contact each other, and are thus spaced apart from each other. That is, the second conductive contact plug 434 may contact the upper surface of the first portion of the metal silicide pattern 340 on a first source/drain layer among the source/drain layers 210, and the first conductive contact plug 432 may contact the top surface of the gate structure 270 adjacent the second portion of the metal silicide pattern 340 on the first source/drain layer among the source/drain layers 210. The first and second portions of the metal silicide pattern 340 are spaced apart from each other in the second direction, and thus the first and second conductive contact plugs 432 and 434 do not contact each other, but are spaced apart from each other in the second direction.

By the above processes, the semiconductor device may be manufactured.

In the method of manufacturing the semiconductor device, the second opening 300 may be formed to entirely expose the upper surface of the source/drain layer 210 commonly on the first active fins 105 included in each of the first active fin groups, and the upper portion of the source/drain layer 210 exposed by the second opening 300 may be silicidated. Thus, the metal silicide pattern 340 may be formed on the entire upper surface of the source/drain layer 210 to realize a low contact resistance.

Additionally, after forming the insulation layer 350 on the metal silicide pattern 340 to fill the second opening 300, the insulation layer 350 may be partially removed to form the third opening 370 partially exposing the upper surface of the metal silicide pattern 340 and the fourth opening 400 partially exposing the top surface of the gate structure 270, and the second and first conductive contact plugs 434 and 432 may be formed to fill the third and fourth openings 370 and 400, respectively. Thus, the first and second conductive contact plugs 432 and 434, which cannot be electrically shorted with each other and contact the gate structure 270 and the metal silicide pattern 340, respectively, are formed to overlap a region in which one of the first active fin groups is formed. The first and second conductive contact plugs 432 and 434 are not formed on a space between neighboring ones of the first active fin groups spaced apart from each other in the second direction, so as to enhance the integration degree of the semiconductor device.

Figure 51:
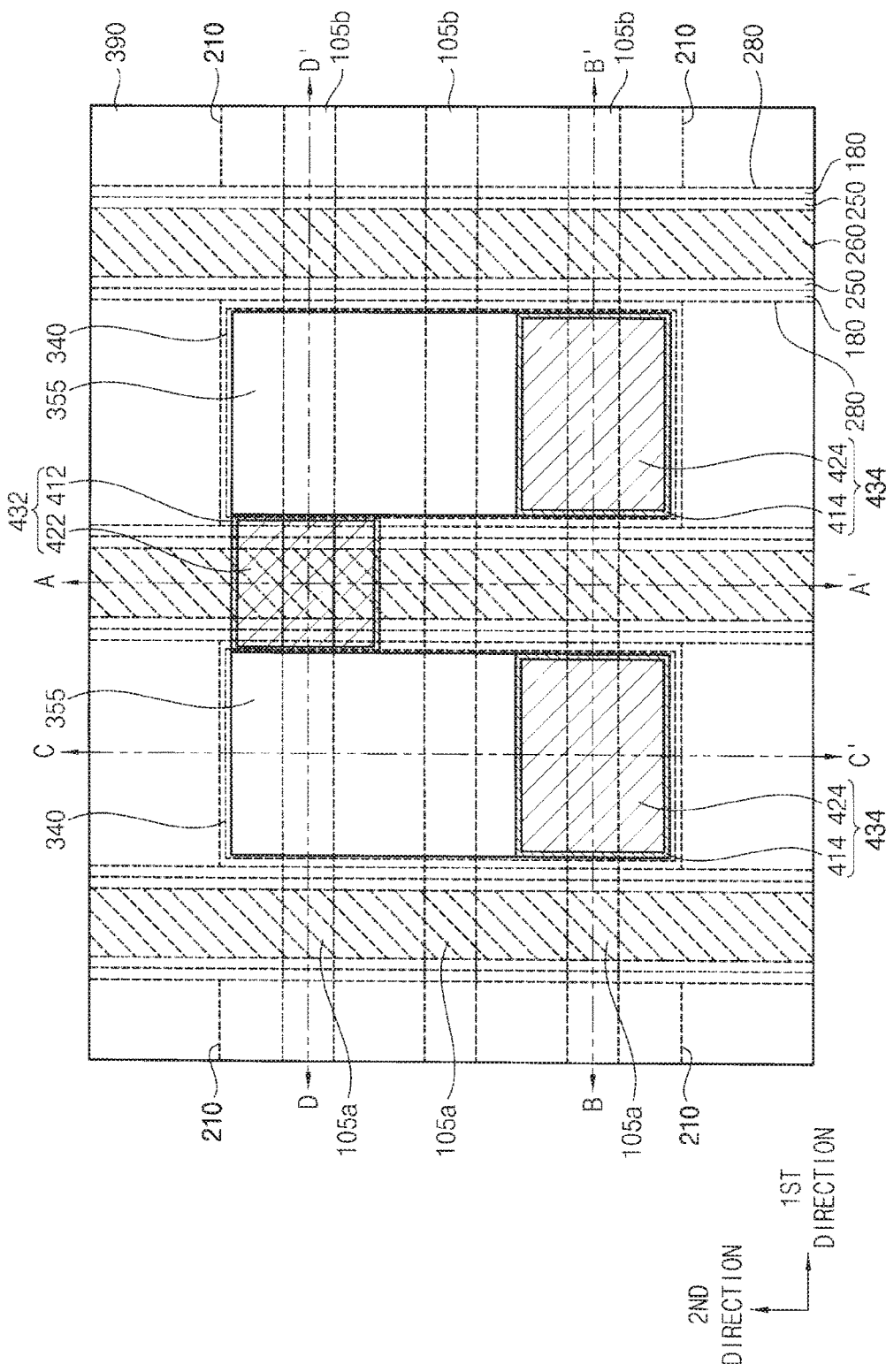
FIGS. 51 to 55 are plan views and cross-sectional views illustrating a semiconductor device in accordance with exemplary embodiments of the inventive concept.

FIGS. 51 to 55 are plan views and cross-sectional views illustrating a semiconductor device in accordance with exemplary embodiments of the inventive concept. Particularly, FIG. 51 is a plan view illustrating the semiconductor device, and FIGS. 52 to 55 are cross-sectional views illustrating the semiconductor device.

Figure 52:
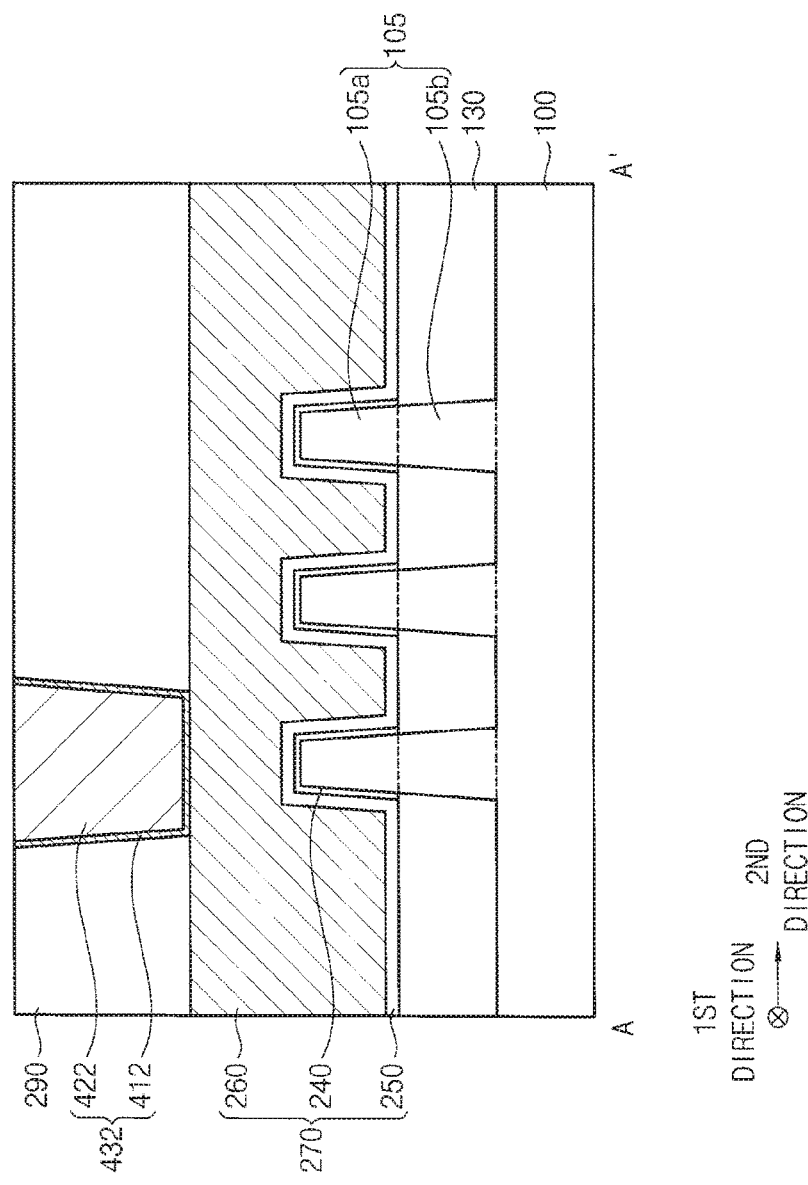
Figure 53:
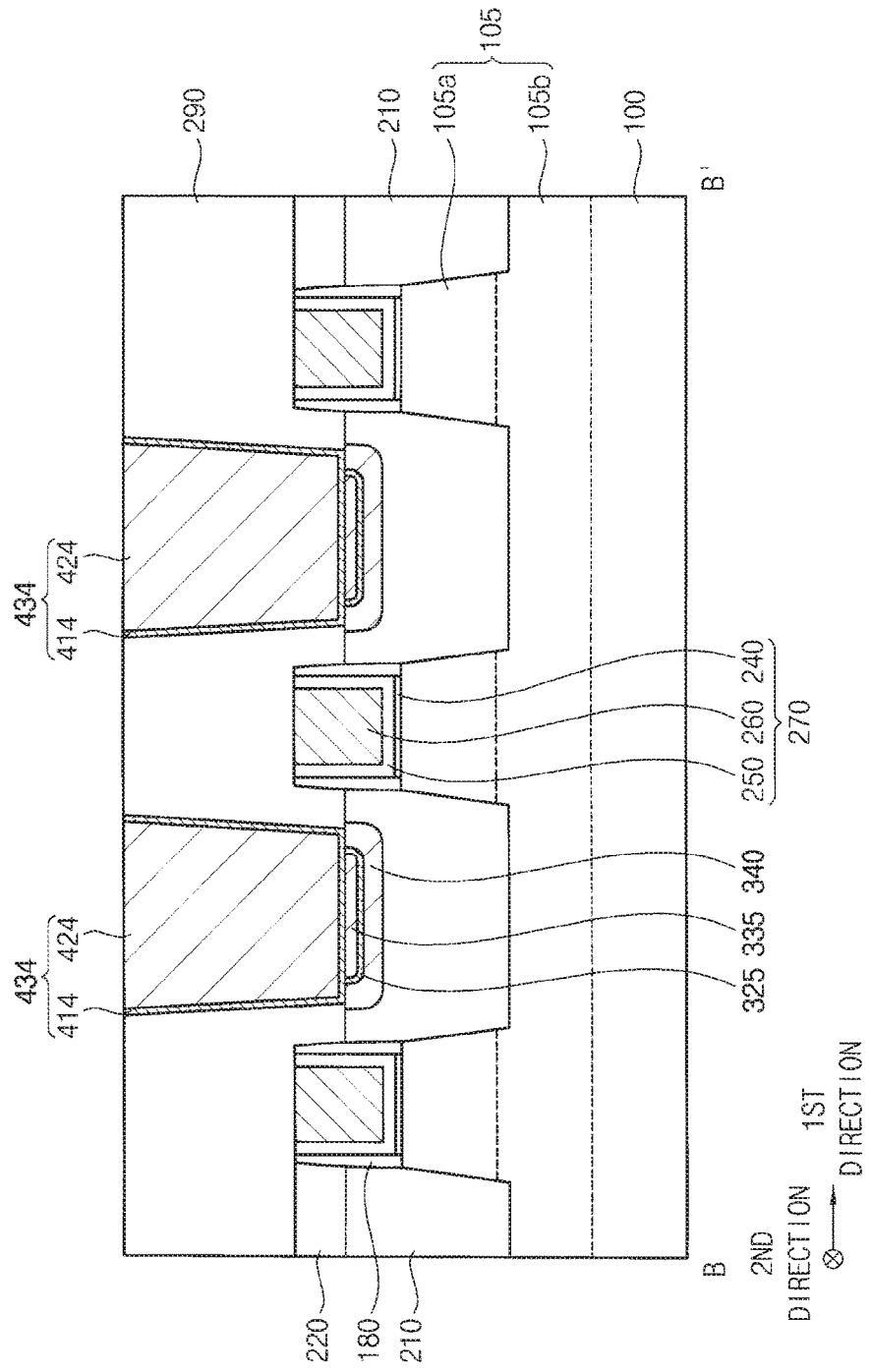
Figure 54:
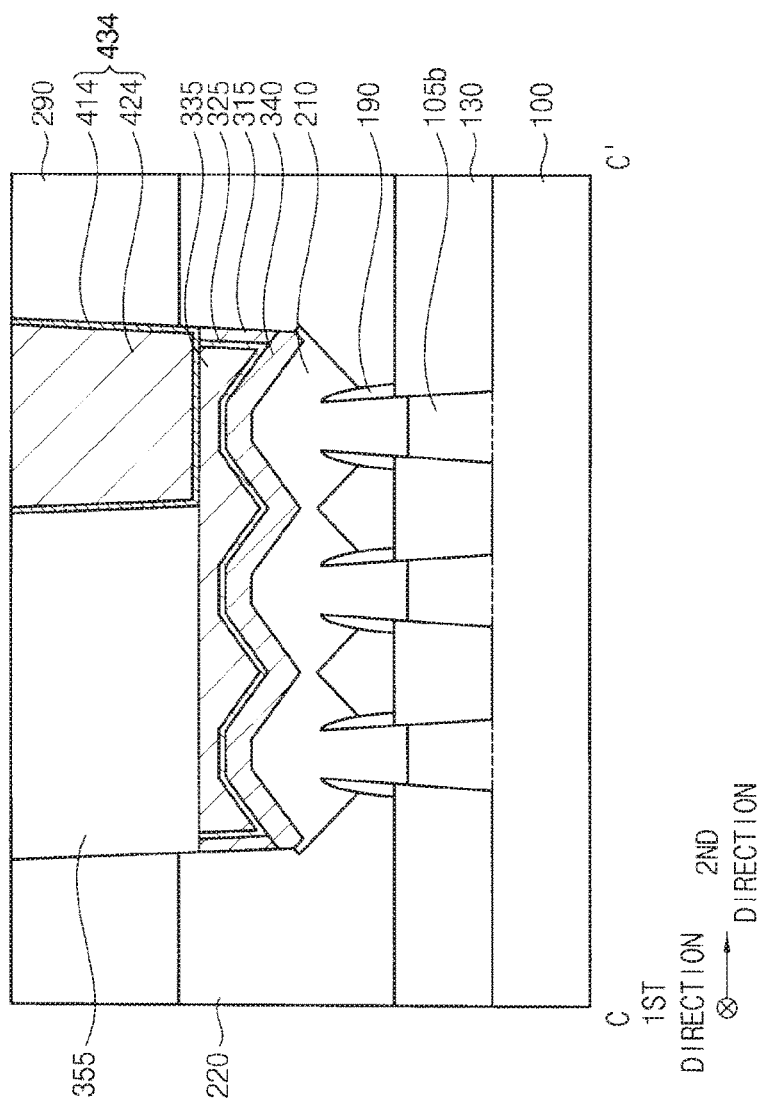
Figure 55:
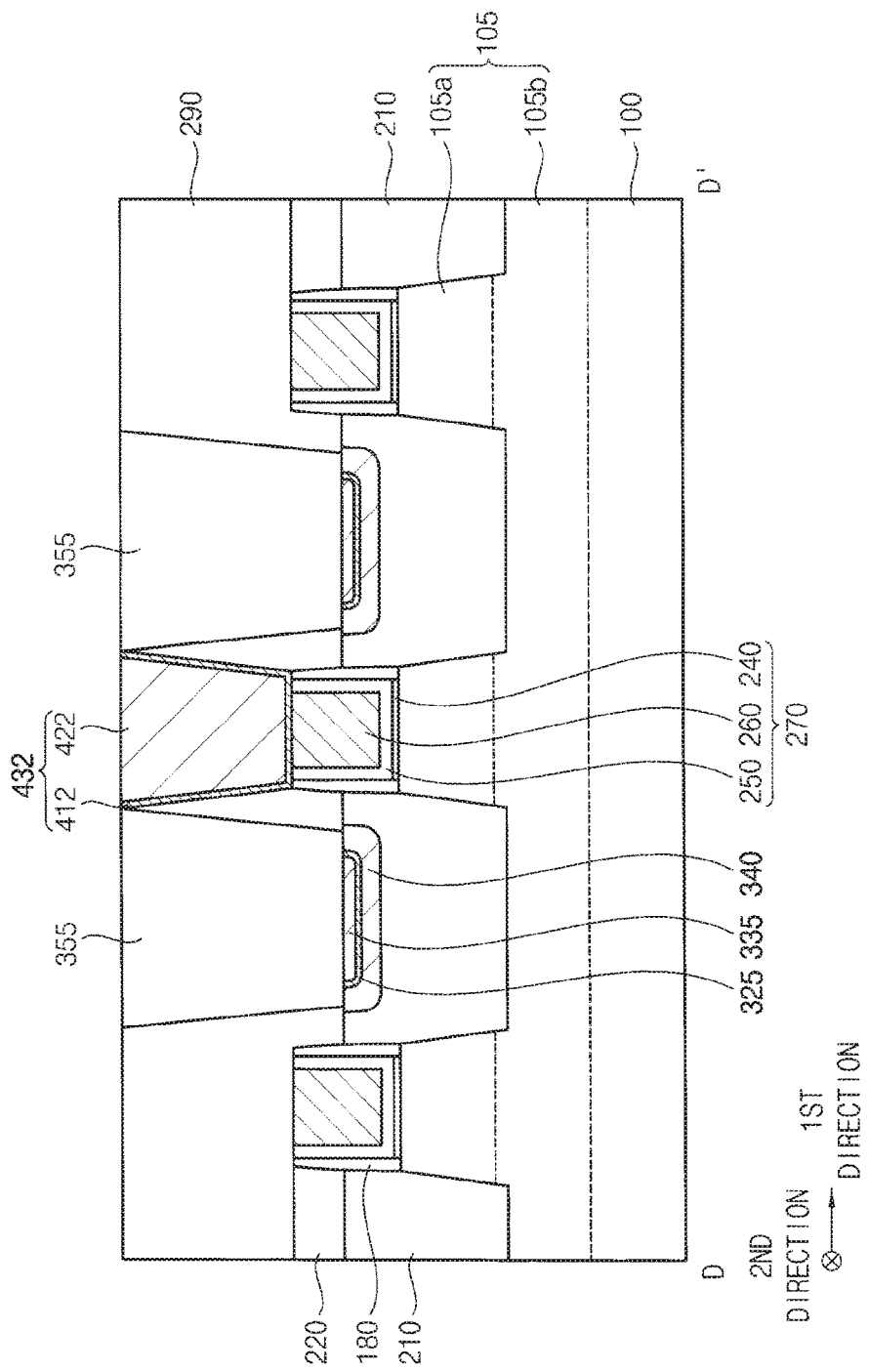

FIG. 52 is a cross-sectional view taken along a line A-A' of FIG. 51, FIG. 53 is a cross-sectional view taken along a line B-B' of FIG. 51, FIG. 54 is a cross-sectional view taken along a line C-C' of FIG. 51, and FIG. 55 is a cross-sectional view taken along a line D-D' of FIG. 51.

The semiconductor device may be substantially the same as that of FIGS. 1 to 5 except for the gate mask, the metal silicide pattern, the conductive pattern structure, the first conductive contact plug and the second conductive plug structure. Thus, like reference numerals refer to like elements, and detailed descriptions thereon are omitted herein.

Referring to FIGS. 51 to 55, the semiconductor device includes the gate structure 270, the source/drain layer 210, the first conductive contact plug 432, the second contact plug structure, and a conductive pattern structure disposed on the substrate 100. The semiconductor device may further include the active fin 105, the gate spacer 180, the fin spacer 190, a metal pattern 315, the metal silicide pattern 340, and the first and second insulating interlayers 220 and 290.

Unlike the semiconductor device illustrated with reference to FIGS. 1 to 5, the semiconductor device shown in FIGS. 51 to 55 has no gate mask. However, the inventive concept is not limited thereto, as certain embodiments include the gate mask.

The metal silicide pattern 340 is formed on a bottom and a sidewall of a second recess (not shown) on an upper portion of the source/drain layer 210, and thus has a cross-section taken along the first direction that is upwardly concave. The metal silicide pattern 340 may be formed on the entire upper surface of the source/drain layer 210 except for end portions of the source/drain layer 210 in each of the first and second directions.

The conductive pattern structure may be formed on the metal silicide pattern 340 having the concave shape, and a bottom and a sidewall of the conductive pattern structure may be covered by the metal silicide pattern 340. In an exemplary embodiment, a top surface of the conductive pattern structure is substantially coplanar with a top surface of the metal silicide pattern 340, and is also substantially coplanar with a top surface of the source/drain layer 210 at which no metal silicide pattern is formed.

In an exemplary embodiment, the conductive pattern structure includes a first barrier pattern 325, and a first conductive pattern 335 of which a bottom and a sidewall are covered by the first barrier pattern 325. The first barrier pattern 325 may include a metal nitride (e.g., titanium nitride, tantalum nitride, etc.) and the first conductive pattern 335 may include a metal (e.g., tungsten, aluminum, etc.)

The metal pattern 315 may remain on the end portions of the source/drain layer 210 in the second direction. In an exemplary embodiment, a top surface of the metal pattern 315 is substantially coplanar with a top surface of the conductive pattern structure. The metal pattern 315 may include a metal (e.g., titanium, cobalt, nickel, etc.).

The first conductive contact plug 432 may penetrate through the second insulating interlayer 290, and contact a top surface of the gate structure 270. The first conductive contact plug 432 may contact a top surface of the gate spacer 180, however, the inventive concept is not limited thereto.

In an embodiment, the second contact plug structure includes the second conductive contact plug 434 and the insulation pattern 355, which may be disposed in the second direction and contact each other. The second contact plug structure may penetrate through the first and second insulating interlayers 220 and 290, and may contact a top surface of the conductive pattern structure and an upper surface of the metal silicide pattern 340. In an exemplary embodiment, the second contact plug structure does not contact the outer sidewall of the gate spacer 180.

In an exemplary embodiment, the first conductive contact plug 432 and the insulation pattern 355 are adjacent to each other in the first direction, but do not contact each other. The first and second conductive contact plugs 432 and 434 do not contact each other, and are thus spaced apart from each other.

Like the semiconductor device illustrated with reference to FIGS. 1 to 5, in an embodiment, the second conductive contact plug 434 contacts an upper surface of a first portion of the metal silicide pattern 340 and the conductive pattern structure on a first source/drain layer 210 among the source/drain layers 210, and the first conductive contact plug 432 contacts a top surface of the gate structure 270 adjacent a second portion of the metal silicide pattern 340 and the conductive pattern structure on the first source/drain layer 210 among the source/drain layers 210. The first and second portions of the metal silicide pattern 340 may be spaced apart from each other in the second direction, and thus the first and second conductive contact plugs 432 and 434 do not contact each other, but are spaced apart from each other in the second direction.

Like the semiconductor device illustrated with reference to FIGS. 1 to 5, the semiconductor device includes the metal silicide pattern 340, which may be formed on the entire upper surface of the source/drain layer 210 except for both end portions of the upper surface of the source/drain layer 210 in the second direction that is commonly formed on the first active fins 105 included in each of the first active fin groups. Thus, the contact resistance between the metal silicide pattern 340 and the conductive pattern structure, and the first and second conductive contact plugs 432 and 434 may be lowered. The first and second conductive contact plugs 432 and 434 are formed to overlap a region in which one of the first active fin groups is formed, and is not formed on a region between neighboring ones of the first active fin groups spaced apart from each other in the second direction. Accordingly, the semiconductor device may have an enhanced integration degree.

Figure 56:
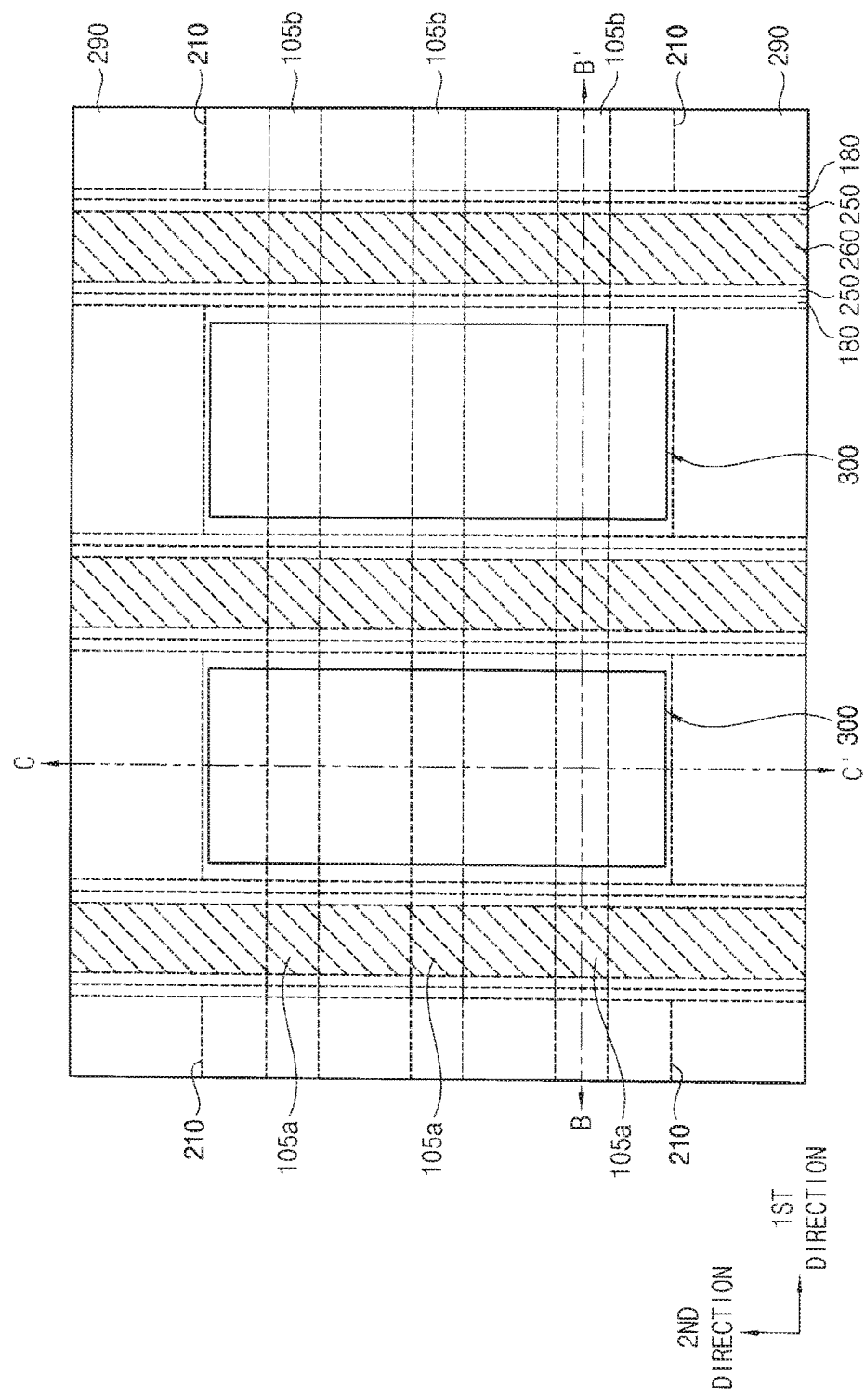
FIGS. 56 to 62 are plan views and cross-sectional views illustrating stages of a method of manufacturing a semiconductor device in accordance with exemplary embodiments of the inventive concept.

FIGS. 56 to 62 are plan views and cross-sectional views illustrating stages of a method of manufacturing a semiconductor device in accordance with exemplary embodiments of the inventive concept. Particularly, FIG. 56 is a plan view, and FIGS. 57 to 62 are cross-sectional views.

Figure 57:
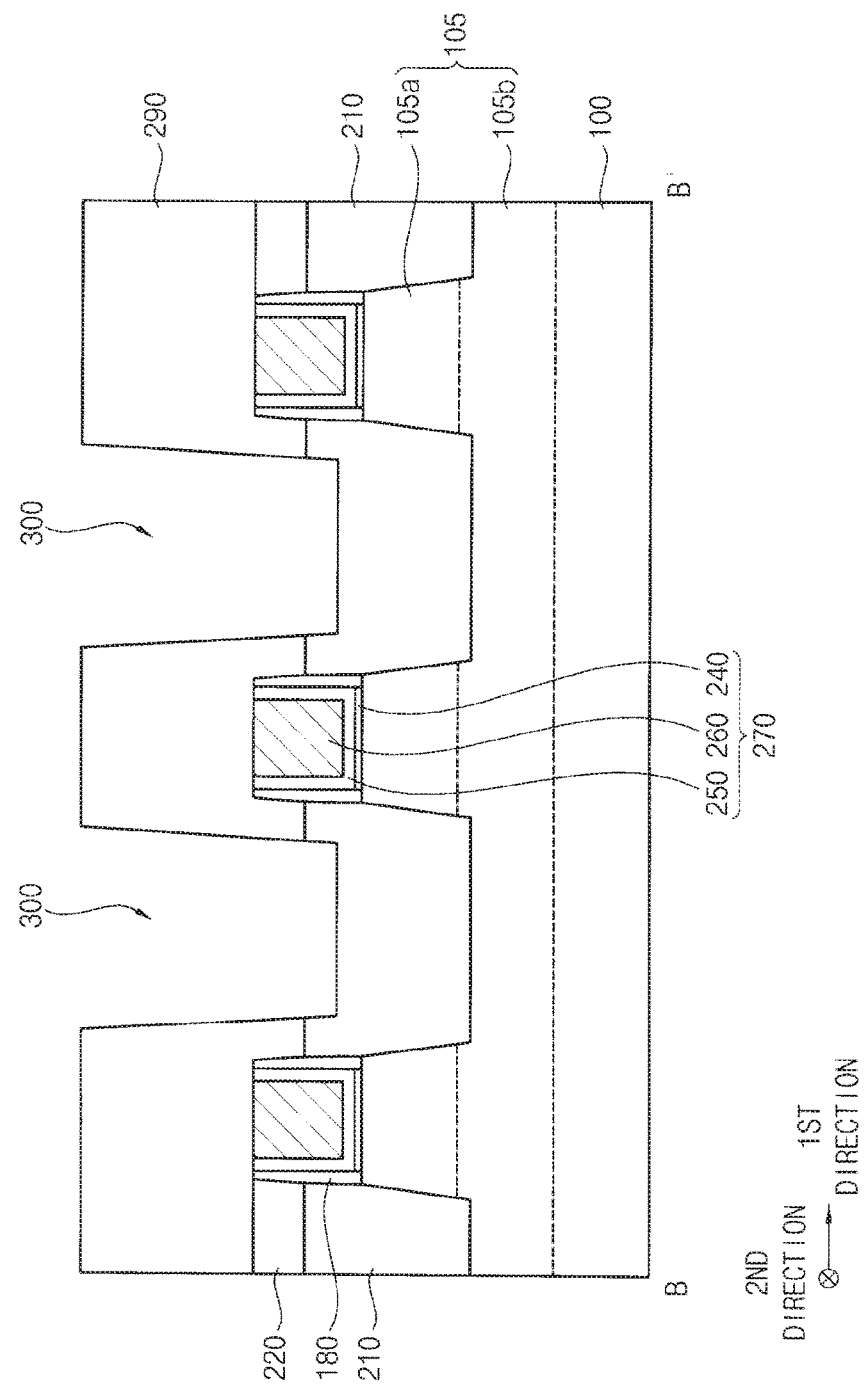
Figure 58:
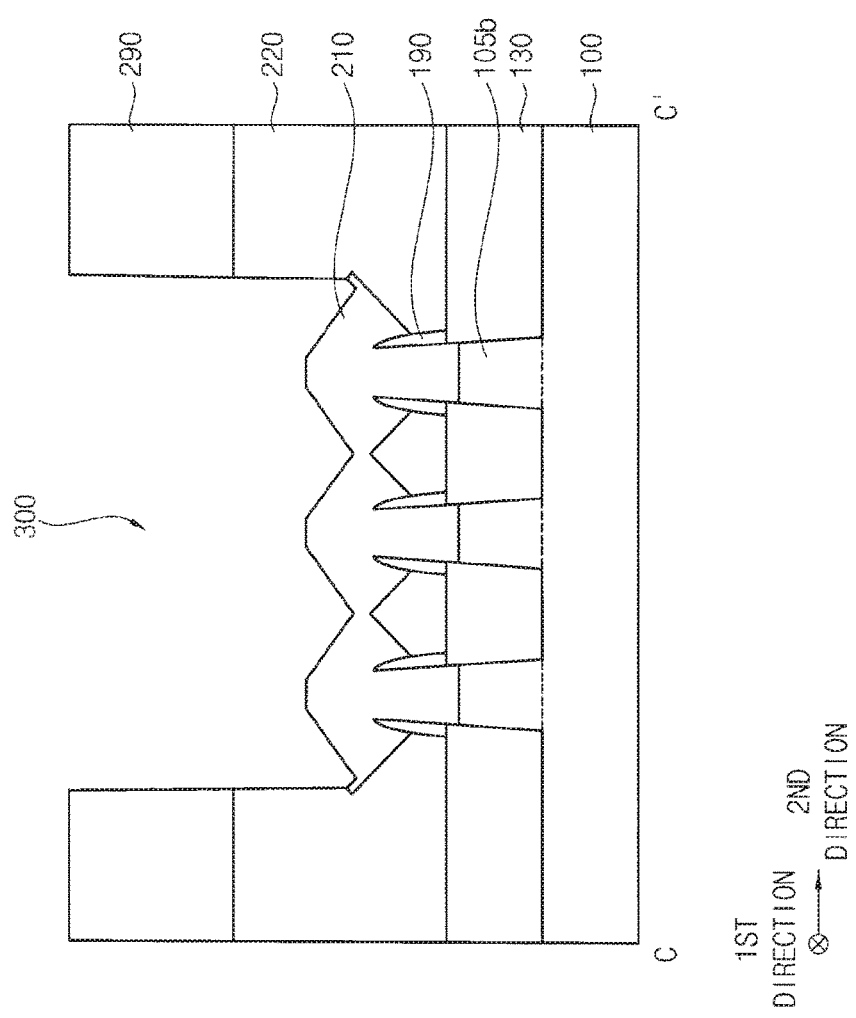
Figure 59:
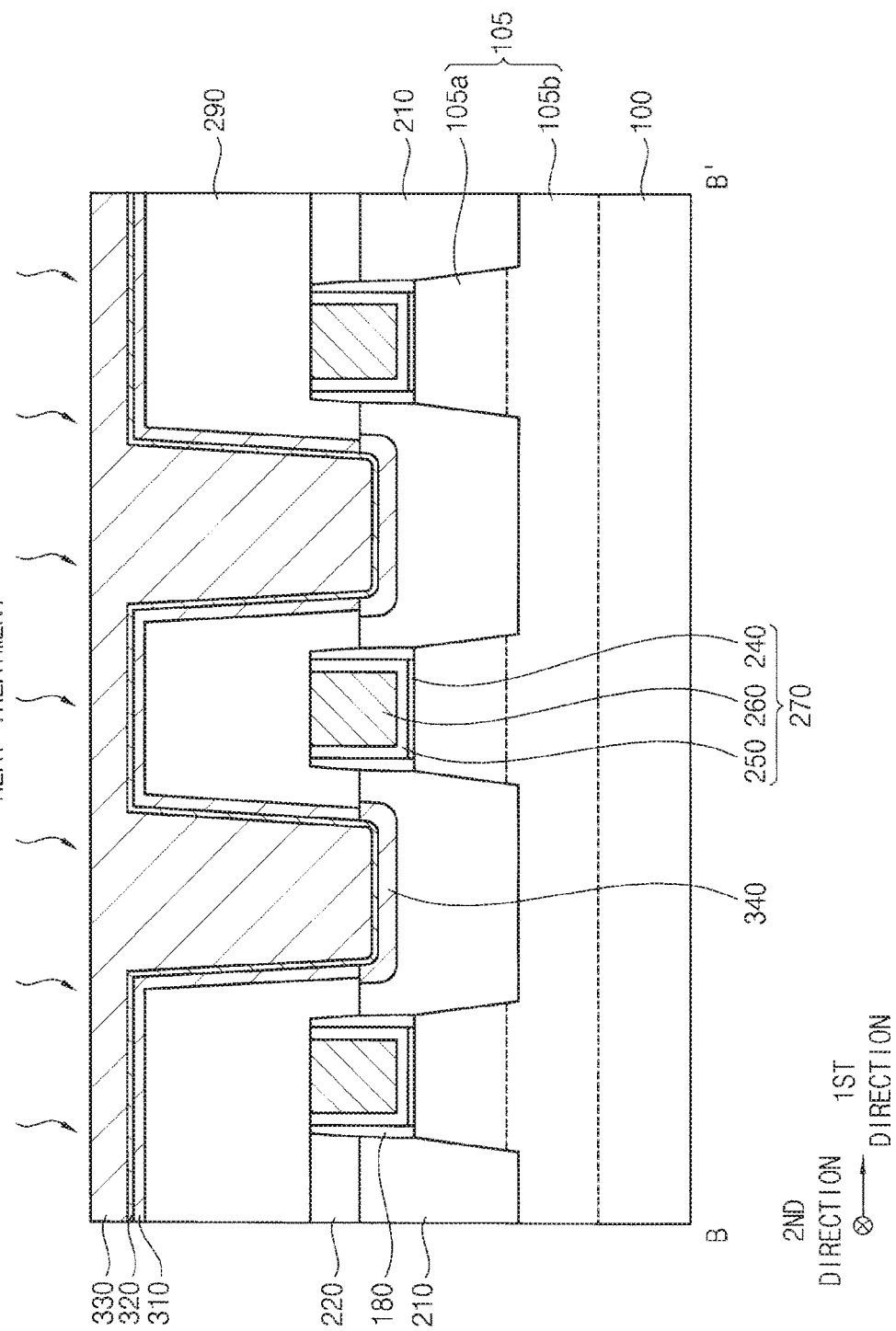
Figure 60:
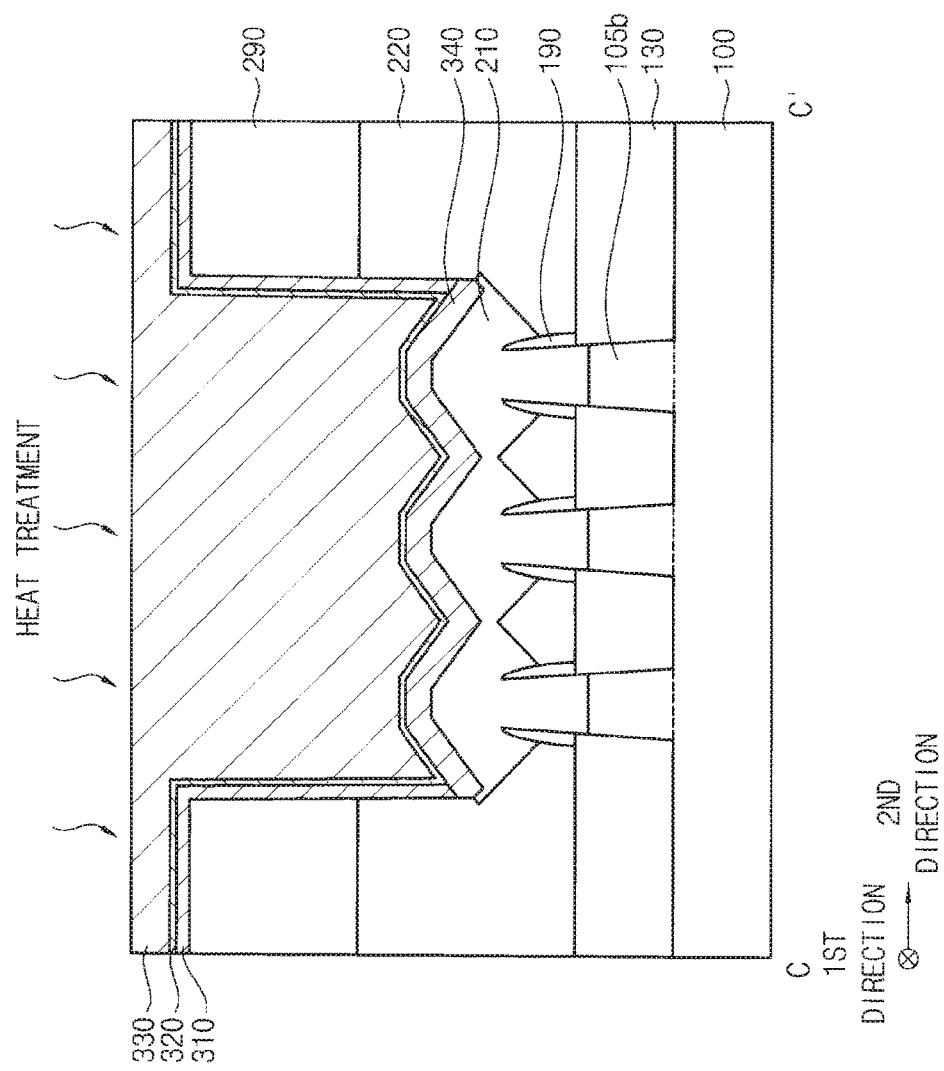
Figure 61:
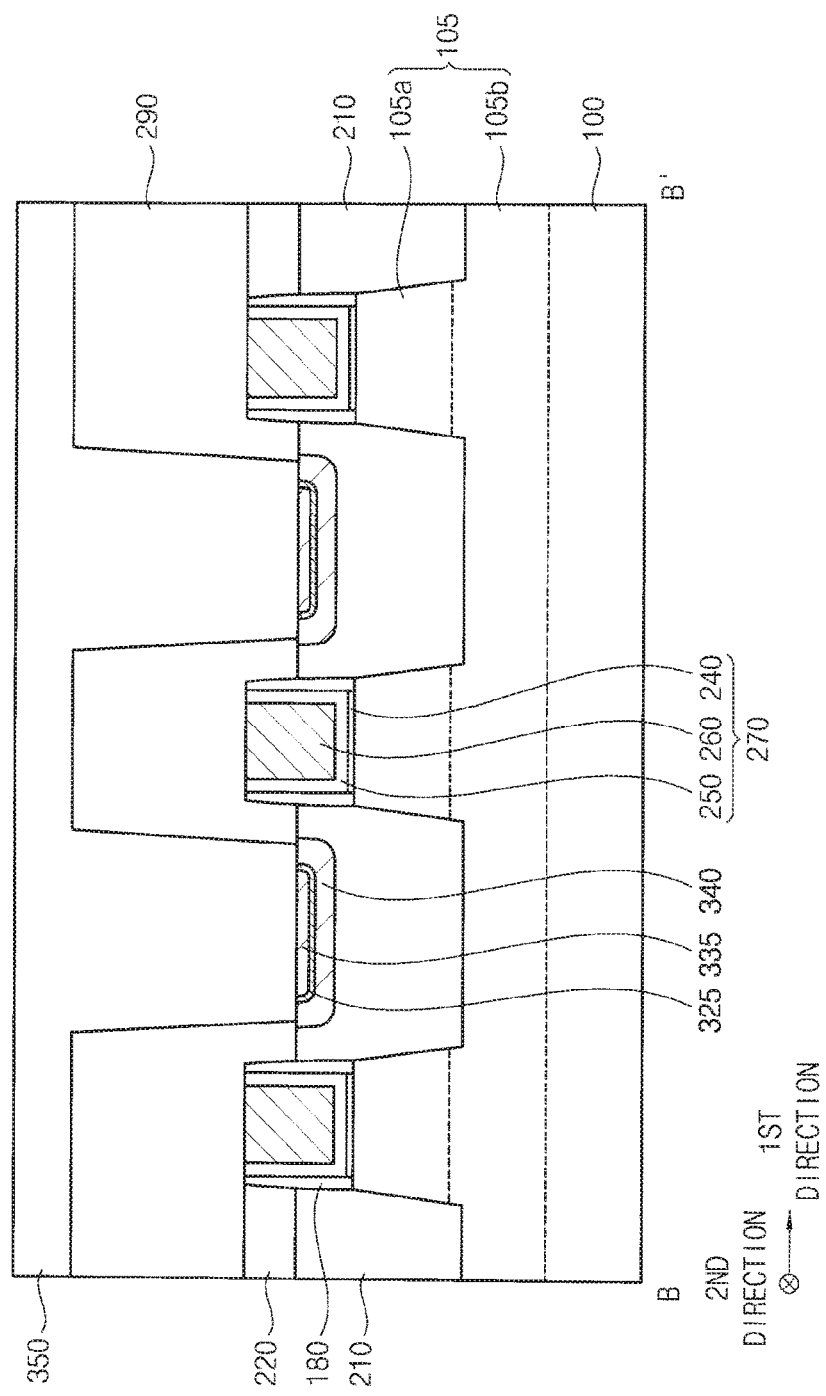
Figure 62:
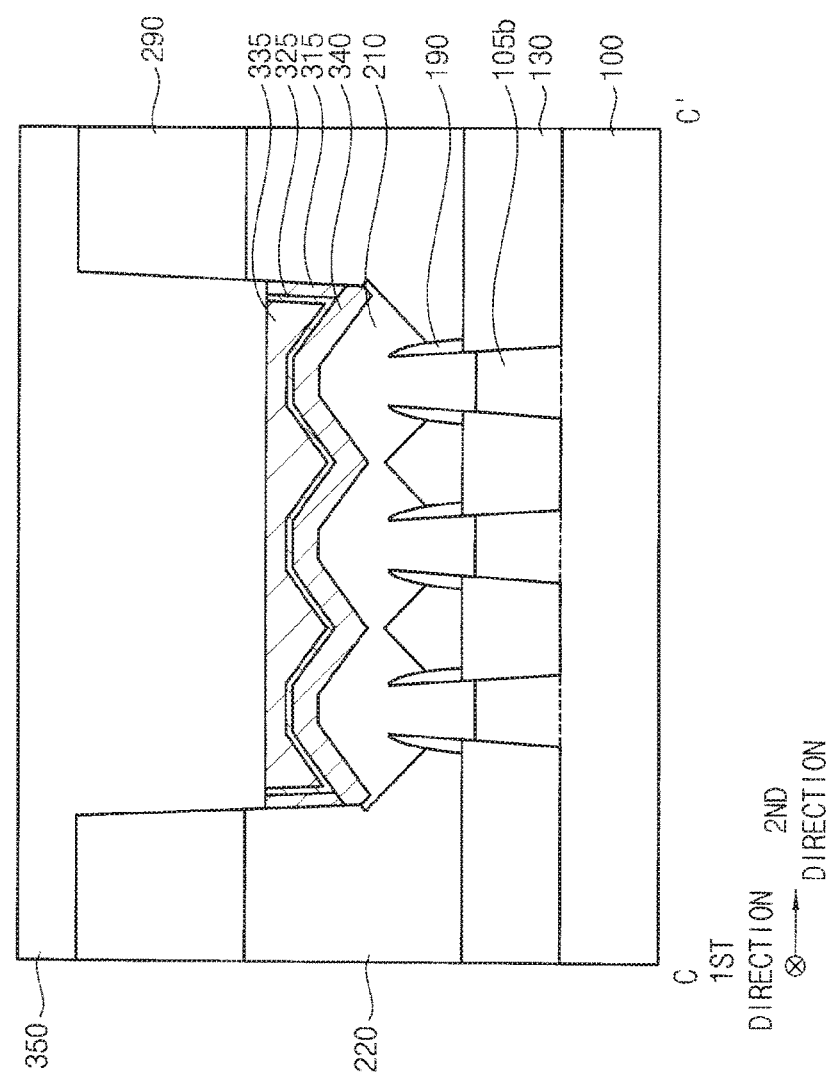

FIGS. 57, 59 and 61 are cross-sectional views taken along lines B-B' of FIG. 56, respectively, and FIGS. 58, 60 and 62 are cross-sectional views taken along lines C-C' of FIG. 56, respectively.

This method may include processes substantially the same as or similar to those illustrated with reference to FIGS. 6 to 50 and 1 to 5, and like reference numerals refer to like elements, and detailed descriptions thereon are omitted herein.

First, processes substantially the same as or similar to those illustrated with reference to FIGS. 6 to 31 may be performed. Then, the process for forming the gate mask 280 illustrated with reference to FIGS. 32 to 34 may or may not be performed. Hereinafter, only the case in which the process for forming the gate mask 280 is not performed will be illustrated.

Referring to FIGS. 56 to 58, a process substantially the same as or similar to that illustrated with reference to FIGS. 35 to 37 is performed so that a second insulating interlayer 290 is formed on the first insulating interlayer 220 to cover the gate structure 270, and the first and second insulating interlayers 220 and 290 are partially etched to form a second opening 300 exposing an upper surface of the source/drain layer 210.

In an exemplary embodiment, the second opening 300 exposes the entire upper surface of the source/drain layer 210 except for end portions of the source/drain layer 210 in each of the first and second directions. In the process illustrated with reference to FIGS. 35 to 37, the second opening 300 is formed to be self-aligned with the outer wall of the gate spacer 180 so as to expose the upper surface of the source/drain layer 210 except for the end portions thereof in the second direction. While in the process illustrated with reference to FIGS. 56 to 58, the second opening 300 is formed not to be self-aligned with the outer wall of the gate spacer 180. Thus, even though the second opening 300 may be mis-aligned, the gate structure 270 is not damaged by the process of forming the second opening 300 even without a gate mask. However, the second opening 300 may still entirely expose the upper surface of the source/drain layer 210 except for the end portions of the source/drain layer 210 in the second direction.

In an exemplary embodiment, a plurality of second openings 300 are formed in the second direction to expose the plurality of source/drain layers 210, respectively, spaced apart from each other in the second direction. Additionally, a plurality of second openings 300 are formed in the first direction to expose the plurality of source/drain layers 210, respectively, between the gate structures 270 disposed in the first direction.

In an exemplary embodiment, an upper portion of the source/drain layer 210 exposed during the formation of the second opening 300 is partially removed, and thus a bottom of the second opening 300 is lower than a top surface of a portion of the source/drain layer 210 on which no second opening is formed. Thus, a metal silicide pattern 340 (refer to FIGS. 59 and 60) subsequently formed may contact a second conductive contact plug 434 (refer to FIGS. 51 to 55) well so as to prevent the increase of the contact resistance.

Referring to FIGS. 59 and 60, a process substantially the same as or similar to that illustrated with reference to FIGS. 38 to 41 is performed.

Thus, after sequentially forming a metal layer 310 and a first barrier layer 320 on the bottom and a sidewall of the second opening 300 and the second insulating interlayer 290, a first conductive layer 330 is formed to fill a remaining portion of the second opening 300. A heat treatment process is performed on the substrate 100 so that the metal layer 310 and an upper portion of the source/drain layer 210 react with each other to form a metal silicide pattern 340.

In an exemplary embodiment, the metal silicide pattern 340 is formed on the source/drain layer 210 exposed by the second opening 300. In particular, the metal silicide pattern 340 is formed on the entire upper surface of the source/drain layer 210 except for the end portions thereof in each of the first and second directions. The metal silicide pattern 340 may have a cross-section taken along the first direction that is upwardly concave.

Referring to FIGS. 60 and 61, a process substantially the same as or similar to that illustrated with reference to FIGS. 42 to 43 is performed so that the first conductive layer 330, the first barrier layer 320 and the metal layer 310 are removed to form a second recess (not shown), and an insulation layer 350 is formed on the second insulating interlayer 290 to fill the second recess.

Unlike the process for forming the second opening 300, during the process for forming the second recess, the first conductive layer 330, the first barrier layer 320 and the metal layer 310 are not completely removed, but some portions thereof remain, and thus the metal silicide pattern 340 is not exposed. In an exemplary embodiment, the second recess is formed by a dry etch process, and the first conductive layer 330, the first barrier layer 320 and the metal layer 310 are removed until a top surface of the source/drain layer 210 not exposed by the second opening 300 is exposed.

Thus, a first barrier pattern 325 and a first conductive pattern 335 remain on the metal silicide pattern 340 that are formed on a bottom and a sidewall of the second opening 300 to have an upwardly concave shape, and may form a conductive pattern structure. A bottom and a sidewall of the first conductive pattern 335 may be covered by the first barrier pattern 325. A metal pattern 315 may remain on end portions of the source/drain layer 210 in the second direction.

In an exemplary embodiment, top surfaces of the conductive pattern structure and the metal pattern 315 are substantially coplanar with a top surface of the concave metal silicide pattern 340, and are substantially coplanar with the top surface of the source/drain layer 210 on which no metal silicide pattern 340 is formed.

Referring to FIGS. 51 to 55 again, processes substantially the same as or similar to those illustrated with reference to FIGS. 44 to 50 and FIGS. 1 to 5 are performed to complete the semiconductor device.

Thus, a first conductive contact plug 432 may be formed to contact a top surface of a portion of the gate structure 270, and a second contact plug structure may be formed to contact a top surface of the conductive pattern structure and an upper surface of a portion of the metal silicide pattern 340. The second contact plug structure may include a second conductive contact plug 434 and an insulation pattern 355 that is disposed in the second direction to contact each other.

In an exemplary embodiment, the first conductive contact plug 432 and the insulation pattern 355 are adjacent to each other in the first direction. However, unlike those illustrated with reference to FIGS. 1 to 5, the first conductive contact plug 432 does not contact the insulation pattern 355, but is spaced apart therefrom. Additionally, the second contact plug structure does not contact the outer wall of the gate spacer 180.

Like those illustrated with reference to FIGS. 1 to 5, the second conductive contact plug 434 contacts an upper surface of a first portion of the metal silicide pattern 340 and the conductive pattern structure on a first source/drain layer 210 among the source/drain layers 210, and the first conductive contact plug 432 contacts a top surface of the gate structure 270 adjacent a second portion of the metal silicide pattern 340 and the conductive pattern structure on the first source/drain layer among the source/drain layers 210. The first and second portions of the metal silicide pattern 340 may be spaced apart from each other in the second direction, and thus the first and second conductive contact plugs 432 and 434 do not contact each other, but are spaced apart from each other in the second direction.

Figure 63:
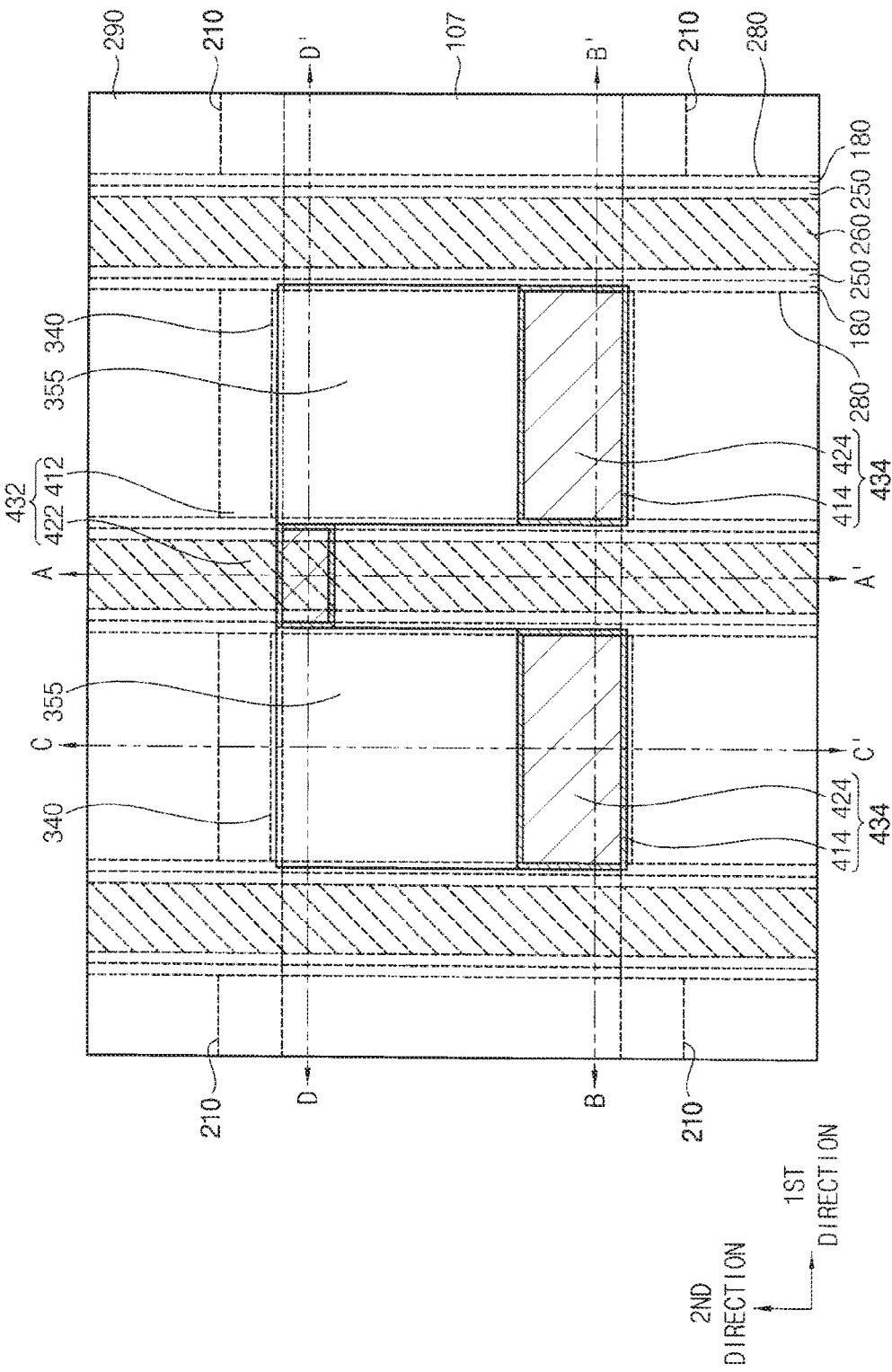
FIGS. 63 to 67 are plan views and cross-sectional views illustrating a semiconductor device in accordance with exemplary embodiments of the inventive concept.

FIGS. 63 to 67 are plan views and cross-sectional views illustrating a semiconductor device in accordance with example embodiments. Particularly, FIG. 63 is a plan view illustrating the semiconductor device, and FIGS. 64 to 67 are cross-sectional views illustrating the semiconductor device.

Figure 64:
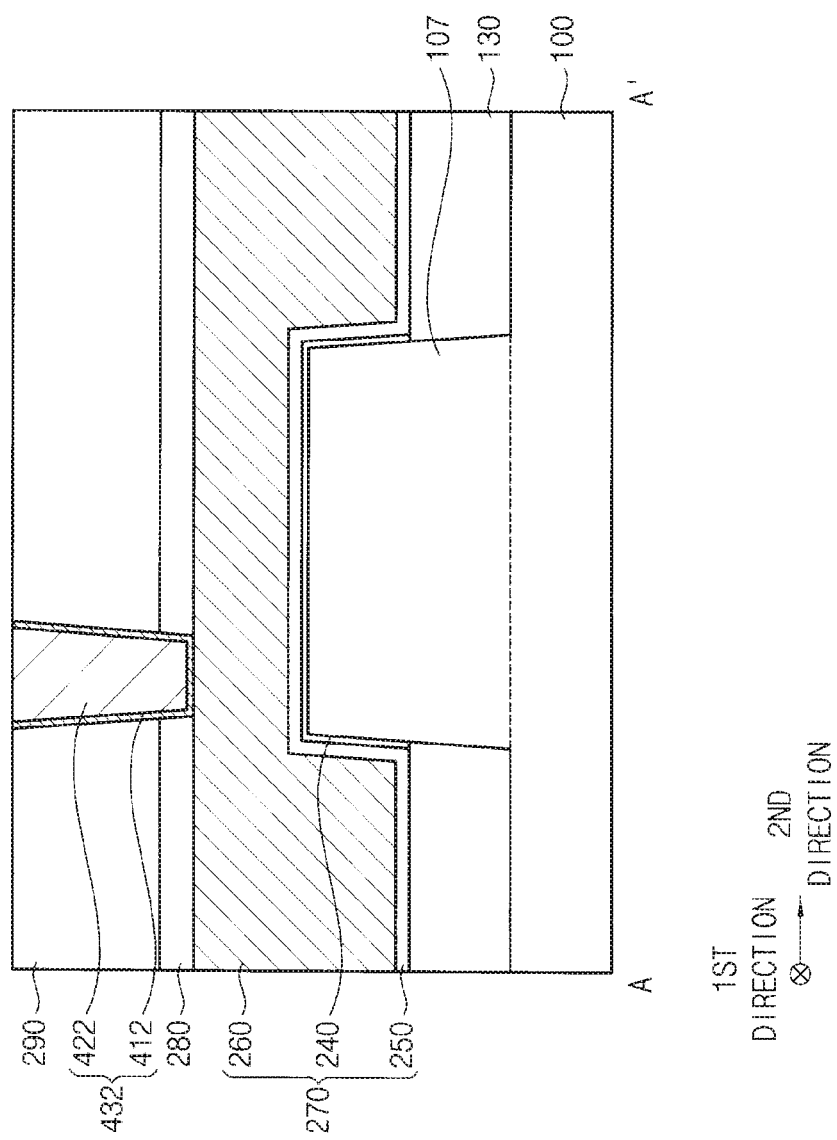
Figure 65:
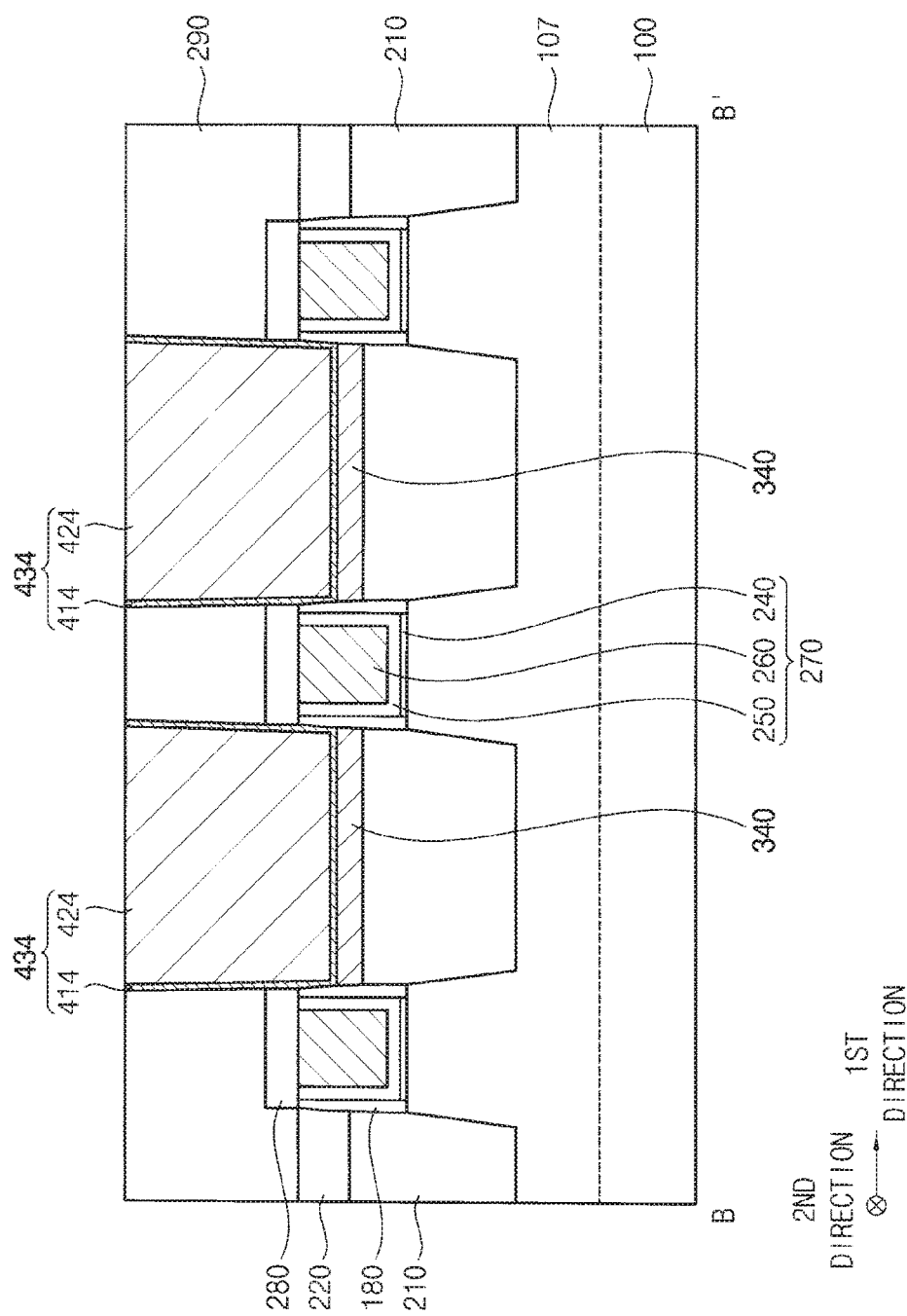
Figure 66:
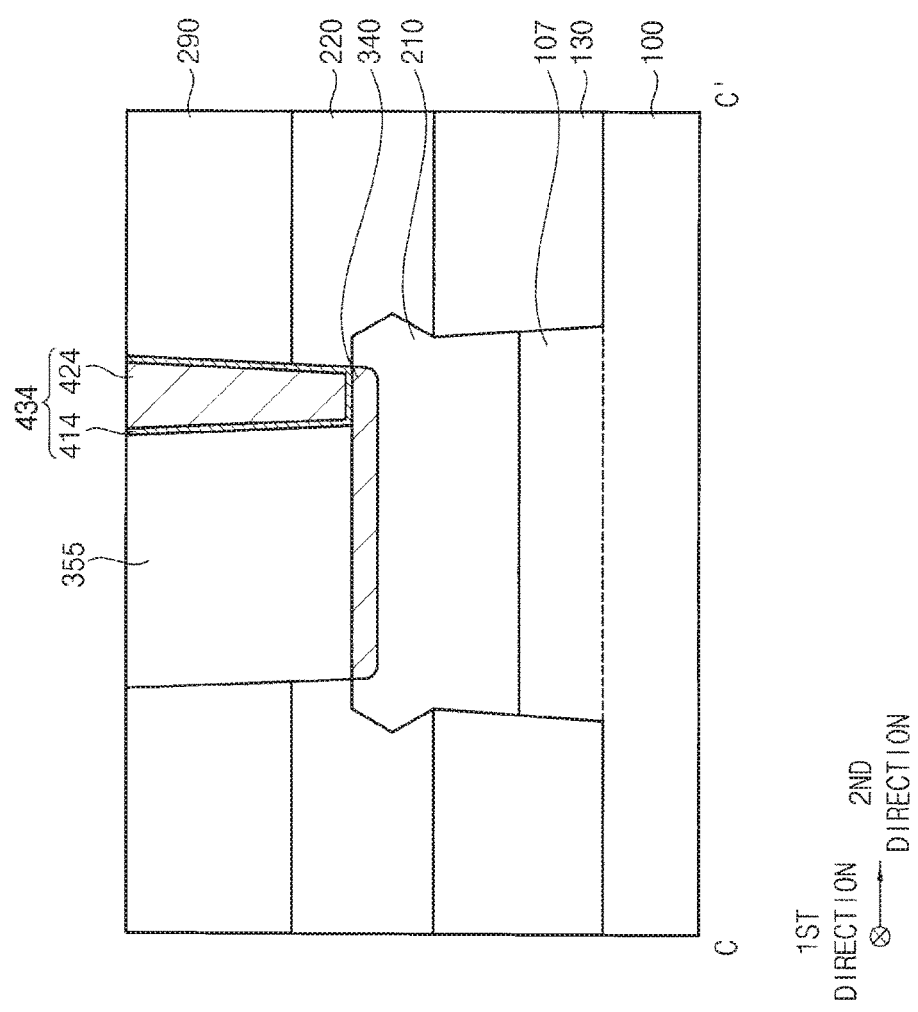
Figure 67:
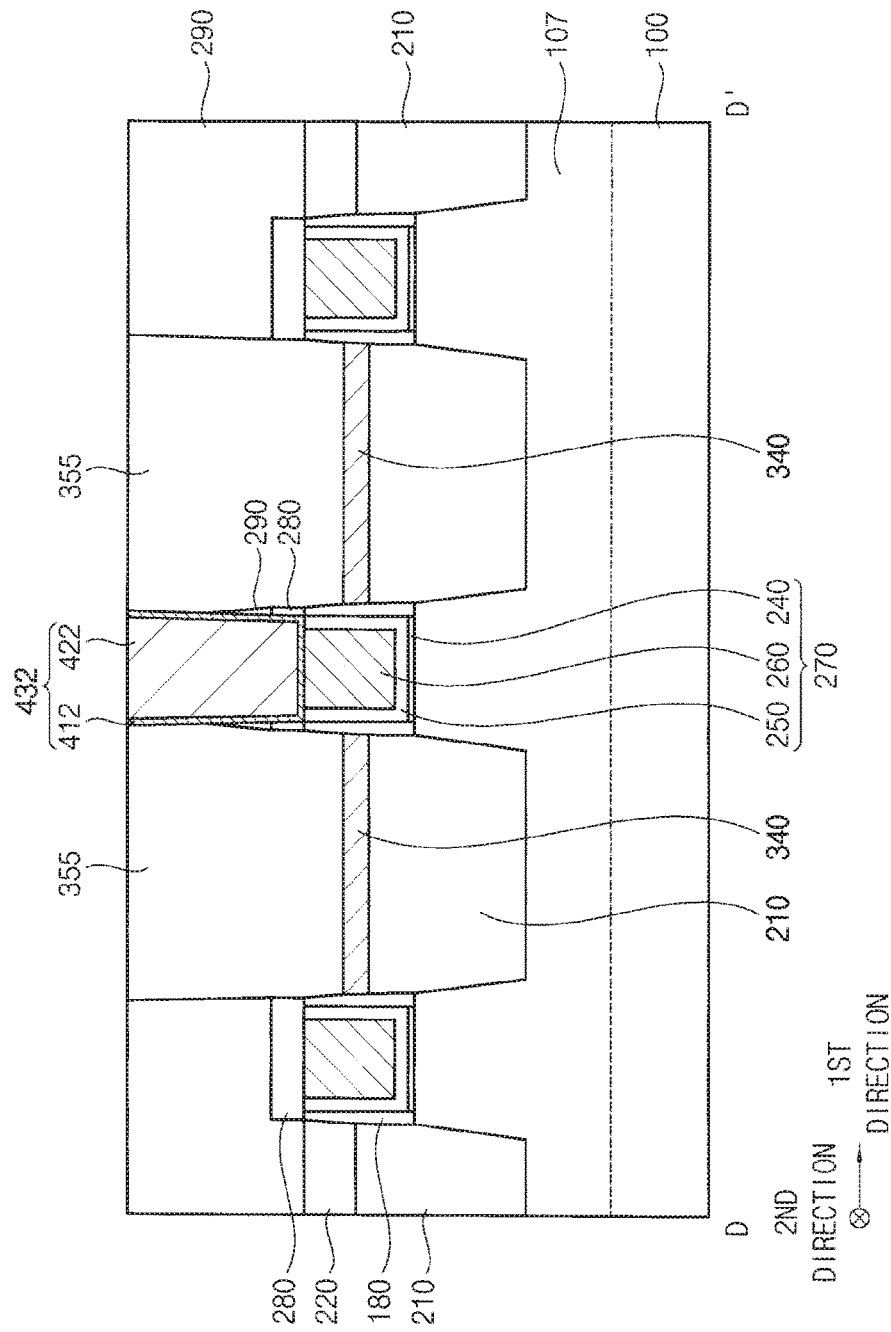

FIG. 64 is a cross-sectional view taken along a line A-A' of FIG. 63, FIG. 65 is a cross-sectional view taken along a line B-B' of FIG. 63, FIG. 66 is a cross-sectional view taken along a line C-C' of FIG. 63, and FIG. 67 is a cross-sectional view taken along a line D-D' of FIG. 63.

The semiconductor device may be substantially the same as that of FIGS. 1 to 5 except for the active region. Thus, like reference numerals refer to like elements, and detailed descriptions thereon are omitted herein.

Referring to FIGS. 63 to 67, the semiconductor device includes the gate structure 270, the source/drain layer 210, the first conductive contact plug 432, and the second contact plug structure disposed on the substrate 100. The semiconductor device may further include the gate spacer 180, the gate mask 280, the metal silicide pattern 340, and the first and second insulating interlayers 220 and 290.

The isolation pattern 130 may be formed on the substrate 100, and thus a field region of which a top surface is covered by the isolation pattern 130, and an active region 107 of which a top surface is not covered by the isolation pattern 130 may be defined in the substrate 100. In an exemplary embodiment, the active region 107 extends in the first direction, and a plurality of active regions 107 are formed in the second direction.

The metal silicide pattern 340 may be formed on an entire upper surface of the source/drain layer 210 on one of the active regions 107 except for end portions of the source/drain layer 210 in the second direction, and thus the contact resistance between the metal silicide pattern 340 and the second conductive contact plug 434 may be lowered.

The second conductive contact plug 434 may contact an upper surface of a first portion of the metal silicide pattern 340, and the first conductive contact plug 432 may contact a top surface of the gate structure 270 adjacent a second portion of the metal silicide pattern 340. Thus, the first and second conductive contact plugs 432 and 434, which do not contact each other but are spaced apart from each other, are formed on one of the active regions 107, and are not formed on a space between neighboring ones of the active regions 107 spaced apart from each other in the second direction. Accordingly, the semiconductor device may have an enhanced integration degree.

FIGS. 68 to 77 are plan views and cross-sectional views illustrating stages of a method of manufacturing a semiconductor device in accordance with exemplary embodiments of the inventive concept. Particularly, FIGS. 68, 70, 72 and 75 are plan views, and FIGS. 69, 71, 73-74 and 76-77 are cross-sectional views.

Figure 69:
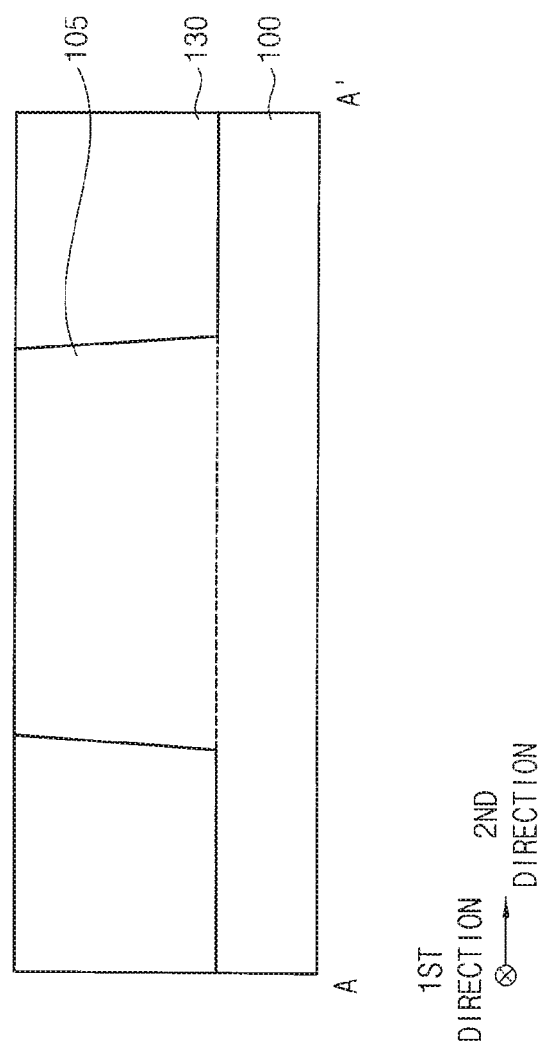
Figure 71:
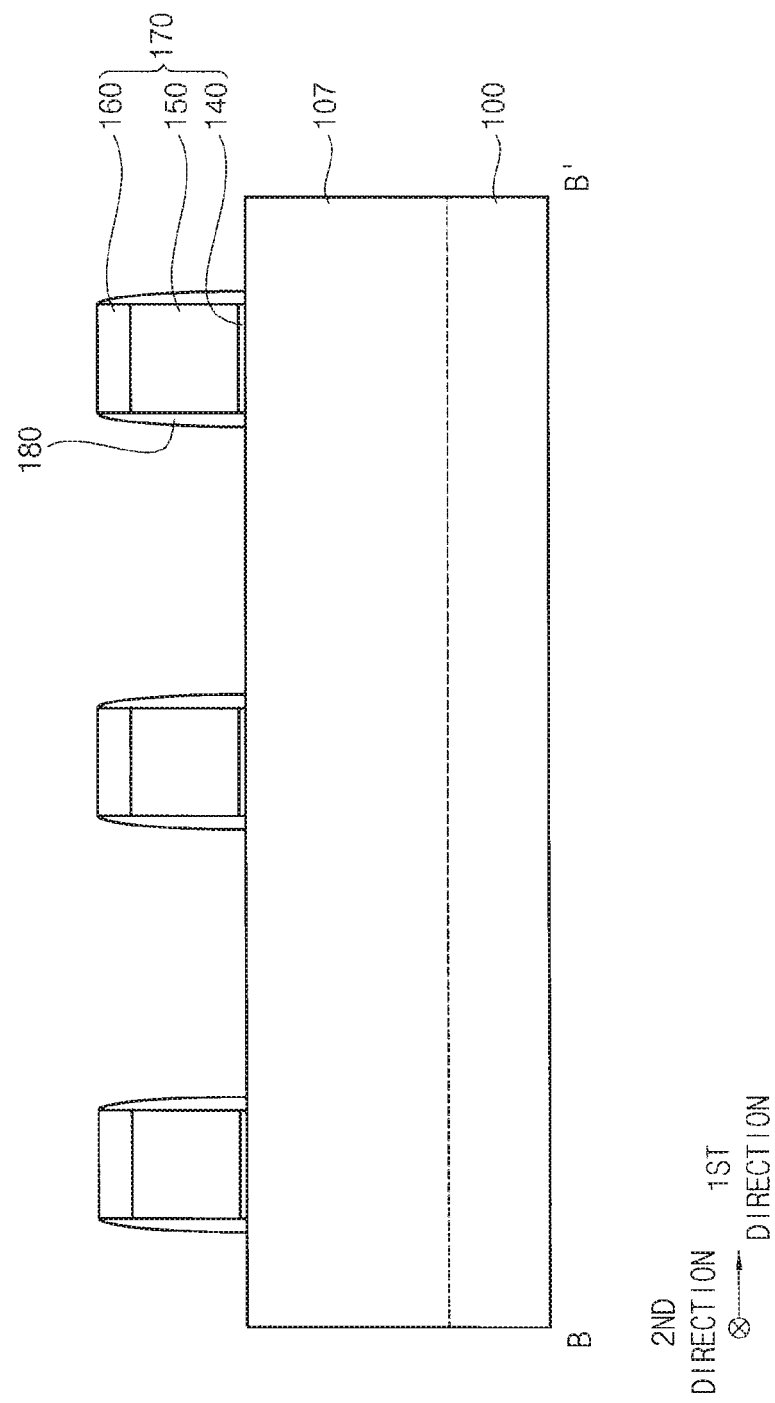
Figure 73:
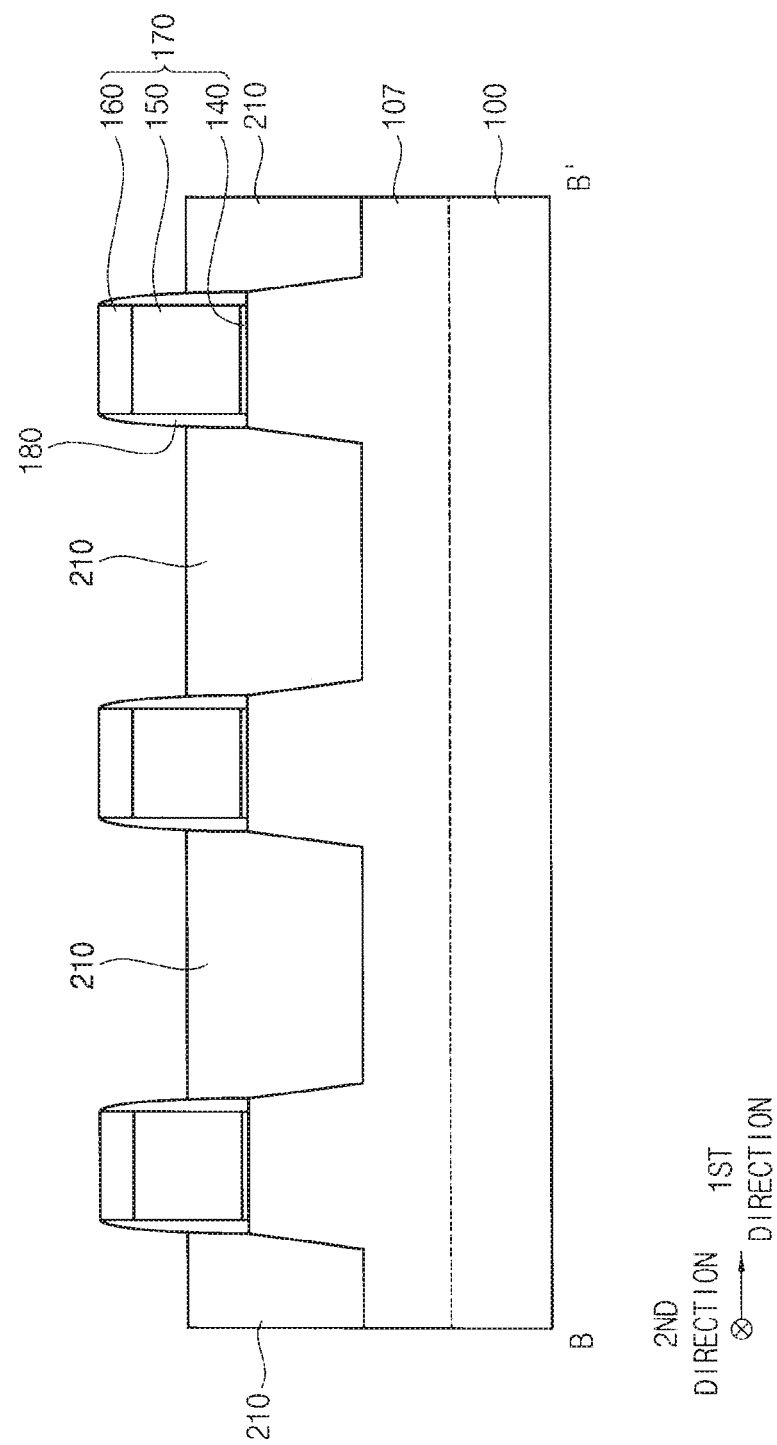
Figure 74:
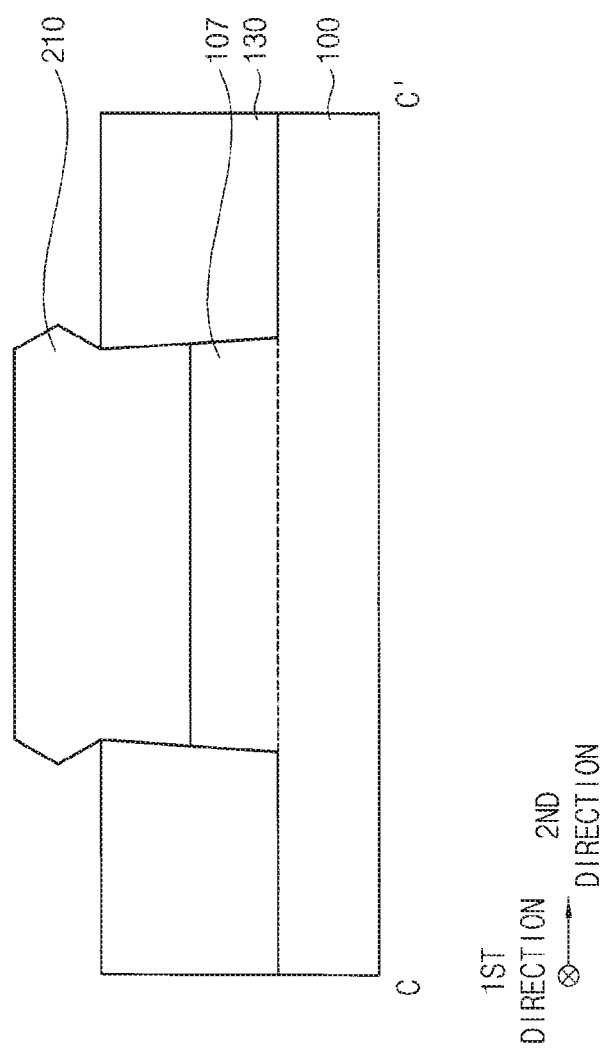
Figure 76:
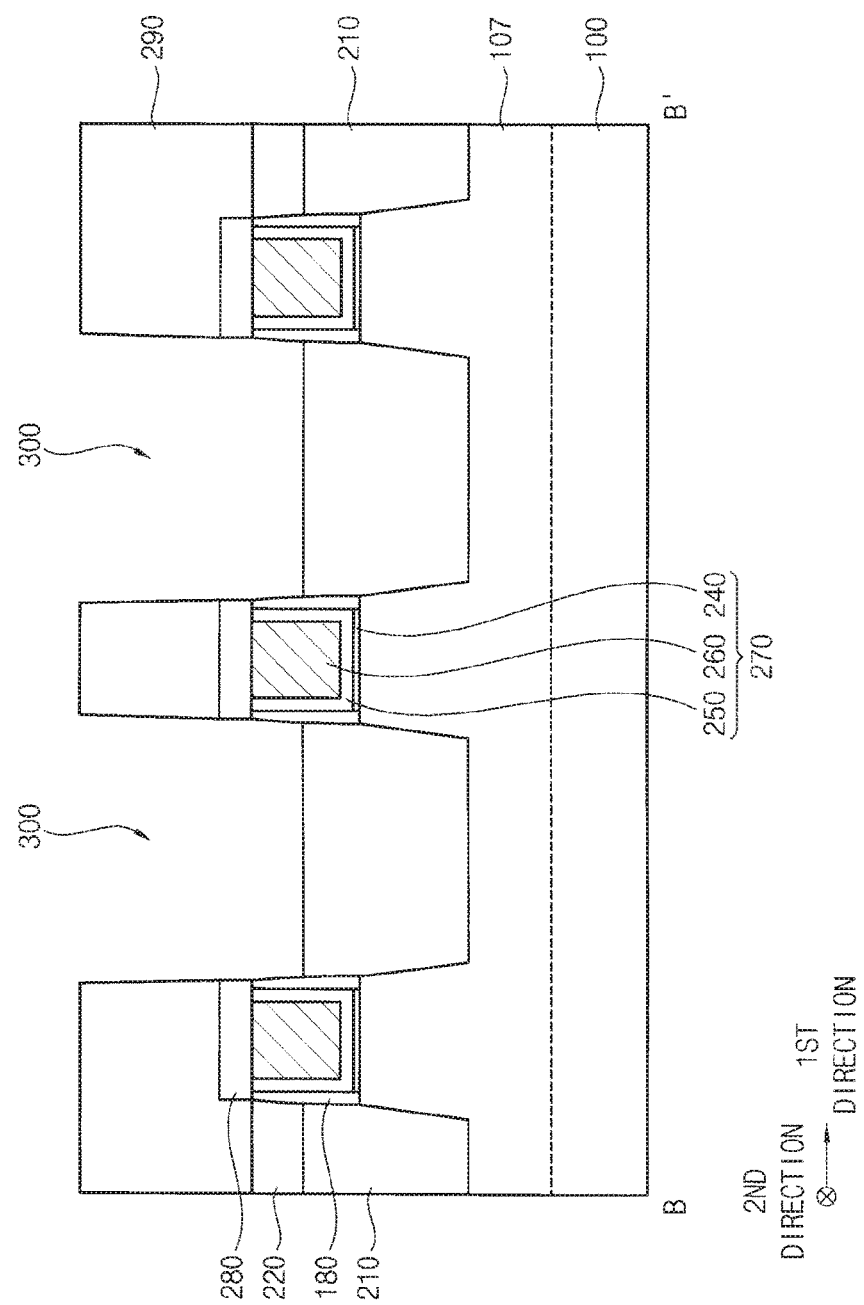
Figure 77:
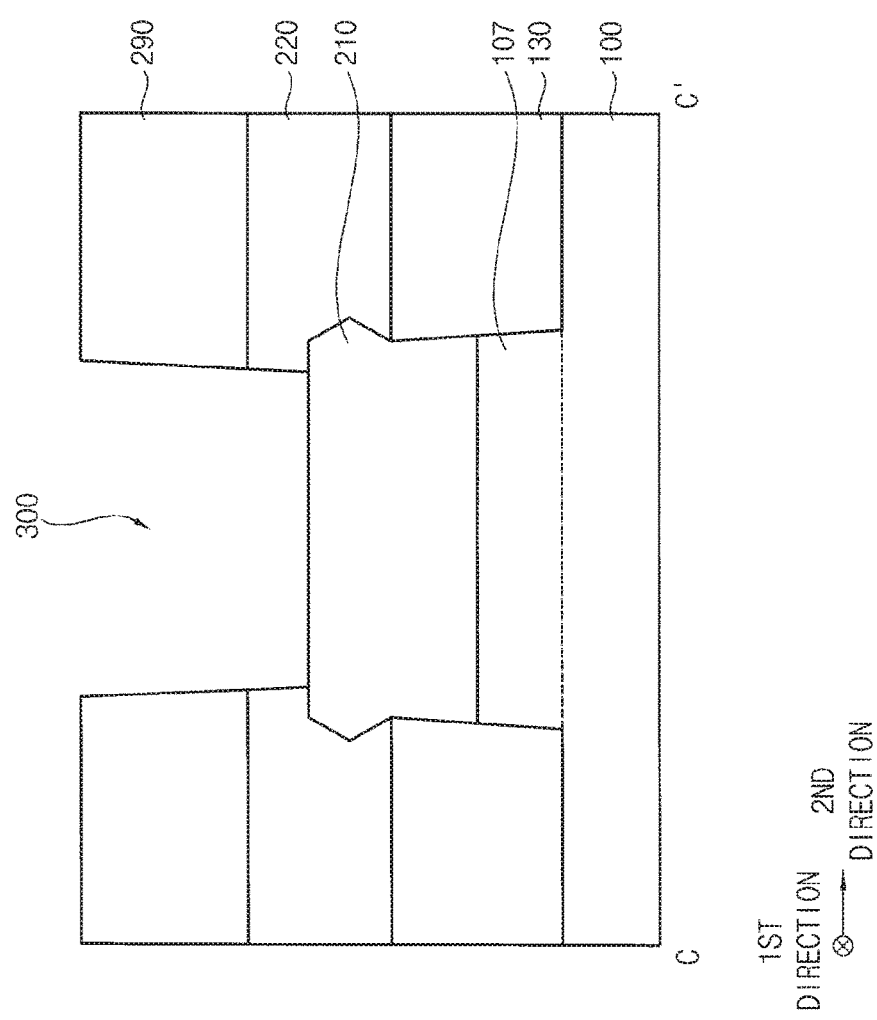

FIG. 69 is a cross-sectional view taken along a line A-A' of a corresponding plan view, FIGS. 71, 73 and 76 are cross-sectional views taken along lines B-B' of corresponding plan views, respectively, and FIGS. 74 and 77 are cross-sectional views taken along lines C-C' of corresponding plan views, respectively.

This method may include processes substantially the same as or similar to those illustrated with reference to FIGS. 6 to 50 and 1 to 5, and like reference numerals refer to like elements, and detailed descriptions thereon are omitted herein.

Figure 68:
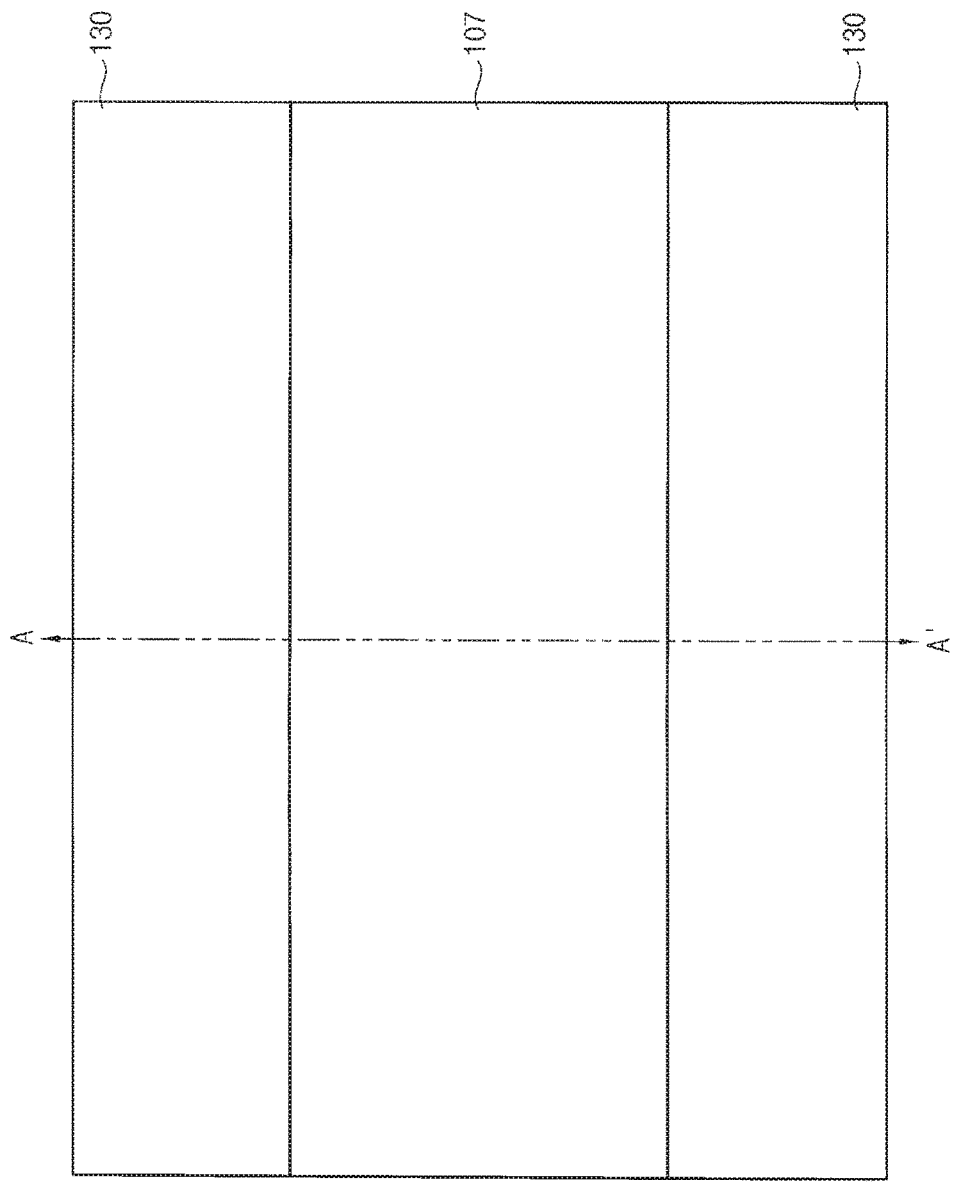
FIGS. 68 to 77 are plan views and cross-sectional views illustrating stages of a method of manufacturing a semiconductor device in accordance with exemplary embodiments of the inventive concept.

Referring to FIGS. 68 and 69, an upper portion of a substrate 100 is partially removed using a first photoresist pattern (not shown) as an etching mask to form a trench (not shown), and an isolation pattern 130 is formed on the substrate 100 to fill the trench and have a top surface substantially coplanar with a top surface of the substrate 100.

Thus, a field region of which a top surface is covered by the isolation pattern 130 and an active region 107 of which a top surface is not covered by the isolation pattern 130 may be defined in the substrate 100. In an exemplary embodiment, the active region 107 extends in the first direction, and a plurality of active regions 107 are formed in the second direction.

Figure 70:
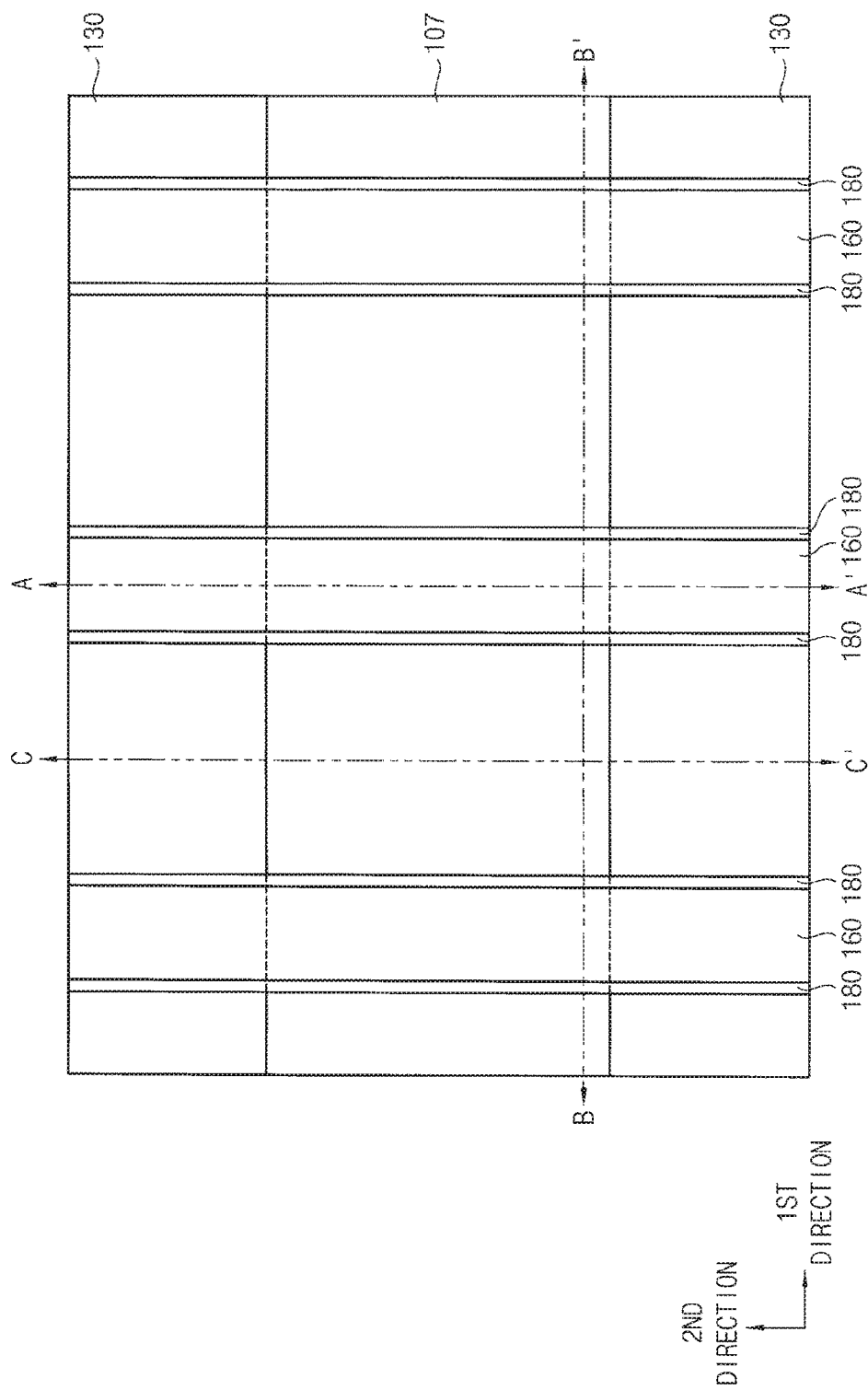

Referring to FIGS. 70 and 71, processes substantially the same as or similar to those illustrated with reference to FIGS. 12 to 17 may be performed so that a dummy gate structure 170 is formed on the active region 107 of the substrate 100 and the isolation pattern 130 to extend in the second direction, and a gate spacer 180 is formed on sidewalls of the dummy gate structure 170 in the first direction.

Figure 72:
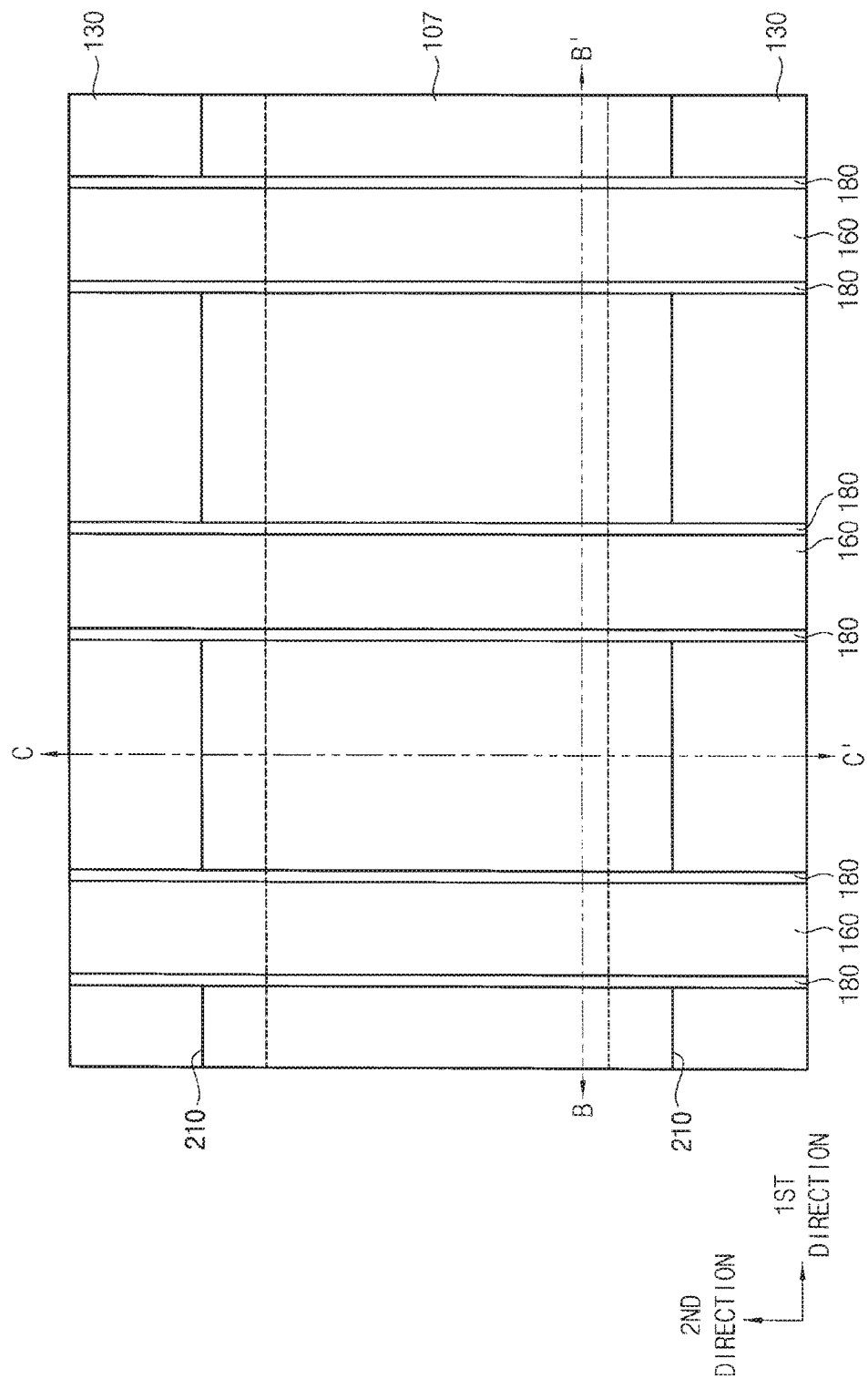

Referring to FIGS. 72 to 74, processes substantially the same as or similar to those illustrated with reference to FIGS. 18 to 23 may be performed so that an upper portion of the active region 107 not covered by the dummy gate structure 170 and the gate spacer 180 is removed to form a first recess (not shown), and a source/drain layer 210 is formed on the active region 107 to fill the first recess.

Figure 75:
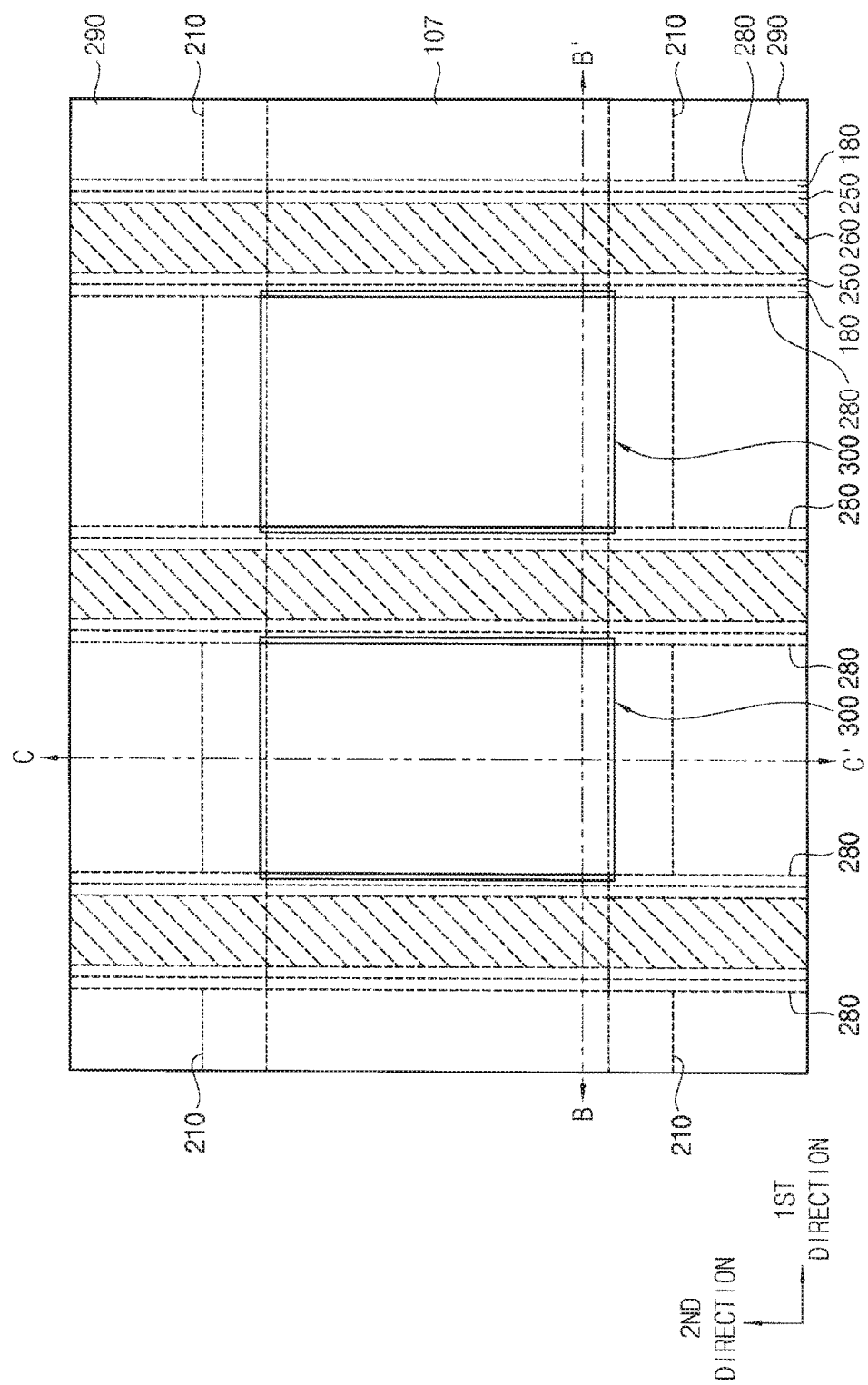

Referring to FIGS. 75 to 77, processes substantially the same as or similar to those illustrated with reference to FIGS. 24 to 37 may be performed so that a first insulating interlayer 220, a gate structure 270 and a gate mask 280 are formed, a second insulating interlayer 290 is formed to cover the gate mask 280, and the first and second insulating interlayers 220 and 290 are partially etched to form a second opening 300 exposing an upper surface of the source/drain layer 210.

In exemplary embodiment, the second opening 300 entirely expose the upper surface of the source/drain layer 210. That is, the second opening 300 entirely exposes the upper surface of the source/drain layer 210 on the active region 107 except for end portions of the source/drain layer 210 in the second direction.

In an exemplary embodiment, a plurality of second openings 300 are formed to expose the plurality of source/drain layers 210, respectively, spaced apart from each other in the second direction. Additionally, the second openings 300 may be formed to expose the source/drain layers 210 between neighboring ones of the gate structures 270 disposed in the first direction. In an exemplary embodiment, the second opening 300 is formed to be self-aligned with sidewalls of each of the gate structures 270 in the first direction.

Referring to FIGS. 63 to 67, processes substantially the same as or similar to those illustrated with reference to FIGS. 38 to 50 and FIGS. 1 to 5 may be performed.

Thus, a metal silicide pattern 340 may be formed on the entire upper surface of the source/drain layer 210 except for the end portions of the source/drain layer 210 in the second direction. Additionally, a second conductive contact plug 434 may be formed to contact an upper surface of a first portion of the metal silicide pattern 340, an insulation pattern 355 may be formed to contact an upper surface of other portions of the metal silicide pattern 340, and a first conductive contact plug 432 may be formed to contact a top surface of a portion of the gate structure 270 adjacent a second portion of the metal silicide pattern 340. The first and second portions of the metal silicide pattern 340 may be spaced apart from each other in the second direction, and thus the first and second conductive contact plugs 432 and 434 do not contact each other, and are spaced apart from each other in the second direction.]

By the above processes, the semiconductor device may be manufactured.

In the above method of manufacturing the semiconductor device, the second opening 300 is formed to entirely expose the upper surface of the source/drain layer 210 on one of the active regions 107, and an upper portion of the source/drain layer 210 exposed by the second opening 300 may be silicidated. Thus, the metal silicide pattern 340 may be formed on the entire upper surface of the source/drain layer 210 to realize a low resistance.

Additionally, in an embodiment, after forming an insulation layer on the metal silicide pattern 340 to fill the second opening 300, the insulation layer is partially removed to form a third opening (not shown) exposing an upper surface of a portion of the metal silicide pattern 340 and a fourth opening (not shown) exposing a top surface of a portion of the gate structure 270, and second and first conductive contact plugs 434 and 432 are formed to fill the third and fourth openings, respectively. Thus, the first and second conductive contact plugs 432 and 434, which cannot be electrically shorted with each other, and contact the gate structure 270 and the metal silicide pattern 340, respectively, may be formed to overlap one of the active regions 107. Accordingly, the first and second conductive contact plugs 432 and 434 are not formed on a space between neighboring ones of the plurality of active regions 107 in the second direction, and the semiconductor device may have an enhanced integration degree.

Figure 78:
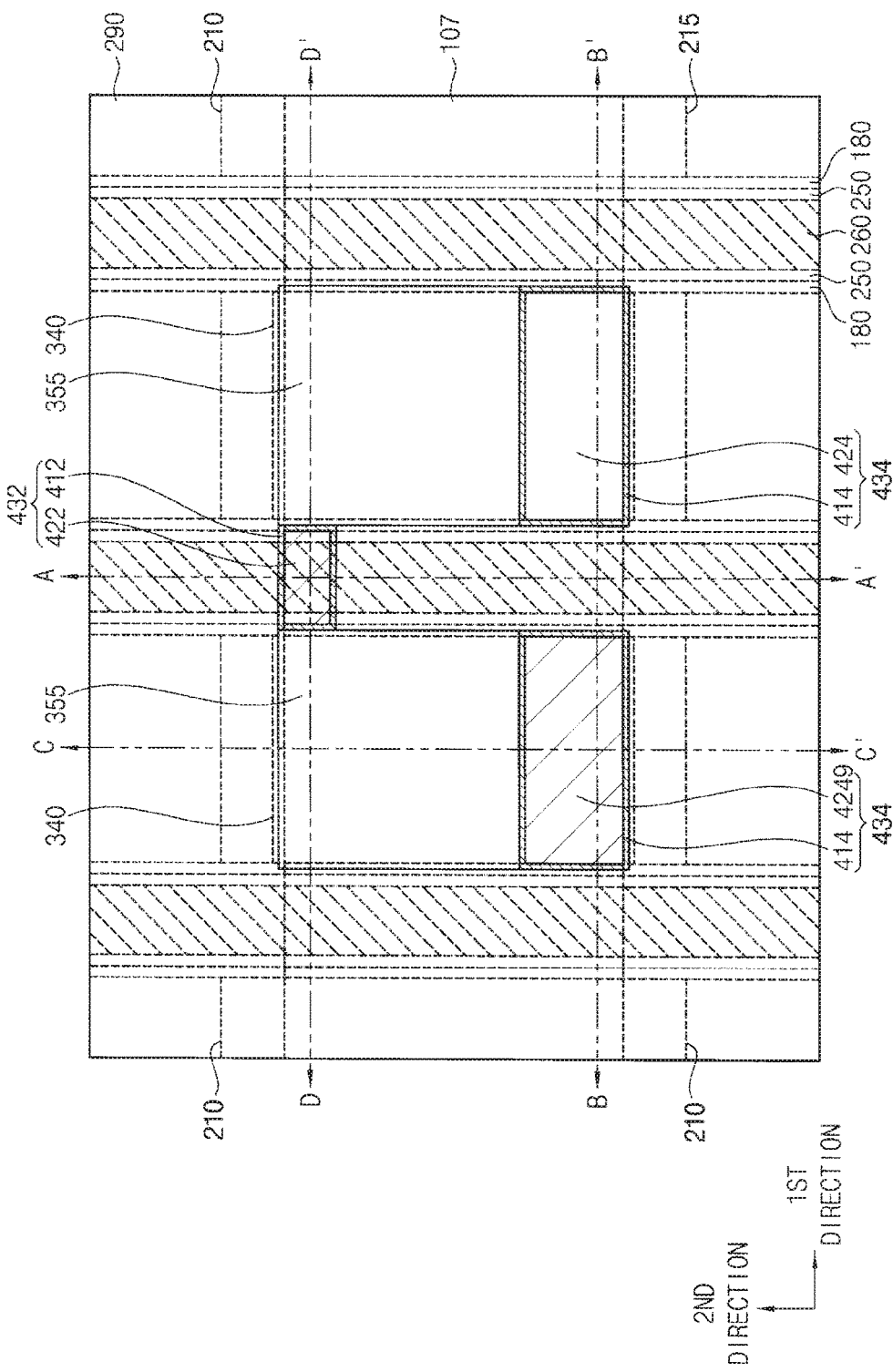
FIGS. 78 to 82 are plan views and cross-sectional views illustrating a semiconductor device in accordance with exemplary embodiments of the inventive concept.

FIGS. 78 to 82 are a plan view and cross-sectional views illustrating a semiconductor device in accordance with exemplary embodiments of the inventive concept. Particularly, FIG. 78 is a plan view illustrating the semiconductor device, and FIGS. 79 to 82 are cross-sectional views illustrating the semiconductor device.

Figure 79:
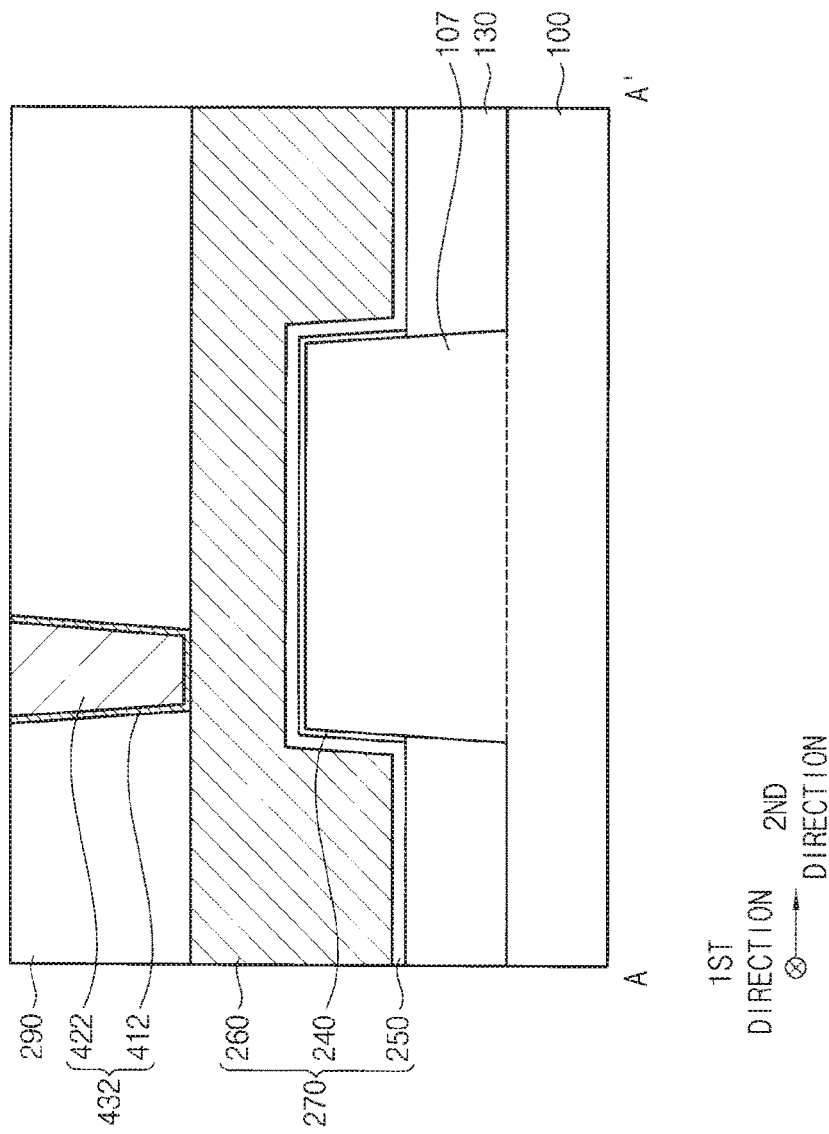
Figure 80:
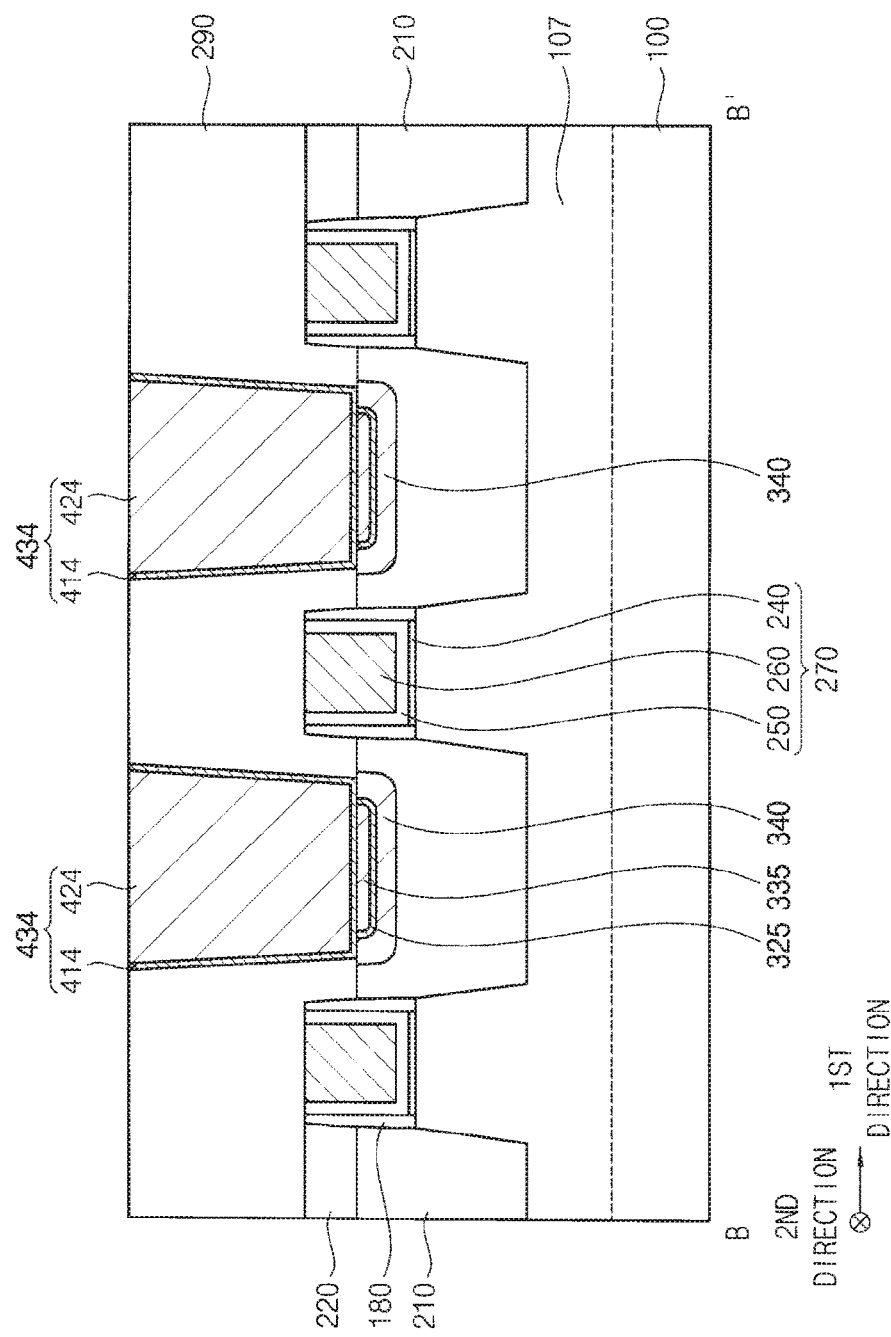
Figure 81:
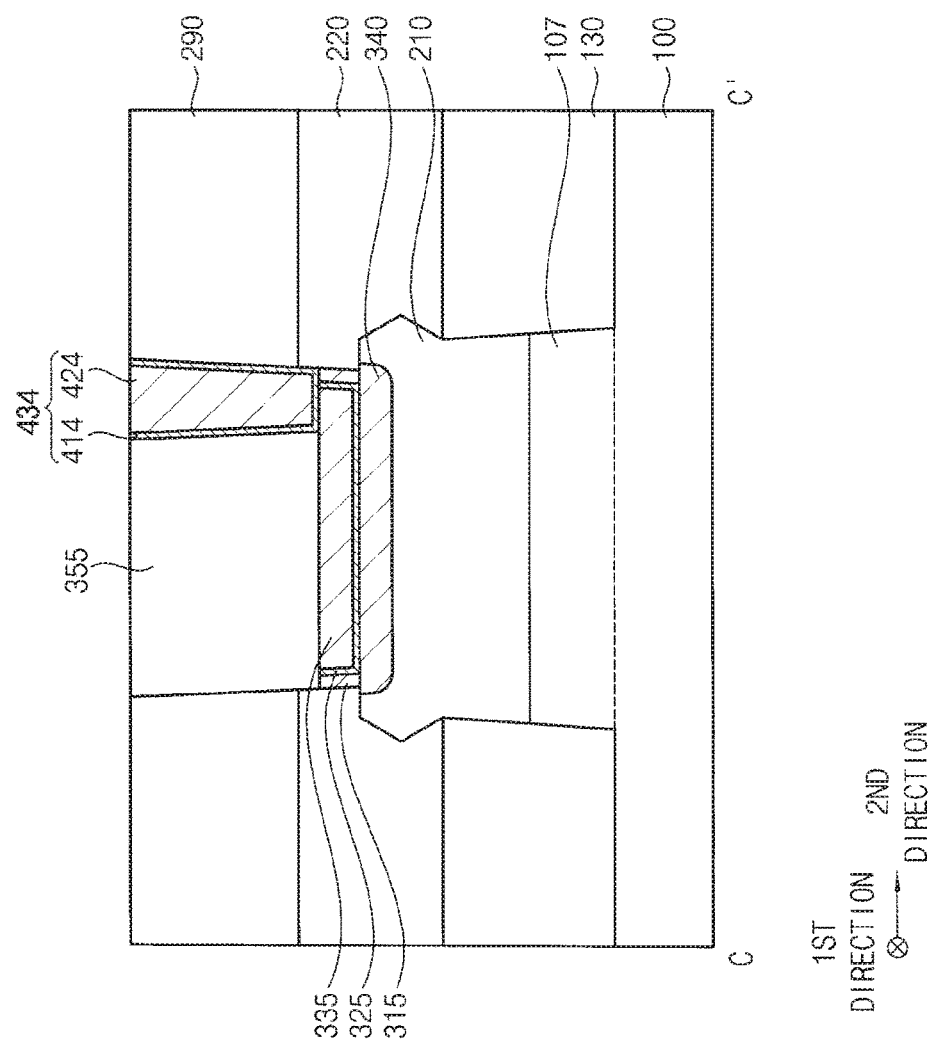
Figure 82:
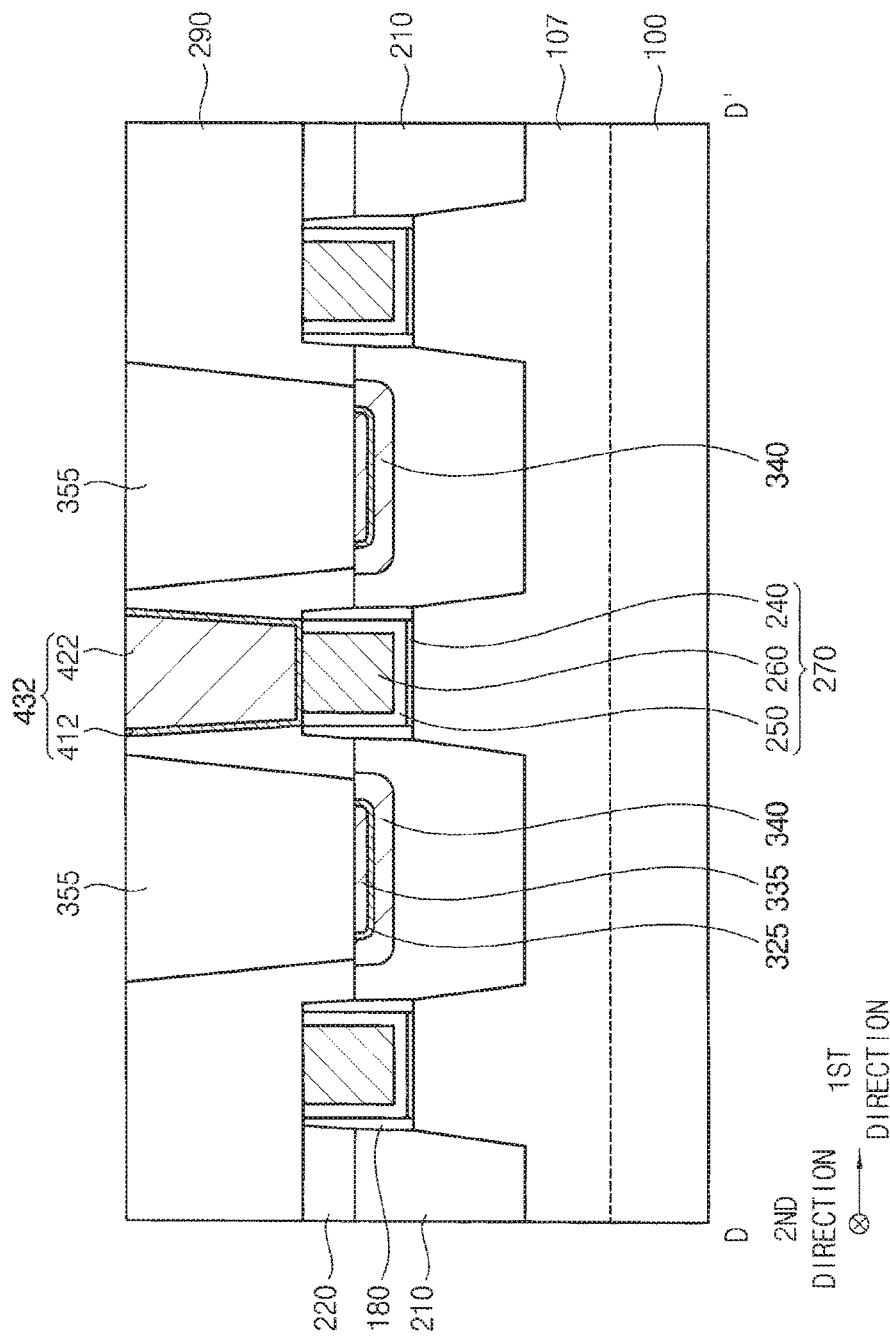

FIG. 79 is a cross-sectional view taken along a line A-A' of FIG. 78, FIG. 80 is a cross-sectional view taken along a line B-B' of FIG. 78, FIG. 81 is a cross-sectional view taken along a line C-C' of FIG. 78, and FIG. 82 is a cross-sectional view taken along a line D-D' of FIG. 78.

The semiconductor device may be substantially the same as that of FIGS. 63 to 67 except for the gate mask, the metal silicide pattern, the conductive pattern structure, the first conductive contact plug and the second contact plug structure. Additionally, the gate mask, the metal silicide pattern, the conductive pattern structure, the first conductive contact plug and the second contact plug structure of the semiconductor device may be substantially the same as that of FIGS. 51 to 55. Thus, like reference numerals refer to like elements, and detailed descriptions thereon are omitted herein.

Referring to FIGS. 78 to 82, the semiconductor device may include the gate structure 270, the source/drain layer 210, the first conductive contact plug 432, the second contact plug structure and the conductive pattern structure disposed on the substrate 100. The semiconductor device may further include the gate spacer 180, the metal pattern 315, the metal silicide pattern 340, and the first and second insulating interlayers 220 and 290.

The isolation pattern 130 may be formed on the substrate 100, and thus a field region of which a top surface is covered by the isolation pattern 130, and an active region 107 of which a top surface is not covered by the isolation pattern 130 may be defined in the substrate 100. In an exemplary embodiment, the active region 107 extends in the first direction, and a plurality of active regions 107 are formed in the second direction.

The metal silicide pattern 340 may be formed on an entire upper surface of the source/drain layer 210 on one of the active regions 107 except for end portions of the source/drain layer 210 in each of the first and second directions, and the conductive pattern structure may be formed on the metal silicide pattern 340. Thus, the contact resistance between the second conductive contact plug 434 and the metal silicide pattern 340 and the conductive pattern structure may be lowered.

The second conductive contact plug 434 may contact an upper surface of a first portion of the metal silicide pattern 340 and the conductive pattern structure, and the first conductive contact plug 432 may contact a top surface of the gate structure 270 adjacent a second portion of the metal silicide pattern 340 and the conductive pattern structure. The first and second portions may be spaced apart from each other in the second direction, and thus the first and second conductive contact plugs 432 and 434 do not contact each other but are spaced apart from each other.

In an embodiment, the first and second conductive contact plugs 432 and 434 are formed to overlap one of the active regions 107, and are not formed on a space between neighboring ones of the active regions 107 spaced apart from each other in the second direction. Accordingly, the semiconductor device may have an enhanced integration degree.

The above semiconductor device and the method of manufacturing the same may be applied to various types of memory devices including contact plugs. For example, the semiconductor device and the method of manufacturing the same may be applied to logic devices such as central processing units (CPUs), main processing units (MPUs), application processors (APs), or the like. Additionally, the semiconductor device and the method of manufacturing the same may be applied to volatile memory devices such as dynamic random access memory (DRAM) devices or static random access memory (SRAM) devices, or non-volatile memory devices such as flash memory devices, phase-change memory (PRAM) devices, magnetoresistive random access (MRAM) devices, resistance random access memory (RRAM) devices, or the like.

The foregoing is illustrative of exemplary embodiments of the inventive concept and is not to be construed as limiting thereof. Although a few exemplary embodiments have been described, those skilled in the art will readily appreciate that many modifications are possible in the exemplary embodiments without materially departing from the present inventive concept. Accordingly, all such modifications are intended to be included within the scope of the present inventive concept.

What is claimed is:

1. A semiconductor device comprising:
   a substrate;
   an isolation pattern disposed on the substrate;
   a plurality of active regions disposed on the substrate and defined by the isolation pattern, each of the plurality of active regions being spaced apart from each other;
   a gate structure disposed on the plurality of active regions, the gate structure extending in the first direction;
   a source/drain disposed on the plurality of active regions;
   a first contact plug disposed on the gate structure; and
   a second contact plug disposed on the source/drain and spaced apart from the first contact plug,
   wherein the first and second contact plugs are not aligned with each other in a second direction substantially perpendicular to the first direction.

2. The semiconductor device of claim 1, wherein the first contact plug vertically overlaps a first one of the plurality of active regions.

3. The semiconductor device of claim 1, wherein the second contact plug vertically overlaps a second one of the plurality of active regions.

4. The semiconductor device of claim 1, further comprising a metal silicide disposed on the source/drain and contacting the second contact plug.

5. The semiconductor device of claim 1, wherein a bottom surface of the second contact plug has a shape corresponding to a shape of a top surface of the source/drain.

6. The semiconductor device of claim 1, further comprising a gate spacer disposed on sidewalls of the gate structure.

7. The semiconductor device of claim 1, wherein a lower portion of each of the plurality of active regions is covered by the isolation pattern.

8. The semiconductor device of claim 1, wherein the isolation pattern comprises silicon oxide and the gate insulation pattern comprises metal oxide.

9. A semiconductor device comprising:
   a substrate;
   an isolation pattern disposed on the substrate;
   a plurality of active fins disposed on the substrate and defined by the isolation pattern, each of the plurality of active fins being spaced apart from each other;
   a gate structure disposed on the plurality of active fins;
   a first source/drain disposed on the plurality of active fins;
   a first contact plug disposed on the gate structure;
   a second contact plug disposed on the first source/drain and spaced apart from the first contact plug; and
   a metal silicide disposed on the first source/drain and contacting the second contact plug,
   wherein a bottom surface of the second contact plug has a shape corresponding to a shape of a top surface of the first source/drain, and
   wherein the bottom surface of the second contact plug is uneven.

10. The semiconductor device of claim 9, wherein the first contact plug vertically overlaps a first one of the plurality of active fins, and the second contact plug vertically overlaps a second one of the plurality of active fins.

11. The semiconductor device of claim 9, further comprising a gate spacer disposed on sidewalls of the gate structure.

12. The semiconductor device of claim 9, wherein a lower portion of each of the plurality of active fins is covered by the isolation pattern.

13. The semiconductor device of claim 9, further comprising a second source/drain disposed on the plurality of active fins and contacting the first source/drain.

14. The semiconductor device of claim 9, further comprising a fin spacer disposed on sidewalls of the plurality of active fins.

15. A semiconductor device comprising:
   a substrate;
   an isolation pattern disposed on the substrate;
   a plurality of active regions disposed on the substrate and defined by the isolation pattern, each of the plurality of active regions being spaced apart from each other;
   a gate structure disposed on the plurality of active regions;
   a first source/drain disposed on the plurality of active regions;
   a first contact plug disposed on the gate structure;
   a second contact plug disposed on the first source/drain and spaced apart from the first contact plug; and
   a metal silicide disposed on the first source/drain and contacting the second contact plug,
   wherein the first contact plug vertically overlaps a first one of the plurality of active regions, and
   the second contact plug vertically overlaps a second one of the plurality of active regions.

16. The semiconductor device of claim 15, wherein a bottom surface of the second contact plug has a shape corresponding to a shape of a top surface of the first source/drain.

17. The semiconductor device of claim 15, wherein the top surface of the first source/drain is uneven.

18. The semiconductor device of claim 15, further comprising a gate spacer disposed on sidewalls of the gate structure.

19. The semiconductor device of claim 15, wherein a lower portion of each of the plurality of active regions is covered by the isolation pattern.

20. The semiconductor device of claim 15, further comprising a second source/drain disposed on the plurality of active fins and contacting the first source/drain.

* * * * *